(12) United States Patent  
Kulkarni

(10) Patent No.: US 8,147,613 B2  
(45) Date of Patent: Apr. 3, 2012

(54) CRYSTAL PULLER AND METHOD FOR GROWING A MONOCRYSTALLINE INGOT

(75) Inventor: Milind Kulkarni, St. Louis, MO (US)

(73) Assignee: MEMC Electronic Materials, Inc., St. Peters, MO (US)

(*) Notice: Subject to any disclaimer, the term of this patent is extended or adjusted under 35 U.S.C. 154(b) by 1273 days.

(21) Appl. No.: 10/705,813

(22) Filed: Nov. 10, 2003

(65) Prior Publication Data

US 2004/0112277 A1 Jun. 17, 2004

Related U.S. Application Data

(60) Provisional application No. 60/425,556, filed on Nov. 12, 2002.

(51) Int. Cl.
*C30B 15/14* (2006.01)

(52) U.S. Cl. ............... 117/208; 117/216; 117/217

(58) Field of Classification Search .......... 117/13, 117/20, 30, 217
See application file for complete search history.

(56) References Cited

U.S. PATENT DOCUMENTS

| | | |
|---|---|---|
| 4,597,949 A | 7/1986 | Jasinski et al. |
| 5,137,699 A | 8/1992 | Azad |
| 5,248,378 A | 9/1993 | Oda et al. |
| 5,567,399 A | 10/1996 | Von Ammon et al. |
| 5,575,847 A | 11/1996 | Kuramichi et al. |
| 5,667,584 A | 9/1997 | Takano et al. |
| 5,824,149 A | 10/1998 | Li |
| 5,824,152 A | 10/1998 | Kubota et al. |
| 5,853,480 A | 12/1998 | Kubota et al. |
| 5,919,302 A | 7/1999 | Falster et al. |
| 5,922,127 A | 7/1999 | Luter et al. |
| 5,935,326 A | 8/1999 | Kotooka et al. |
| 5,942,032 A | 8/1999 | Kim et al. |
| 5,954,873 A | 9/1999 | Hourai et al. |
| 5,961,715 A | 10/1999 | Ikeda |
| 5,968,262 A | 10/1999 | Saishouji et al. |
| 5,968,264 A | 10/1999 | Iida et al. |
| 6,007,625 A | 12/1999 | Tomioka et al. |
| 6,036,776 A | 3/2000 | Kotooka et al. |
| 6,045,610 A | 4/2000 | Park et al. |
| 6,053,974 A | 4/2000 | Luter et al. |

(Continued)

FOREIGN PATENT DOCUMENTS

EP 0 890 662 A1 1/1999

(Continued)

OTHER PUBLICATIONS

International Search Report, PCT/US03/36046, dated Apr. 21, 2004, 8 pages.

(Continued)

*Primary Examiner* — Bob M Kunemund
(74) *Attorney, Agent, or Firm* — Armstrong Teasdale LLP

(57) ABSTRACT

A crystal puller for growing monocrystalline ingots includes a side heater adjacent a crucible for heating the crucible and a melt heat exchanger sized and shaped for surrounding the ingot and disposed adjacent a surface of the melt. The heat exchanger includes a heat source having an area for radiating heat to the melt for controlling heat transfer at the upper surface of the melt. The melt heat exchanger is adapted to reduce heat loss at the exposed upper surface portion. Methods for growing single crystal silicon crystals having desired defect characteristics are disclosed.

39 Claims, 76 Drawing Sheets

U.S. PATENT DOCUMENTS

| | | | |
|---|---|---|---|
| 6,099,641 | A | 8/2000 | Ikeda |
| 6,113,687 | A | 9/2000 | Horai et al. |
| 6,117,402 | A * | 9/2000 | Kotooka et al. ............ 422/245.1 |
| 6,132,507 | A | 10/2000 | von Ammon et al. |
| 6,146,459 | A | 11/2000 | Park |
| 6,153,008 | A | 11/2000 | von Ammon et al. |
| 6,159,438 | A | 12/2000 | Iida et al. |
| 6,191,010 | B1 | 2/2001 | Falster |
| 6,228,164 | B1 | 5/2001 | von Ammon et al. |
| 6,238,477 | B1 | 5/2001 | von Ammon et al. |
| 6,245,430 | B1 | 6/2001 | Hourai et al. |
| 6,254,672 | B1 | 7/2001 | Falster et al. |
| 6,285,011 | B1 | 9/2001 | Cherko |
| 6,287,380 | B1 | 9/2001 | Falster et al. |
| 6,312,516 | B2 | 11/2001 | Falster et al. |
| 6,328,795 | B2 | 12/2001 | Falster et al. |
| 6,364,947 | B1 * | 4/2002 | Iida et al. ...................... 117/206 |
| 6,797,062 | B2 * | 9/2004 | Ferry et al. .................... 117/217 |
| 6,821,344 | B2 * | 11/2004 | Park ............................. 117/217 |
| 6,869,478 | B2 * | 3/2005 | Nakamura et al. ............. 117/14 |
| 2003/0041796 | A1 | 3/2003 | Nakamura et al. |
| 2004/0055531 | A1 * | 3/2004 | Ferry et al. .................... 117/217 |

FOREIGN PATENT DOCUMENTS

| | | |
|---|---|---|
| EP | 0 903 427 A1 | 3/1999 |
| EP | 1 158 076 A1 | 11/2001 |
| JP | 61183971 | 11/1986 |
| JP | 63-008291 | 1/1988 |
| JP | 63-8291 | 1/1988 |
| JP | 06-027684 | 2/1994 |
| JP | 96268794 A | 10/1996 |
| JP | 11-043396 | 2/1999 |
| JP | 11-25557 | 9/1999 |
| WO | WO 01/21861 A1 | 3/2001 |
| WO | WO 01/21865 A1 | 3/2001 |

OTHER PUBLICATIONS

Abe, T., et al., "Etch Pits Observed in Dislocation-Free Silicon Crystals", *Japan J. Appl. Phys.*, 1966, pp. 458-459, vol. 5.

Dash, W.C., "Growth of Silicon Crystals Free from Dislocations", *Journal of Applied Physics*, Apr. 1959, pp. 459-474, vol. 30, No. 4, American Institute of Physics.

Dash, W.C., "Silicon Crystals Free of Dislocations", *Journal of Applied Physics*, 1958, pp. 736-737, vol. 29.

De Kock, A.J.R., "The Elimination of Vacancy-Cluster Formation in Dislocation-Free Silicon Crystals", *Journal of the Electrochemical Society*, Nov. 1971, pp. 1851-1855, vol. 118, No. 11, The Electrochemical Socitey, New Hampshire.

Föll, H., et al., "The Formation of Swirl Defects in Silicon by Agglomeration of Self-Interstitials", *Journal of Crystal Growth*, 1977, pp. 90-108, vol. 40, North-Holland Publishing Company.

Kulkarni, M.S., et al., "Dynamics of Point Defects and Formation of Microdefects in Czochralski Crystal Growth: Modeling, Simulation and Experiments", *High Purity Silicon VII*, pp. 2002-2020, The Electrochemical Society Proceedings Series, Presented at the Pure Silicon Symposium Oct. 2002, Pennington, New Jersey.

Murarka, S.P., et al., "Behavior of Copper Impurity Atoms in Semiconductors", *Copper-Fundamental Mechanisms for Microelectronic Applications*, 2000, pp. 25-26, John Wiley & Sons, Inc., New York.

Petroff, P.M., et al., "Characterization of Swirl Defects in Floating-Zone Silicon Crystals", *Journal of Crystal Growth*, 1975, pp. 117-124, vol. 30, North-Holland Publishing Company.

Roksnoer, P.J., et al., "Microdefects in a Non-Striated Distribution in Floating-Zone Silicon Crystals", *Journal of Crystal Growth*, 1981, pp. 563-573, vol. 53, North-Holland Publishing Company.

Shimura, F., "3.4.1 Point Defects", *Semiconductor Silicon Crystal Technology*, 1989, pp. 55-60, Academic Press, Inc., California.

Sinno, T., et al., "Point Defect Dynamics and the Oxidation-Induced Stacking-Fault Ring in Czochralski-Grown Silicon Crystals", *Journal of the Electrochemical Society*, Jan. 1998, pp. 302-318, vol. 145, No. 1, The Electrochemical Society, Inc.

Srivastava, R.K., et al., "Interface Shape in Czochralski Grown Crystals: Effect of Conduction and Radiation", *Journal of Crystal Growth*, 1985, pp. 487-504, vol. 73, North-Holland Publishing Company, Amsterdam.

Virzi, A., "Computer Modelling of Heat Transfer in Czochralski Silicon Crystal Growth", *Journal of Crystal Growth*, Jul. 1991, pp. 699-722, vol. 112, No. 4, North-Holland Publishing Company.

Voronkov, V.V., et al., "Point Defects in Silicon Crystal Growth", *ECS Proc.*, 2001, pp. 3-18, vol. 2001-29, presented at the DECON Symposium 2001.

Voronkov, V.V., "The Mechanism of Swirl Defects Formation in Silicon", *Journal of Crystal Growth*, 1982, pp. 625-643, vol. 59, North-Holland Publishing Company.

Voronkov, V.V., et al., "Vacancy-Type Microdefect Formation in Czochralski Silicon", *Journal of Crystal Growth*, Nov. 1998, pp. 76-88, vol. 194, No. 1, North-Holland Publishing Company.

Taiwan Patent Office action (U.S. translation), dated Nov. 23, 2007, 2 pages.

European Patent Office action dated Oct. 24, 2007, 4 pages.

Japanese Office Action dated Oct. 20, 2009 regarding Japanese Patent Application No. 2004-552119 (English Translation); 20 pages.

* cited by examiner

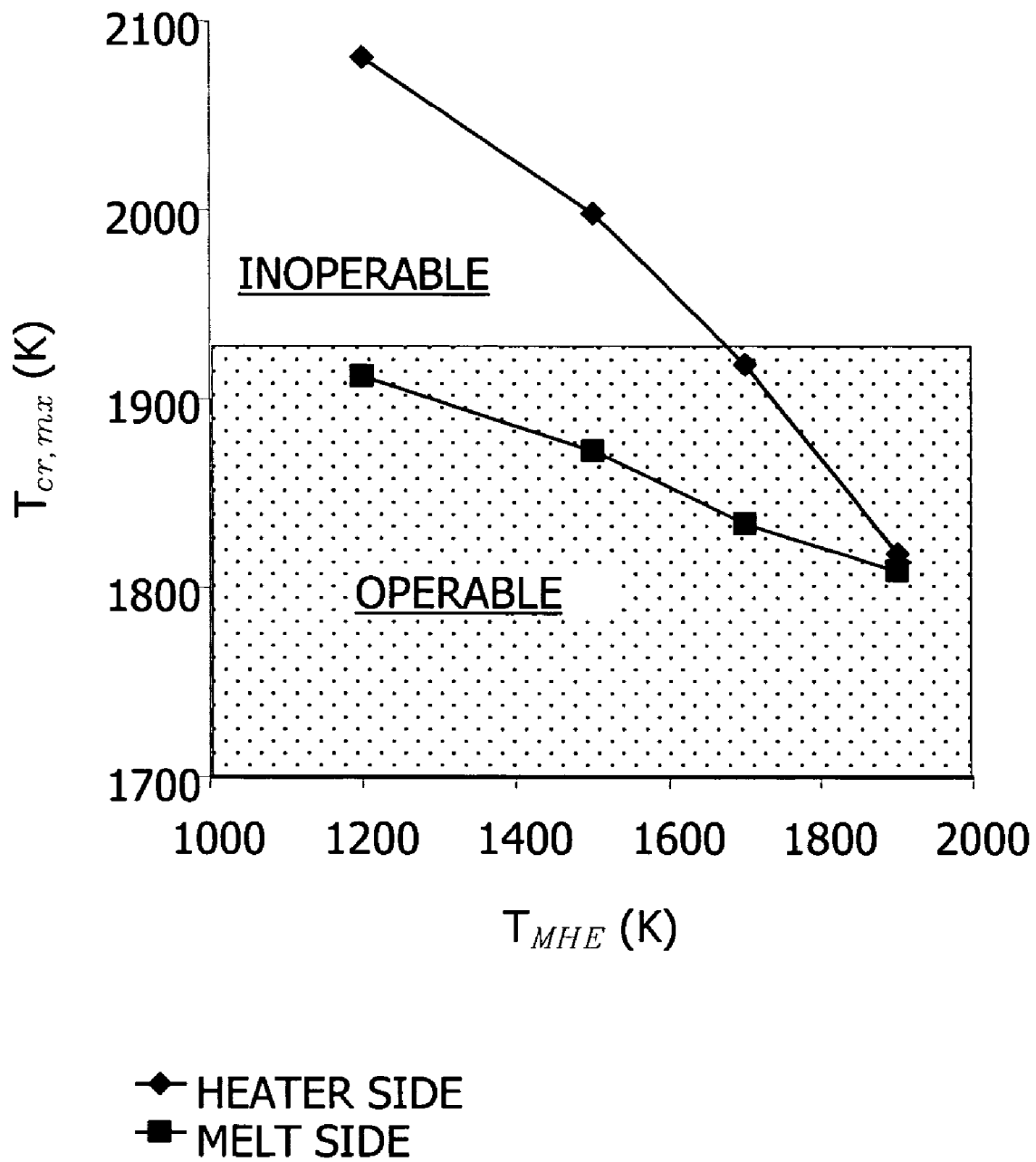

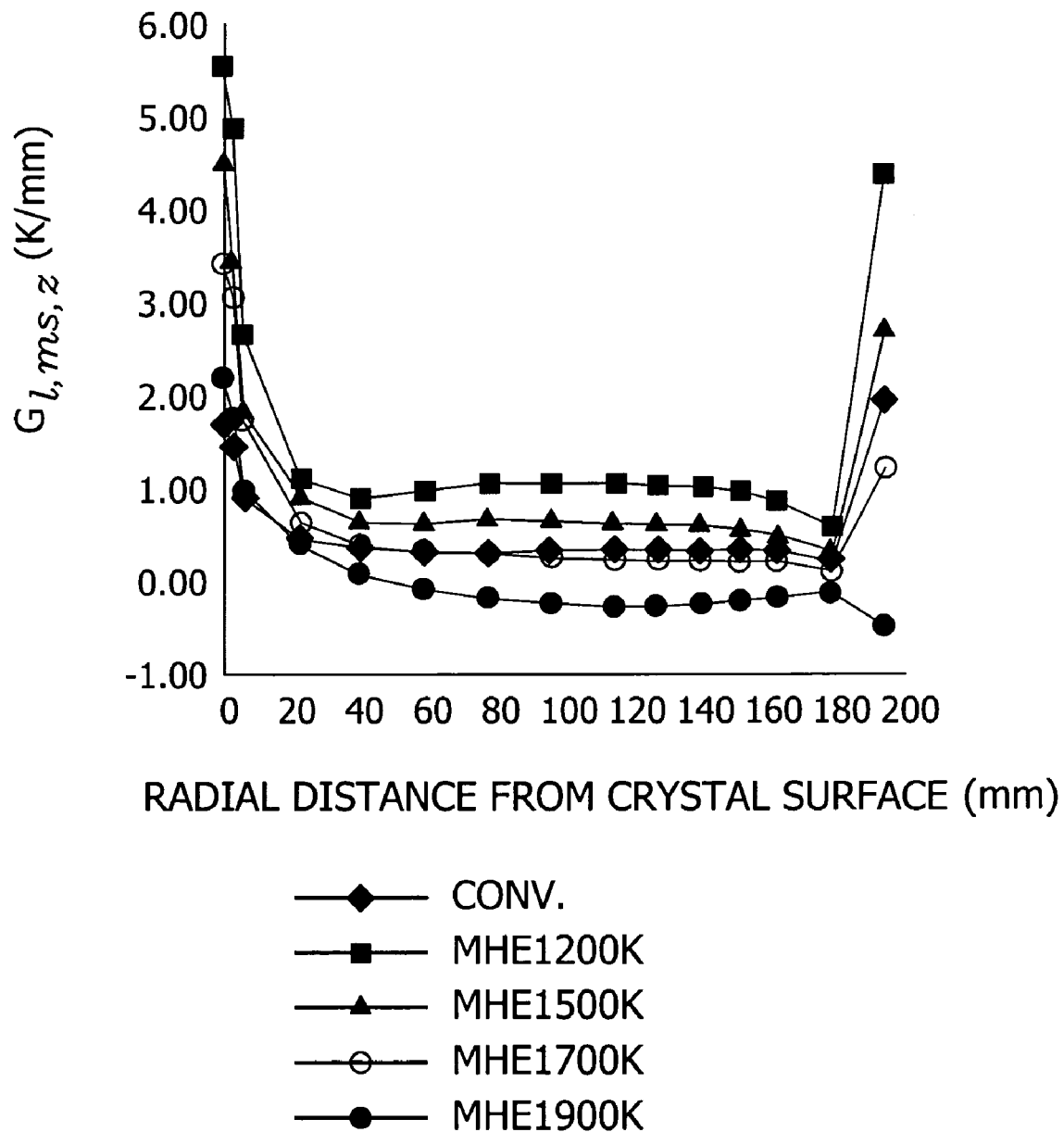

0.5 mm/min 1.00 mm/min 1.25 mm/min 1.5 mm/min

INTERFACE    0.5 mm/min

INTERFACE    1.5 mm/min

INTERFACE    2.5 mm/min

CRYSTAL PULLER AND METHOD FOR GROWING A MONOCRYSTALLINE INGOT

CROSS-REFERENCE TO RELATED APPLICATIONS

This application claims the benefit of U.S. Provisional Application Ser. No. 60/425,556 filed Nov. 12, 2002.

BACKGROUND OF THE INVENTION

The present invention relates to a crystal puller and method for growing single crystal semiconductor material, and more particularly to a crystal puller and method for growing an ingot or crystal with desired defect characteristics.

In recent years, it has been recognized that a number of defects in single crystal silicon form in the crystal puller (sometimes referred to as a hot zone) as the ingot cools from the temperature of solidification. More specifically, as the ingot cools intrinsic point defects, such as crystal lattice vacancies or silicon self-interstitials, remain soluble in the silicon lattice until some threshold temperature is reached, below which the given concentration of intrinsic point defects becomes critically supersaturated. Upon cooling to below this threshold temperature, a reaction or agglomeration event occurs, resulting in the formation of agglomerated intrinsic point defects.

The type and initial concentration of these intrinsic point defects in the silicon are determined as the ingot cools from the temperature of solidification (i.e., about 1410° C.) to a temperature greater than about 1300° C. (i.e., about 1325° C., 1350° C. or more); that is, the initial type and initial concentration of these defects are controlled by the ratio $v/G_0$, where v is the growth velocity and $G_0$ is the average axial temperature gradient over this temperature range. In general, a transition from self-interstitial dominated growth to vacancy dominated growth occurs near a critical value of $v/G_0$ which, based upon currently available information, appears to be about $2.1 \times 10^{-5}$ cm$^2$/sK, where $G_0$ is determined under conditions in which the axial temperature gradient is constant within the temperature range defined above. Accordingly, process conditions, such as growth rate (which affect v), as well as hot zone configurations (which affect $G_0$), can be controlled to determine whether the initial intrinsic point defects within the silicon single crystal will be predominantly vacancies (where $v/G_0$ is generally greater than the critical value) or self-interstitials (where $v/G_0$ is generally less than the critical value).

Defects associated with the agglomeration of crystal lattice vacancies, or vacancy intrinsic point defects, include such observable crystal defects as D-defects, Flow Pattern Defects (FPDs), Gate Oxide Integrity (GOI) Defects, Crystal Originated Particle (COP) Defects, and crystal originated Light Point Defects (LPDs), as well as certain classes of bulk defects observed by infrared light scattering techniques (such as Scanning Infrared Microscopy and Laser Scanning Tomography). Also present in regions of excess vacancies are defects which act as the nuclei for the formation of oxidation induced stacking faults (OISF). It is speculated that this particular defect is a high temperature nucleated oxygen precipitate catalyzed by the presence of excess vacancies.

Defects associated with the agglomeration of silicon self-interstitial atoms include such observable crystal defects as A-defects and B-defects (sometimes referred to as A-type swirl defects and B-type swirl defects). A-defects have been reported to be interstitial-related dislocation loops. B-defects have been reported to be three-dimensional interstitial agglomerates.

In addition to the point defects which exist as solutes in the monocrystalline silicon, many impurities such as dopants and oxygen also exist as solutes in Cz silicon and may affect the formation of agglomerated intrinsic point defects (e.g., A-, B-, and D-defects and OSF nuclei and OSF) or even co-agglomerated with intrinsic point defects. Agglomerated defects exist as separate phases in the Cz-silicon and can include D-defects, A and B-defects, OSF nuclei and OSF, oxides, nitrides, silicides and other precipitates. Formation and distribution of agglomerated defects are functions of growth conditions at the melt/crystal interface, and time-temperature (or thermal) history of each location in the Cz-silicon crystal.

Referring to FIG. 3, the formation of agglomerated defects involves various physical and chemical processes. However, in a simplistic sense, it is possible to identify a set of rate controlling steps in a given temperature range within the crystal. For example, one can identify several significant steps in formation of agglomerated defects and the temperature range in which each plays a dominant role. These steps include:

1) Incorporation of point defects: involves establishment of a new point defect distribution very close to the melt/crystal interface by interplay between diffusion and recombination of point defects. It has been shown that by controlling the crystal growth rate (in average sense, the crystal pull-rate, v) and the magnitude of the axial temperature gradient ($G_{s,f,z}$) in the crystal at the melt/crystal interface, the initial point defect type and concentration within a short distance from the interface can be controlled.

2) Out-diffusion and recombination: During this phase intrinsic point defects (silicon self interstitial atoms and/or crystal lattice vacancies) may out-diffuse to the crystal surface or silicon self interstitial atoms and crystal lattice vacancies may diffuse towards each other and recombine mutually annihilating each other.

3) Nucleation: Nucleation (broadly, formation) takes place upon sufficient supersaturation of the dominant point defect. The agglomeration of vacancies generally occurs at temperatures ranging from about 1273 K to about 1473 K, from about 1298 K to about 1448 K, from about 1323 K to about 1423 K, or from about 1348 K to about 1398 K. Controlling the rate of cooling over this temperature range influences the density of agglomerated vacancy defects. The agglomeration of silicon self-interstitials generally occurs at temperatures ranging from about 1373 K to about 1073 K or from about 1323 K to about 1173. The temperature at which predominant nucleation of vacancies takes place decreases with decreasing incorporated vacancy concentration. In other words, lower the vacancy concentration, lower the nucleation rate and lower the temperature at which nucleation occurs.

4) Growth: Growth of stable nuclei follows nucleation.

5) Oxygen precipitation: Oxygen can nucleate in the presence of vacancies and gradually grow between 1323 K-973 K. Oxygen precipitation is enhanced in the presence of vacancies. That is, crystal lattice vacancies and oxygen interstitial atoms may co-agglomerate to form oxygen precipitate nuclei or if formed sufficiently large, oxygen precipitates.

6) Impurity precipitation: Other impurities can play a role in precipitation as well. The temperature range for this step depends on the type and concentration of the impurity.

FIG. 4 is a schematic of a growing crystal depicting the sequential nature of defect dynamics within the crystal. In sequence, a crystal segment undergoes initial point defect incorporation (I), diffusion and recombination (DR), nucleation (N) and growth (G). Oxygen precipitation (OP) occurs during nucleation and growth. It is evident that the temperature gradient in the crystal at the melt/crystal interface and the crystal growth rate play significant roles in initial point defect incorporation. Subsequent processes, such as nucleation and growth are influenced by the local cooling rates, i.e., the thermal history of the crystal subsequent to the initial incorporation of the intrinsic point defects. During growth, the local cooling rate is given by $v \times G_{s,f,z}$, where $G_{s,f,z}$ is the local temperature gradient. Thus, the temperature profile in a crystal is important for the control of the nucleation rate and growth of all precipitates.

In many applications, it is preferred that a portion or all of the silicon crystal which is subsequently sliced into silicon wafers be substantially free of agglomerated defects. There are several approaches for growing defect-free or defect-controlled silicon crystals. In one approach, the ratio $v/G_{s,f,z}$ is controlled to determine the initial type and concentration of intrinsic point defects. The subsequent thermal history is controlled to allow for prolonged diffusion time to suppress the concentration of intrinsic point defects and avoid the formation of agglomerated intrinsic point defects in a portion or all of the crystal. See, for example, U.S. Pat. Nos. 6,287,380, 6,254,672, 5,919,302, 6,312,516 and 6,328,795, the entire disclosures of which are hereby incorporated herein by reference. In another approach, sometimes referred to as a rapidly cooled silicon (RCS) growth process, the ratio $v/G_{s,f,z}$ is controlled to determine the initial type and concentration of intrinsic point defects. The subsequent thermal history is controlled to rapidly cool the crystal through a target nucleation temperature to avoid the formation of agglomerated intrinsic point defects. This approach may also include allowing prolonged cooling above the nucleation temperature to reduce the concentration of intrinsic point defects prior to rapidly cooling the crystal through the target nucleation temperature to avoid the formation of agglomerated intrinsic point defects. See, for example, International Application No. PCT/US00/25525 published on Mar. 29, 2001 under International Publication No. WO 01/21861, the entire disclosure of which is incorporated herein by reference. In a similar approach, the growth conditions, $v/G_{s,f,z}$ and cooling rate through the target nucleation temperature are controlled in order to limit the size, and in some cases the density, of vacancy-related agglomerated defects, and optionally the residual vacancy concentration, in single crystal silicon wafers derived therefrom. See, for example, PCT Application Serial No. PCT/US02/01127 published on Aug. 29, 2002 under International Publication Number WO 02/066714, the entire disclosure of which is hereby incorporated herein by reference.

However, depending on the application in which the silicon will be used, it may be acceptable or even desirable to produce silicon having any of the above described defects. That is, it may be acceptable or desirable to produce material a portion or all of which contains either D-defects, OSF, OSF nuclei, B-defects or A-defects or combinations thereof. For example, in some applications, silicon crystals are grown under conditions wherein D-defects form throughout the crystal. Silicon wafers sliced from such D-defect containing crystals may then be subjected to thermal anneals to remove the D-defects from the surface region of the wafer, or subjected to an epitaxial deposition process wherein the D-defects revealed on the surface of the wafer as COPs are filled by the deposition of an epitaxial layer on the surface of the wafer. In other applications, it may be desirable to grow a crystal under conditions wherein B-defects form throughout the crystal. Silicon wafers sliced from such B-defect containing crystals may be subjected to rapid thermal anneals to dissolve the B-defects. See, for example, International Application No. PCT/US/00/25524 published on Mar. 29, 2001 under International Publication No. WO 01/21865.

SUMMARY OF THE INVENTION

The present invention is directed to an apparatus and method for growing single crystal silicon crystals having desired defect characteristics. More specifically, the present invention provides an apparatus and method for controlling the growth parameter $v/G_{s,f,z}$ in the vicinity of the melt/crystal interface and the time-temperature history of crystal-segments in various temperature ranges of interest to control the formation and distribution of agglomerated defects.

In one aspect of the invention, a crystal puller for growing monocrystalline ingots according to the Czochralski method comprises a housing and a crucible in the housing for containing a semiconductor source material melt. The puller further comprises a side heater adjacent the crucible for heating the crucible and a pulling mechanism for pulling a growing ingot upward from the upper surface of the melt. A portion of an upper surface of the melt remains exposed during growing of the ingot and has an area. A melt heat exchanger is sized and shaped for surrounding the ingot and is disposed adjacent the exposed upper surface portion of the melt. The heat exchanger includes a heat source disposed to face the exposed upper surface portion of the melt. The heat source has an area for radiating heat to the melt sized at least 30% of the area of the exposed upper surface portion of the melt for controlling heat transfer at the upper surface of the melt. The melt heat exchanger is adapted to reduce heat loss at the exposed upper surface portion.

In another aspect, a reflector assembly for use in a crystal puller comprises a cover disposed above the melt and has a central opening sized and shaped for surrounding the ingot as the ingot is pulled from the melt. A crystal heat exchanger is mounted at least partially inside the cover and is adapted to be disposed above the melt and to substantially surround the ingot for cooling a first segment of the growing ingot that is adjacent the melt/crystal interface. A melt heat exchanger is mounted at least partially inside the cover and is adapted to surround the ingot proximate the surface of the melt for controlling heat transfer at the surface of the melt.

In yet another aspect, a reflector for use in a crystal puller comprises a crystal heat exchanger sized and shaped for placement above the melt and substantially surrounding the ingot for cooling a first segment of the growing ingot proximate a melt/crystal interface. A lower crystal heater is disposed above the crystal heat exchanger and substantially surrounds the ingot for maintaining a second segment of the ingot at a predetermined temperature.

In still another aspect, the crystal puller comprises a reflector including an annular melt heat exchanger sized and shaped for surrounding the ingot and disposed adjacent the exposed upper surface portion of the melt. The heat exchanger includes a heat source adapted to be disposed to face the exposed upper surface portion of the melt and to be within 50 mm of the exposed upper surface portion of the melt. The heat source has an area sized at least 40% of the area of the exposed upper surface portion of the melt for controlling heat transfer at the upper surface of the melt. The melt heat exchanger is adapted to reduce heat loss at the exposed upper surface portion and a crystal heat exchanger is sized and shaped to be disposed above the melt and substantially surround the ingot for cooling a first segment of the growing ingot.

Another aspect of the invention is directed to a method of growing a monocrystalline ingot. The method comprises forming a melt of semiconductor source material in a crucible, pulling semiconductor source material from the surface of the melt such that the source material solidifies into a monocrystalline ingot, and selectively controlling heat transfer at the surface of the melt using a heat source disposed to face the exposed upper surface portion of the melt. The heat source has an area for radiating heat to the melt sized at least 30% of the area of the exposed upper surface portion of the melt.

Another method of growing a monocrystalline ingot comprises pulling the growing ingot upward from the melt. The puller includes a side heater adjacent the crucible for heating the crucible, and a melt heat exchanger facing at least 30% of an exposed portion of the melt surface for heating the exposed portion. The method further comprises controlling the temperatures of the melt heat exchanger and the side heater to control formation of defects within the ingot.

Yet another method of growing a monocrystalline ingot comprises controlling an axial temperature gradient at the interface by manipulating a temperature field at a melt/ingot interface.

A further method of growing a monocrystalline ingot comprises controlling heat radiated from the melt heat exchanger and the side heater to control the interface shape and controlling heat radiated from the lower heater to control the thermal history of segments of the growing ingot.

Other objects and features of the present invention will be in part apparent and in part pointed out hereinafter.

BRIEF DESCRIPTION OF THE DRAWINGS

FIG. 5A is a graph of maximum crucible temperature comparing the conventional crystal puller to the novel crystal puller, FIG. 5B is a graph substituting heater power for maximum crucible temperature;

FIG. 41 is a graph of the effect of melt heat exchanger (MHE) temperature on the maximum crucible temperature in the novel crystal puller (active melt heat exchanger (MHE), crystal heat exchanger (CHE), lower heater (LH), and upper heater (UH));

FIG. 42A is a graph of the effect of melt heat exchanger (MHE) temperature on $G_{s,fz}$ (r) in the novel crystal puller (active melt heat exchanger (MHE), crystal heat exchanger (CHE), lower heater (LH), and upper heater (UH));

Corresponding reference characters indicate corresponding parts throughout the several views of the drawings.

DETAILED DESCRIPTION OF THE PREFERRED EMBODIMENT

Figure 1:
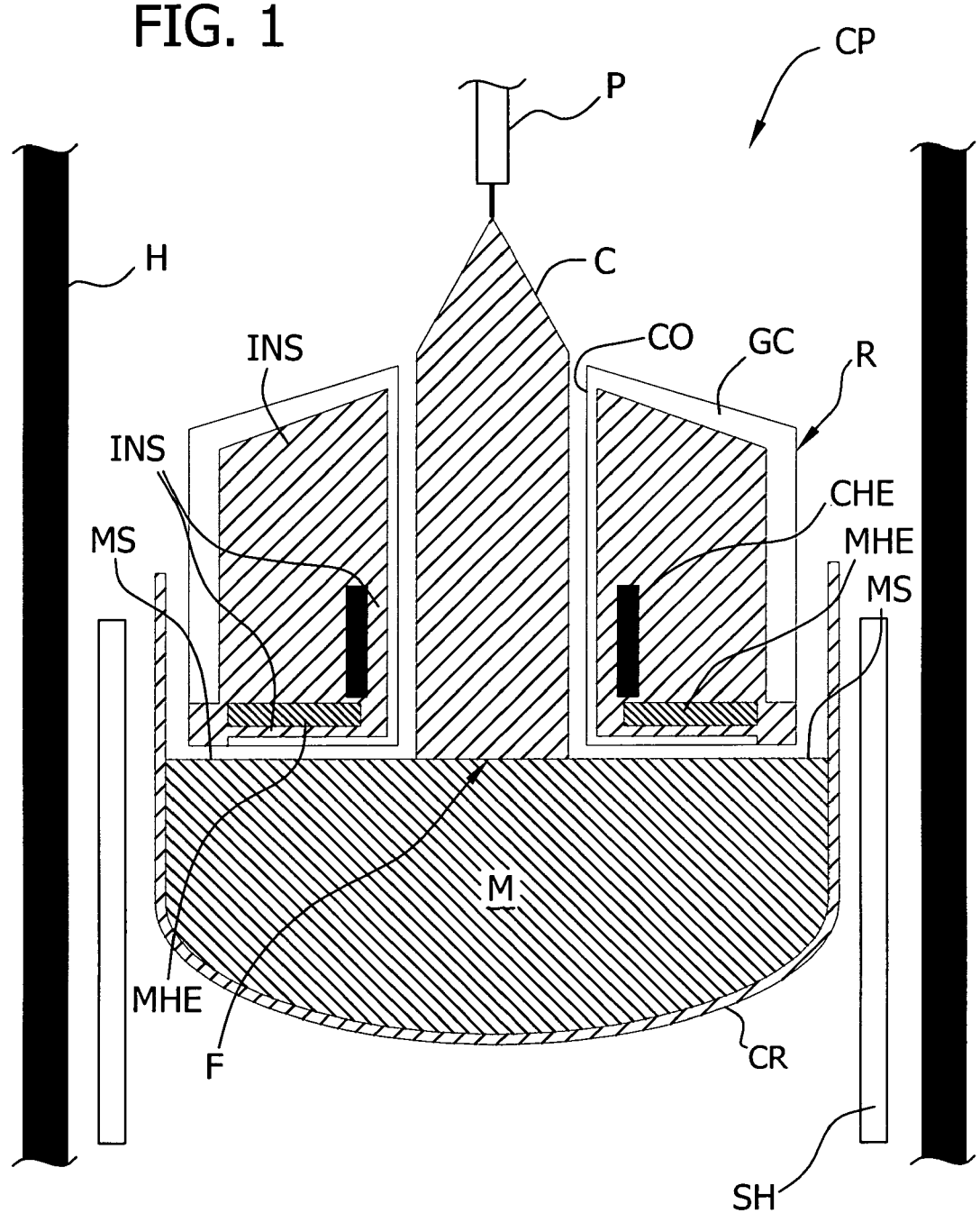
FIG. 1 is a schematic section view of an embodiment of a novel crystal puller.

Referring to FIG. 1, an embodiment of the novel crystal puller CP comprises a housing H and a quartz crucible CR in the housing for containing a semiconductor material (e.g., silicon) melt M. A pulling mechanism P (suitably a shaft or pull wire) secured in the housing and adapted to extend toward the crucible is adapted to continuously pull the solid monocrystalline ingot or crystal C from the melt. A tubular graphite reflector R (or heat shield) suitably secured in a growth chamber of the housing H includes a cover GC suitably made of graphite and having a central opening sized and shaped for surrounding the growing crystal. An annular melt heat exchanger MHE is mounted within the cover GC to face the exposed melt surface MS. The melt heat exchanger MHE includes a heat source, such as an electrically-powered heater. The melt heat exchanger MHE may also include heat absorption structure. A crystal heat exchanger CHE (or active cooling jacket) is also mounted within the cover GC to surround and to face the growing crystal C. The crystal heat exchanger CHE is disposed above the melt heat exchanger MHE as close to the melt/crystal interface F as practical, desirably such that the crystal heat exchanger CHE cools (or removes heat from) a crystal segment proximate the interface. The crystal heat exchanger CHE is cooled by conventional cooling fluid (typically water), though other heat transfer media may be used. The crystal heat exchanger CHE may also include a heater. In one embodiment, the temperature (and resulting heat transfer capacity) of the melt heat exchanger is controlled by regulating the electrical current (the power) passing therethrough. The temperature of the crystal heat exchanger is suitably controlled by regulating the temperature and flow rate of the cooling fluid.

The cover GC of the reflector R may also be filled, or at least partially filled, with insulation INS, for example to resist radiative heat transfer between the exposed melt surface MS (the exposed upper surface portion of the melt) and the crystal outer surface. Insulation INS of appropriate thermal conductivity may optionally be disposed between the melt heat exchanger MHE and the open melt-surface MS to further control (e.g., inhibit) heat transfer between the melt-surface and the MHE. Also, insulation INS of desired thermal conductivity is disposed between the crystal heat exchanger CHE and the crystal C. Note that in addition to, or instead of, manipulating the temperature of the melt heat exchanger MHE and crystal heat exchanger CHE, the thermal conductivity of the insulation INS can be appropriately selected to control heat transfer. The thermal conductivity, thickness and material of the insulation INS can be selected to correspond to the heat transfer desired. The melt heat exchanger MHE may be constructed to have a controllable radial and/or axial power profile, and the crystal heat exchanger CHE may similarly be constructed to have controllable axial and/or radial cooling profile. As can be seen in FIG. 1, the reflector R therein is significantly thicker than conventional reflectors. The reflector R has a relatively constant inner and outer diameter over most of its height, resulting in a reflector thickness of at least 200 mm, 300 mm, 400 mm, or in some embodiments, at least 500 mm. A substantial portion of the insulation is of nearly the same thickness as the reflector R.

Heat loss from the exposed melt surface MS is actively controlled by operation of the melt heat exchanger MHE to increase the $G_{l,f,z}$ (negative melt-side temperature gradient at the interface) without significantly increasing the crucible temperature $T_{cr}$. Actively changing the effective temperature of the environment above the exposed melt surface MS, i.e., the environment that the melt 'sees', more effectively controls the heat loss from the melt-surface than prior art passive shields and reflectors. There is no active control over the effective temperature if the melt surface is merely covered by the prior art reflecting and insulating material. Thus, a more active control of the heat loss from the open melt surface MS is achieved by the active heat source, in this embodiment disposed in the melt heat exchanger MHE.

The active heat source of the melt heat exchanger MHE may be sized to cover or face as much of the melt surface as practical. The heat source has an area sized at least 30%, more preferably at least 40%, even more preferably at least 50%, more preferably at least 60%, and even more preferably at least 75% of an area of the exposed melt surface MS (the exposed upper surface portion). Note that the relevant area of the exposed melt surface MS does not include the portion occupied by the crystal C. The heat source is disposed opposite the melt surface and in one embodiment, the heat source extends generally parallel to the melt surface. Note that the heat source, or portions thereof may be angled relative to the melt surface within the scope of this invention. The heat source, in particular a lower surface of the heat source, is adapted to be disposed proximate the melt surface, for example, within 100 mm, 50 mm and in some embodiments within 30 mm thereof. Note that the space between the melt heat exchanger MHE heat source and the exposed melt surface MS may vary as the melt M is consumed. The crucible CR is typically moved upward by suitable means during crystal growth so as to reduce such variation of the distance, though it is contemplated to move the reflector R or components therein as well. Preferably, the structural components of the crystal puller CP need not be removed or added to the puller to produce a desired product. However, each component need not necessarily be active or operating during crystal growth.

Operation of the melt heat exchanger MHE tends to decrease the heat loss from the open melt surface MS but tends to increase the heat transfer to the crystal surface, thereby increasing the crystal temperature and decreasing the $G_{s,f,z}$ (crystal side negative temperature gradient at the melt/crystal interface). Such an increase may cause a reduction in pull rate and thereby reduce productivity. Operation of the crystal heat exchanger CHE should compensate for the effect of the melt heat exchanger MHE and serve to increase $G_{s,f,z}$. Depending upon the cooling capacity of the crystal heat exchanger CHE, the increase in $G_{s,f,z}$ can be relatively high, which can improve the productivity significantly. Preferably, the heat transfer path between the melt heat exchanger MHE and the crystal heat exchanger CHE is insulated to allow relatively independent tuning (control) of both the MHE and the CHE. In addition, the benefits of the crystal heat exchanger CHE (i.e., the cooling effect) on the crystal C are better exploited by minimizing heat transfer between the CHE and the melt heat exchanger MHE.

Figure 5A:
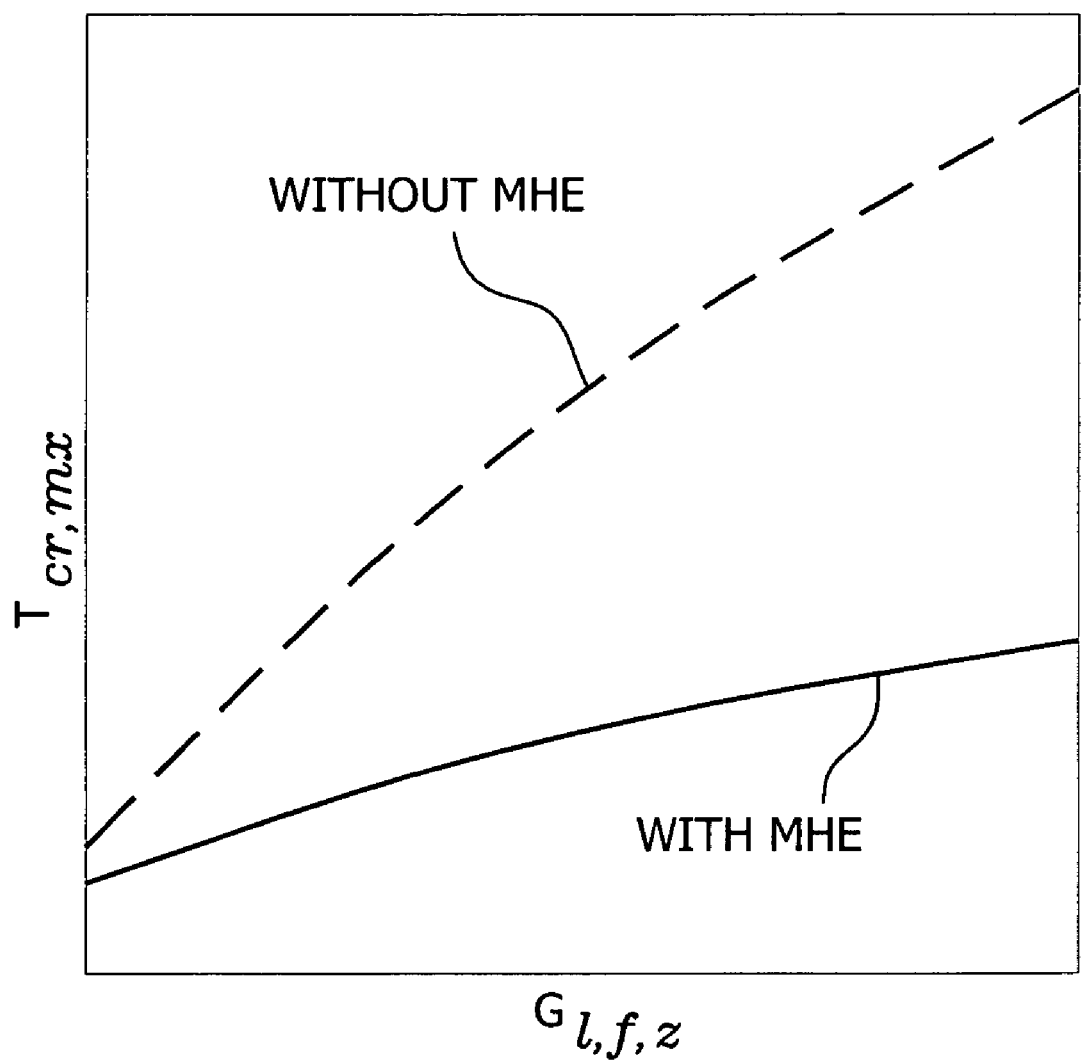
FIGS. 5A-5B are comparisons between crystal pullers with and without melt heat exchanger (MHE) using variation in the maximum crucible temperature with the negative melt-side temperature gradient at the melt/crystal interface.
Figure 5B:
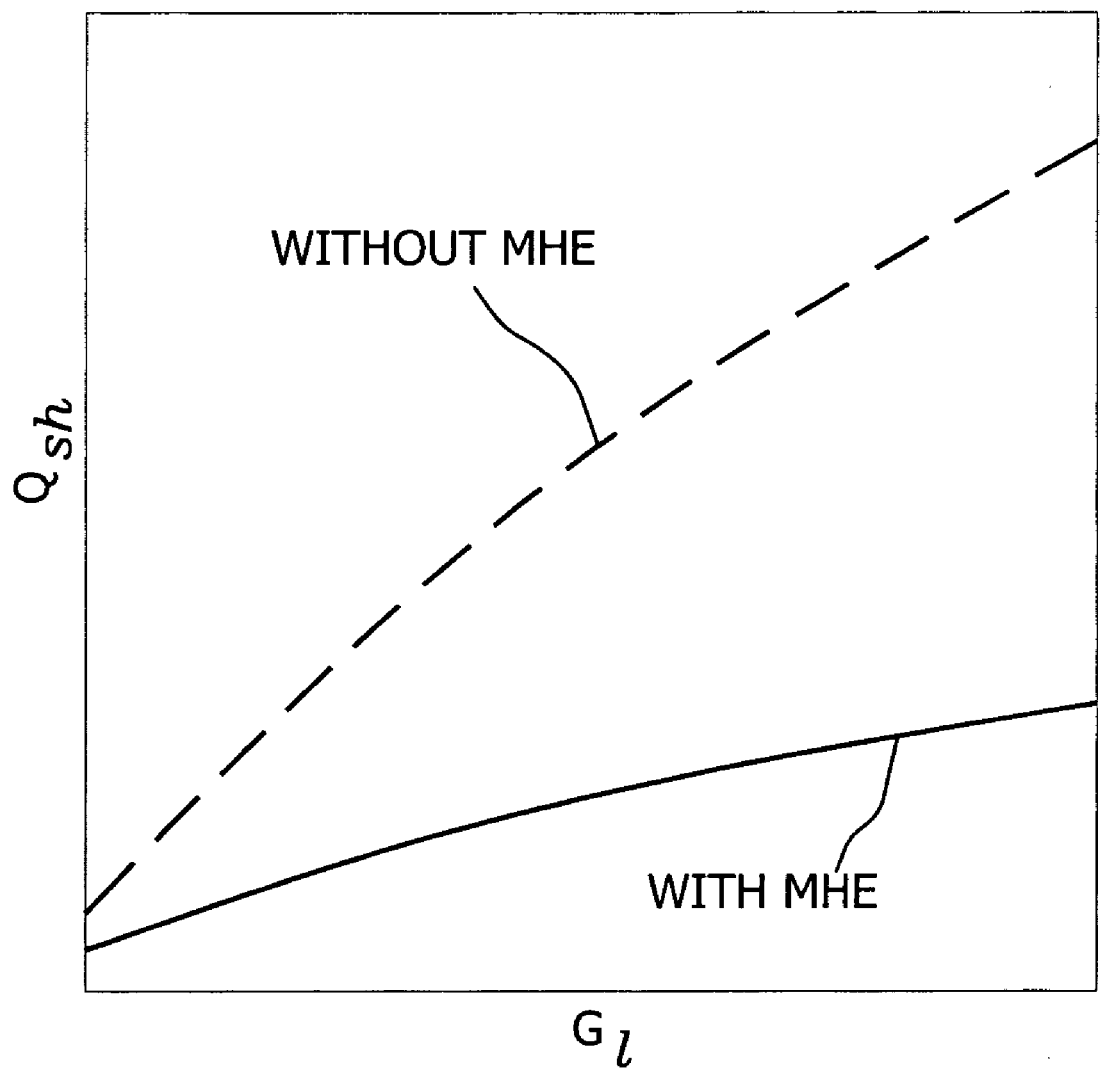

The variation in crucible temperature as a function of melt-side temperature gradients in the novel crystal puller CP compared to a traditional crystal puller is shown qualitatively in FIG. 5A. FIG. 5B shows the side heater power for similar crystal pullers. Significant factors in achieving a desired microdefect distribution in a crystal-segment include controlling $v/G_{s,f,z}$ at the melt/crystal interface F, the radial variation of $v/G_{s,f,z}$ and the time-temperature or thermal history of the segment.

Growth Conditions at Melt/Crystal Interface: Global Temperature Field Control

Crystal growth is a dynamic process. A necessary condition to be met for growth of a crystal is the following energy balance:

@interface $$-\{\alpha_s \nabla T_s\} \cdot \{n\} = -\{\alpha_l \nabla T_l\} \cdot \{n\} + \{-\Delta H \rho_s v\} \cdot \{n\}$$

$$q_{s,f,n} = q_{l,f,n} + q_{fusion,f,n} \tag{1}$$

where T is the temperature, a is the thermal conductivity, $(-\Delta H)$ is the enthalpy of fusion, v is the pull-rate, $\{n\}$ is the unit vector normal to the interface, and q is the heat flux. Subscript s denotes solid (crystal), l denotes liquid, f denotes interfacial conditions, and n denotes normal direction, and fusion denotes fusion. Equation (1) states that sum of the conductive heat on the melt-side and the heat generated by solidification is transferred by conduction through the crystal C. This balance assumes that crystal C, even at high temperatures, does not act as a heat-pipe and that the mode of heat transfer through the crystal is conduction.

In this section, for the sake of simplicity, one-dimensional analysis of equation (1) is performed. However, the one-dimensional analysis gives meaningful insight into the multi-dimensional problem. In one-dimensional sense, equation (1) can be written as, $$@ \text{ interface} - \alpha_s \frac{\partial T_s}{\partial z} = -\alpha_l \frac{\partial T_l}{\partial z} + \rho_s v(-\Delta H) \tag{2}$$

$$\Rightarrow \alpha_s G_{s,f,z} = \alpha_l G_{l,f,z} + \rho_s v(-\Delta H)$$

Rearranging equation (2), one obtains the following $$\frac{v}{G_{s,f,z}} = \frac{\alpha_s}{\rho_s(-\Delta H)} - \frac{\alpha_l G_{l,f,z}}{\rho_s(-\Delta H) G_{s,f,z}} \tag{3}$$

Equation (3) states that for a given $G_{s,f,z}$, maximum pull-rate can be achieved when the melt-side temperature gradient at the interface, $G_{l,f,z}$, is equal to zero. For practical purposes, the melt M should be isothermal for the pull-rate to be maximum for a given crystal-side temperature gradient. Henceforward, the word, gradient, unless specified otherwise refers to the axial gradient. The maximum $v/G_{s,f,z}$ at the interface is obtained by setting $G_{l,f,z}$ equal to zero:

$$\left[\frac{v}{G_{s,f,z}}\right]_{mx} = \frac{\alpha_s}{\rho_s(-\Delta H)} = 0.51 \text{ to } 1.0 \tag{4}$$

where subscript mx indicates maximum value. Thus $(v/G_{s,f,z})_{mx}$ is generally a function of material properties, and for silicon, its value is between 0.5 and 1. Width of this range is determined by the variation in reported values for the heat of fusion for silicon.

Figure 6:
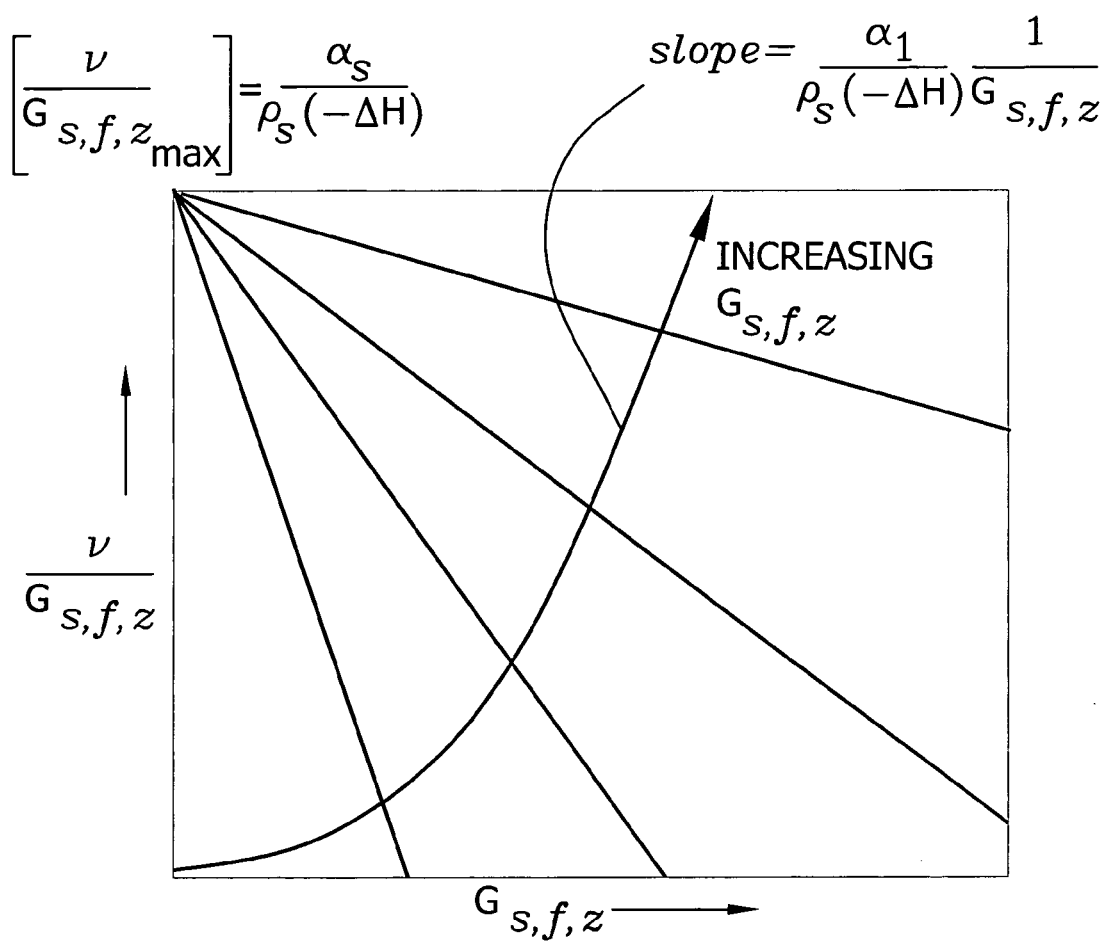
FIG. 6 is a graph showing the relationship between $v/G_{s,f,z}$ and $vG_{l,f,z}$ for different $G_{s,f,z}$ at the melt/crystal interface.

Equation (3) has infinite solutions for a given $v/G_{s,f,z}$ at the interface, which means that there are infinite variations in the crystal puller design that allow crystal growth at a given $v/G_{s,f,z}$ with varying $G_{l,f,z}$ at the interface. Referring to FIG. 6, the solutions can be plotted on a $v/G_{s,f,z}$ vs. $G_{l,f,z}$ graph. Points of constant $G_{s,f,z}$ are connected to show a family of constant $G_{s,f,z}$ lines. Each line represents a straight line given by equation (3) for a fixed $G_{s,f,z}$. The intercept of each line represents $(v/G_{s,f,z})_{mx}$ and the slope is equal to $$\left[ -\frac{\alpha_l}{\rho_s(-\Delta H)G_{s,f,z}} \right].$$

As the slope of the line decreases the temperature gradient increases. Pull-rates change along constant $G_{s,f,z}$ lines. Movement towards intersection of a constant $G_{s,f,z}$ line and the $v/G_{s,f,z}$ axis indicates increasing pull-rates and movement away from this intersection indicates decreasing pull-rates. It is obvious that changing pull-rates in this way changes $v/G_{s,f,z}$ ratio. Therefore, pull-rate or the productivity of a defect-controlled crystal cannot be increased in this manner.

Figure 7:
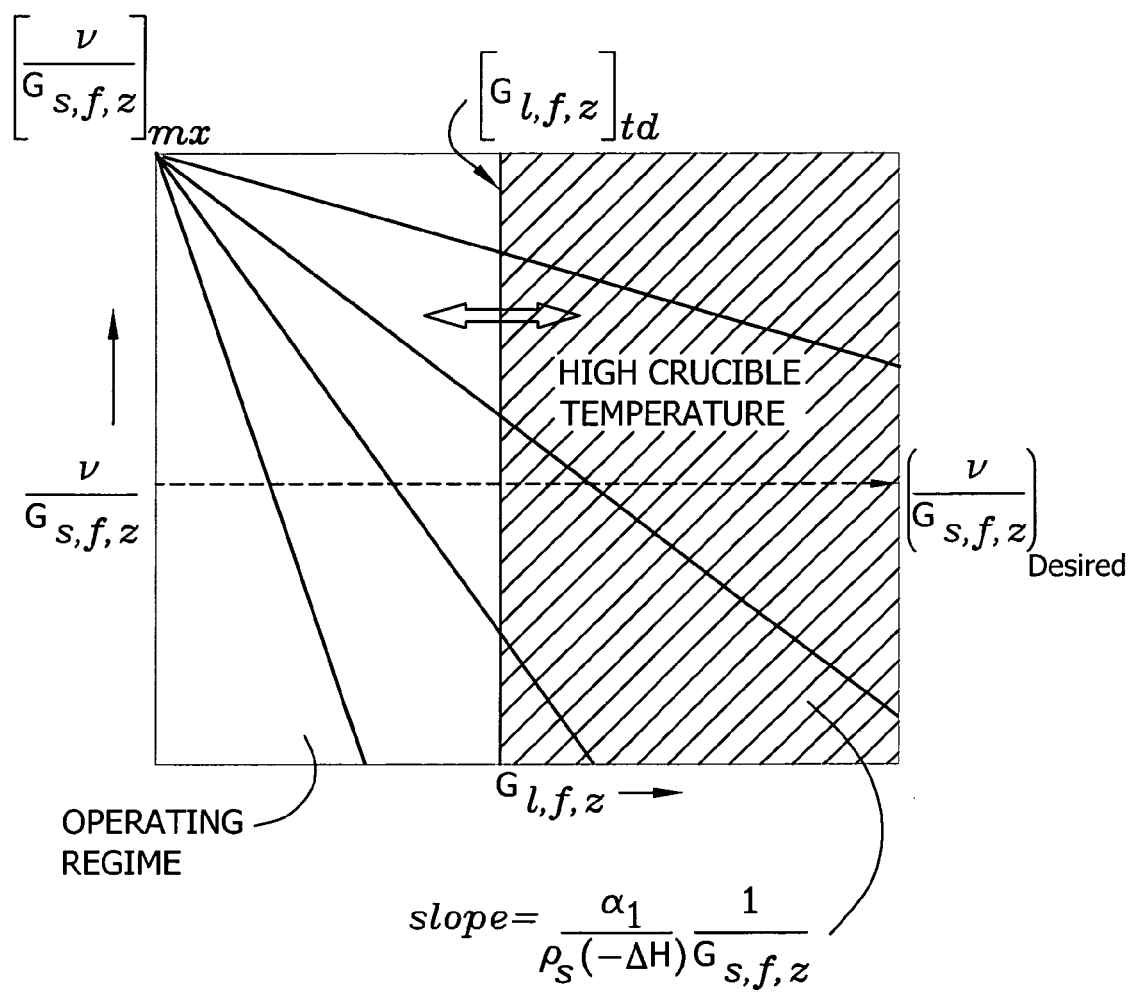
FIG. 7 is a quantitative graph of variation in parameters at the interface for a fixed $v/G_{s,f,z}$.
Figure 8:
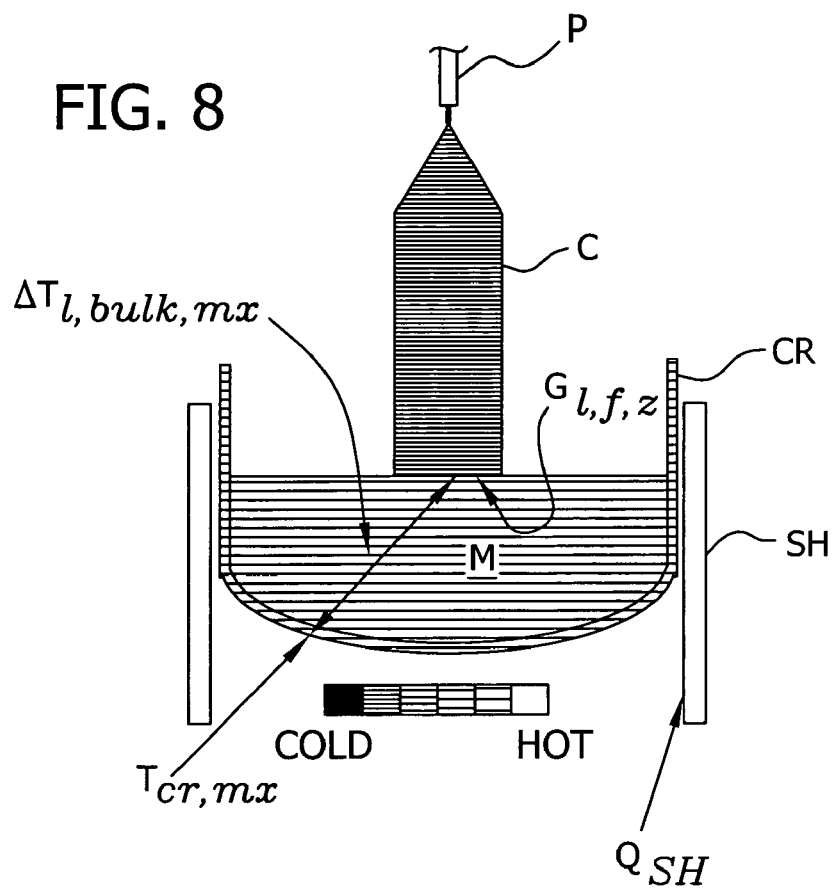
FIG. 8 is a schematic of a conventional crystal puller.
Figure 8A:
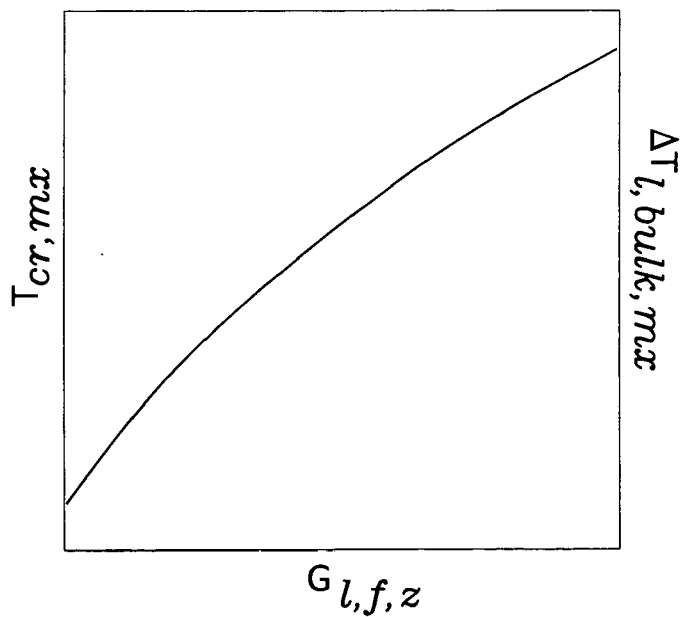
FIG. 8A is a graph of the dependence of crucible temperature on the melt-side temperature gradient at the melt/crystal interface.

To increase the productivity of a defect-controlled crystal (e.g., perfect, semi-perfect and rapid cooled silicon RCS other than D-type), it would be useful to keep $v/G_{s,f,z}$ relatively constant while increasing the pull-rate. FIG. 7 shows constant $v/G_{s,f,z}$ lines drawn on FIG. 6. Increasing productivity (pull-rate) for a given $v/G_{s,f,z}$ involves traveling across constant $G_{s,f,z}$ lines. Thus, for a given $v/G_{s,f,z}$, increasing pull-rate increases the melt-side temperature gradient at the melt/crystal interface F, $G_{l,f,z}$. Operating at a high melt-side temperature gradient at the interface poses a problem in conventional crystal pullers. This problem can be explained using the schematic of the crystal puller containing only melt M, crystal C, crucible CR and the side heater SH as shown in FIG. 8. At the melt/crystal interface F, the temperature is fixed at $T_f$, which for silicon is 1685 K. As shown in FIG. 8A, as the melt-side temperature gradient at the interface $(G_{l,f,z})$ increases, the melt M becomes hotter away from the interface. Melt temperature is typically increased by increasing the side heater power, $Q_{sh}$. The crucible CR is made of quartz, and is sensitive to higher temperatures and has a maximum crucible temperature, $T_{cr,mx}$. The maximum allowable temperature for the crucible CR is exceeded for a given threshold melt-side gradient at the interface, $[G_{l,f,z}]_{td}$. Thus, there is an upper limit placed on the maximum allowable melt-side temperature-gradient at the interface, based on the maximum allowable crucible temperature, $T_{cr,mx}$. Accordingly, for a given $v/G_{s,f,z}$, pull-rate is also limited by the maximum allowable crucible temperature, $T_{cr,td}$.

Effect of Heat Loss from the Open Melt

Figure 9:
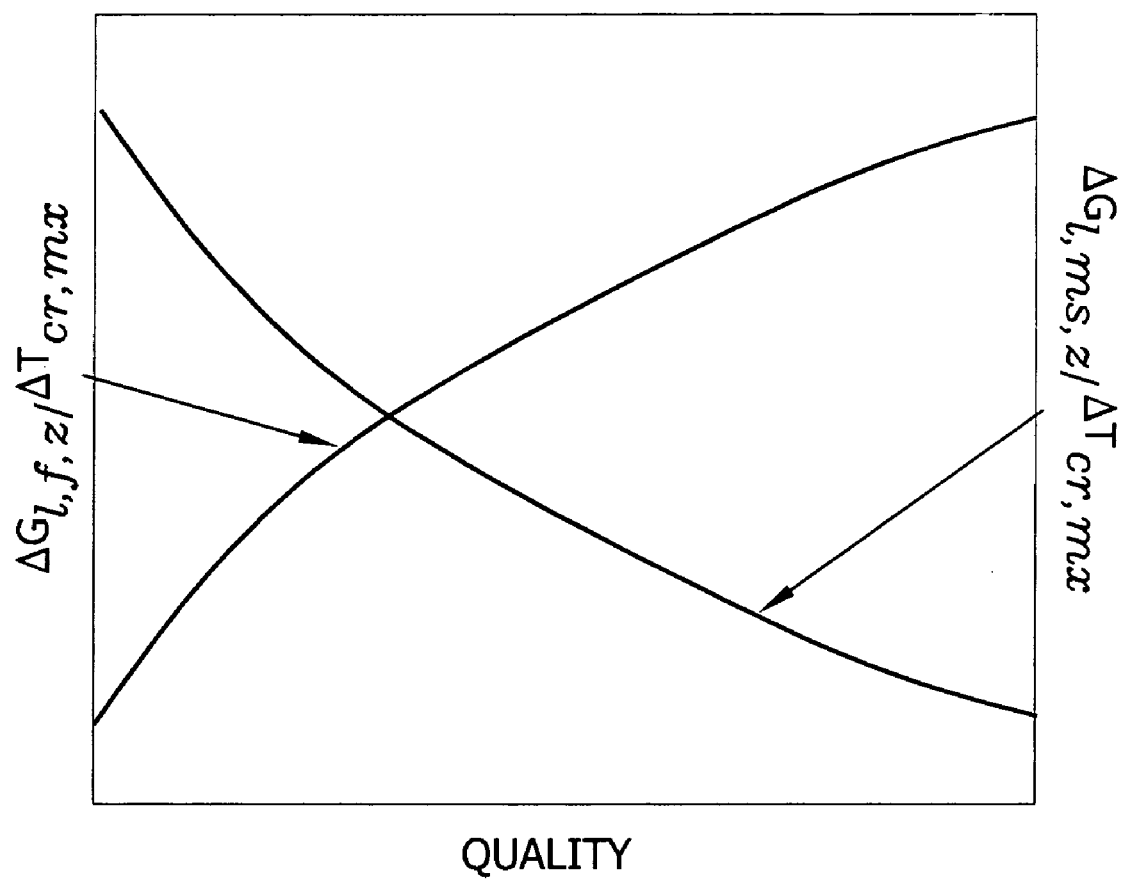
FIG. 9 is a graph of the relationship between crucible temperature, and the melt-side temperature gradient at the interface and at the open surface as a function of quality of the crystal puller design.

In this invention, the novel crystal puller CP enables higher pull-rates for a given $v/G_{s,f,z}$ ratio than a conventional crystal puller due to manipulation of the dynamics between some parameters. The novel crystal puller CP enables a much greater change in the melt-side temperature gradient at the interface relative to the change in the crucible temperature. In this way, very high melt-side temperature gradients at the interface can be achieved while maintaining the crucible CR below maximum allowable crucible temperature, $T_{cr,mx}$. Thus, the ratio of change in the melt-side temperature gradient at the interface ($G_{l,f,z}$ as well as the average gradient) to the change in the crucible temperature is increased in the new crystal puller. FIG. 9 shows the relationship between the ratio and quality (unitless) of the crystal puller design. As the relationship between the crucible temperature and the melt-side temperature gradient at the interface becomes more efficient, the pull-rate of the crystal C, and hence, the productivity can be increased.

Typically, as the crucible temperature increases, the melt M becomes hotter and the heat loss from the exposed melt surface MS increases. The heat loss may be measured by an increase in the heat flux normal to the open melt surface MS i.e., by the melt-side temperature gradient at the MS. The negative melt-side temperature gradient at the open or exposed melt surface is denoted by $G_{l,ms,z}$. Subscript ms denotes the exposed melt surface MS. In a crystal-growth process, the crucible temperature is interactively set by manipulating the side heater power to establish a condition at the melt/crystal interface F that satisfies equation (1) (or in 1-dimensional sense, equation (2)). However, heat entering the crystal C from the melt M, as described by equation (1) is quite negligible compared to the total heat loss from the open melt surface MS. A quasi-steady-state heat balance indicates that as the heat loss from the open melt surface MS increases the heat entering the melt M from the side heater (through the side of the crucible) increases. In essence, the balance results in an increase in side heater power and the crucible temperature. Hence, heat loss from the melt surface MS is desirably decreased to control or limit the increase in the crucible temperature. In other words, to keep variation in the crucible temperature to a minimum, the ratio of change in the axial melt-side temperature gradient at the exposed melt surface MS to the change in the crucible temperature should be low (see FIG. 9). Thus a condition for controlling the crucible temperature while increasing productivity (pull-rate) for a given $v/G_{s,f,z}$ is as follows:

$$@ \frac{v}{G_{s,f,z}} = \text{constant} \qquad (5)$$
$$\frac{\Delta G_{l,f,z}}{\Delta T_{cr,mx}} > td1, \text{ and } \frac{\Delta G_{l,os,z}}{\Delta T_{cr,mx}} < td2$$

where td1 and td2 are two limiting threshold values. Thus, it is evident that the exposed melt surface MS temperature gradient should be manipulated to control the coupling between the melt-side temperature gradient at the interface and the crucible temperature. In other words, the heat loss from the exposed melt surface MS should be cooperatively controlled to achieve efficient control of crucible temperature and its effect on the melt-side temperature gradient at the melt/crystal interface F. Considering that there is a direct relationship between the crucible temperature and the side heater power, equation (5) can be written as, $$@ \frac{v}{G_{s,f,z}} = \text{constant} \qquad (6)$$
$$\frac{\Delta G_{l,f,z}}{\Delta Q_{sh}} > td1, \text{ and } \frac{\Delta G_{l,os,z}}{\Delta Q_{sh}} < td2$$

where td3 and td4 are threshold values limiting the sensitivity of interfacial melt-side temperature gradient and open surface melt-side temperature gradient, respectively, to the side heater power $Q_{sh}$. In physical sense, equation (6) states that as the heat loss from the open melt surface MS decreases, less heater power is required to grow the crystal C and the increase in crucible temperature is correspondingly reduced.

Growth Conditions at Melt/Crystal Interface: Incorporated Point defect Control

As discussed above, the initial point defect incorporation in a growing crystal depends, at least in part, on (v/$G_{s,f,z}$). In practice, the shape of the interface tends to be curvilinear. Therefore, the effect of temperature gradients at the (curvilinear) melt/crystal interface F should be addressed to understand the point defect incorporation.

Radial Variation of $G_{s,f,z}$: Qualitative Analysis

The radial uniformity in the incorporated point defect field depends, at least in part, on the interface shape. For an interface of arbitrary shape, process tuning (e.g., control of the melt heat exchanger, crystal heat exchanger, among other components) is desirable to achieve desired $G_{s,f,z}$ (r). To understand the radial variation of $G_{s,f,z}$, equation (1) is applied for an axi-symmetric two-dimensional model of the crystal puller.

$$\{\alpha_s(G_{s,f,z}+G_{s,f,r})\}\cdot\{n\}=\{\alpha_l(G_{l,f,z}+G_{l,f,r})\}\cdot\{n\}+\{(-\Delta H)\rho v\}\cdot\{n\} \quad (7)$$

$$\{q_{s,f,z}+q_{s,f,r}\}\cdot\{n\}=\{q_{l,f,z}+q_{l,f,r}\}\cdot\{n\}+\{q_{fusion,f,z}\}\cdot\{n\} \quad (8)$$

$$\{q_{s,f,n}\}=\{q_{l,f,n}\}+\{q_{fusion,n}\}\rightarrow q_{s,f,n}=q_{l,f,n}+q_{fusion,f,n} \quad (9)$$

Subscript r and z indicate r and z directions. Subscript fusion indicates the heat-flux by solidification of melt and subscript n indicates normal flux. Note that when n is not used as a subscript, it denotes the unit vector normal to the interface. It is evident that as the radial uniformity of the flux ($q_{s,f,z}$) increases, the radial uniformity of the gradient ($G_{s,f,z}$) increases. The same argument holds true for the melt-side.

Since radial uniformity of the gradient ($G_{s,f,z}$) may be desirable for uniform point defect incorporation, the following discussion focuses on maintaining this uniformity. However, when the interface shape cannot be approximated by a parabola, the gradient ($G_{s,f,z}$) typically varies along the interface for radially uniform point defect incorporation. Therefore, the novel crystal puller CP may be controlled or tuned to vary the local temperature field at or near the melt/crystal interface F such that a desired predetermined gradient ($G_{s,f,z}$ (r)) is achieved.

Control of Radial Uniformity and Variation of Gradient ($G_{s,f,z}$) for Curvilinear Interfaces In practice it is difficult to predict the shape of the interface and its curvature, which varies as a function of r, a priori. In some cases, the interface cannot be approximated by an average. Therefore, the novel crystal puller CP is capable of manipulating and tuning (or controlling) the shape of the interface such that the optimum radial control of $G_{s,f,z}$ is achieved, and to allow an efficient growth process. The capacity of the crystal puller to manipulate and tune the interface shape, e.g., for a fixed pull-rate enables a process that produces defect-controlled silicon, among other types of crystal.

The shape of the melt/crystal interface F changes as a function of the temperature field at or near the interface (the local temperature field). Most of the heat entering the melt is transferred through the exposed melt surface MS to the environment. Thus, controlling the heat transfer through the open melt surface MS using, e.g., the melt heat exchanger MHE heat source, effectively changes the temperature field in the melt M and the crystal C (and thus the local temperature field). The local temperature field typically affects initial type and concentration of intrinsic point defects as the silicon solidifies. The local temperature field generally ranges from the temperature of solidification (i.e., about 1410° C.) to a temperature greater than about 1300° C. (i.e., about 1325° C., 1350° C. or more). The active melt heat exchanger MHE can also change the global temperature field (the field away from the interface). The temperature of the melt heat exchanger MHE influences the magnitude and the direction of the heat flux from the melt-surface. Note that the temperature of the melt heat exchanger MHE can be manipulated by controlling the current passing through it (the power). As the melt heat exchanger MHE power (and therefore temperature) increase, the heat loss from the melt-surface decreases. Operating the melt heat exchanger MHE, even at relatively low power temperature, tends to enable a decrease in the side heater temperature. Generally, as the melt heat exchanger MHE power increases, the required side heater power decreases. Since the portion of the melt M away from the interface is heated mainly by the side heater, decreasing the side heater power (and thereby decreasing the side heater temperature), causes a reduction in the melt temperature, at least the portion of the melt away from the interface. Further, operation of the melt heat exchanger MHE causes the melt/crystal interface F to move downward. The downward movement of the interface can also be facilitated by operation of the crystal heat exchanger CHE. Thus, by selectively manipulating or controlling the melt heat exchanger MHE power and the temperature of the crystal heat exchanger CHE, the shape of the melt/crystal interface F can be manipulated and controlled. Manipulation of the interface shape helps to control the radial variation and uniformity of the axial heat flux into the crystal C.

Figure 10:
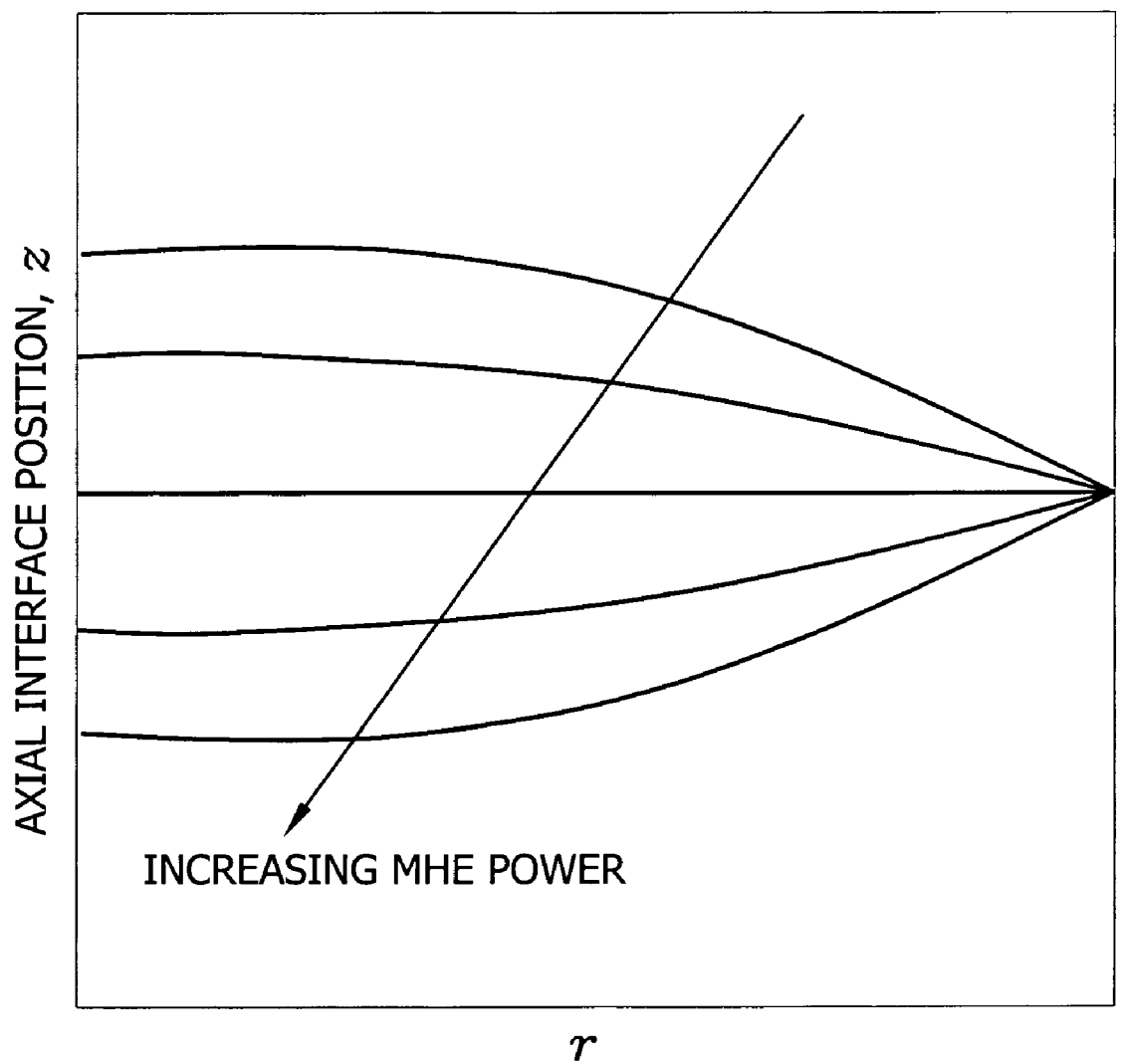
FIG. 10 is a graph of the possible qualitative dependence of the interface shape on melt heat exchanger (MHE) power.
Figure 11:
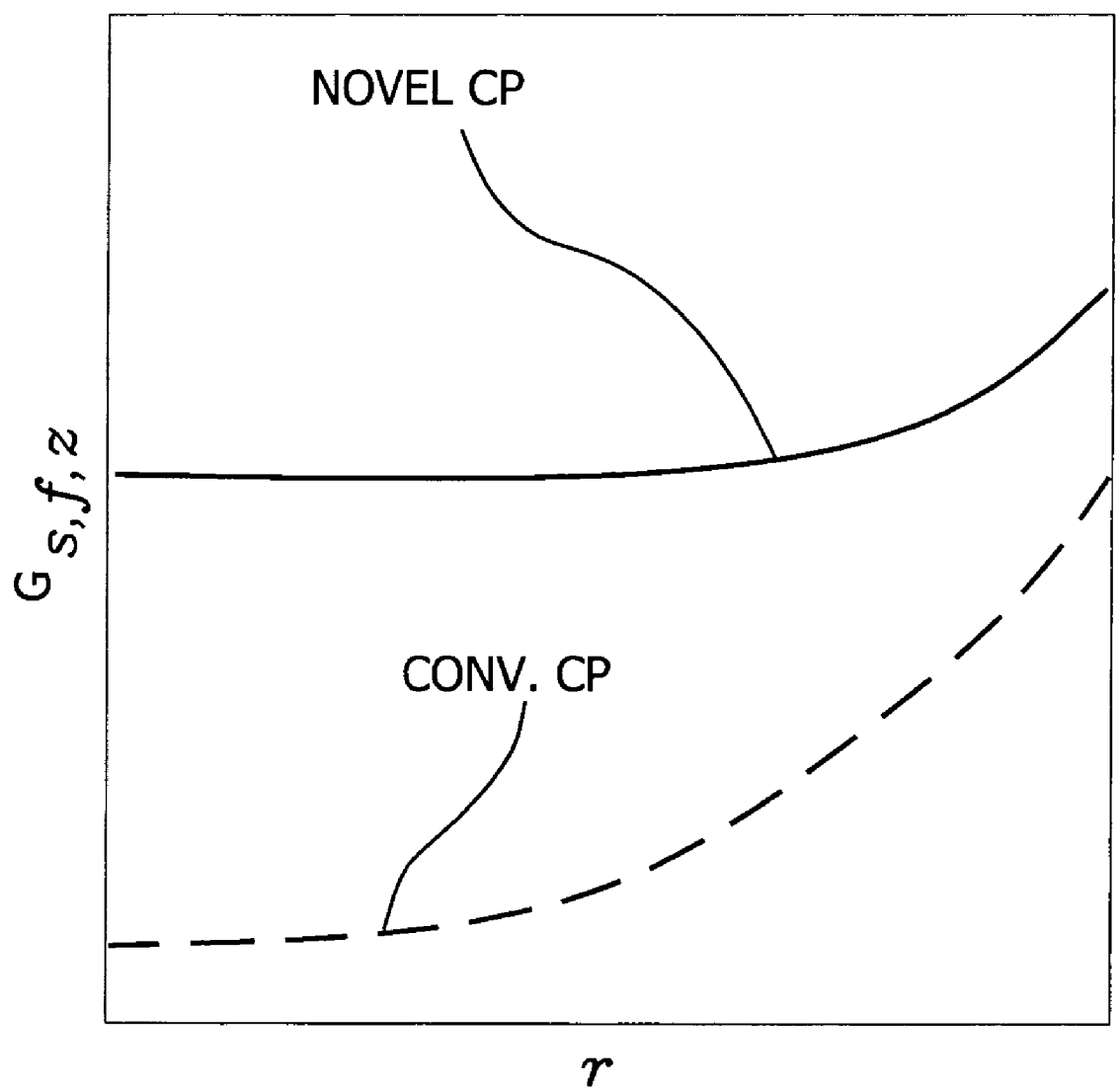
FIG. 11 is a graph of radial distribution of $G_{s,f,z}$ at the interface for a typical crystal puller and for a novel crystal puller with active melt heat exchanger (MHE) and crystal heat exchanger (CHE)

A qualitative graph of variations in the interface shape as a function of increasing melt heat exchanger MHE power is shown in FIG. 10. As discussed above, the melt heat exchanger MHE and the crystal heat exchanger CHE may be used to maintain a relatively high gradient ($G_{s,f,z}$) at the interface. In spite of the enhanced radial heat transfer from the crystal surface due to the crystal heat exchanger CHE, the melt heat exchanger MHE is desirably operated to maintain satisfactory control of the gradient ($G_{s,f,r}$(r)). The novel crystal puller CP enables relatively high productivity (relatively high pull rate) and control of $G_{s,f,z}$ (r) at the interface. A comparison between the radial variation of gradient ($G_{s,f,z}$) at the interface for the novel crystal puller CP and that a conventional crystal puller is shown in FIG. 11. The novel crystal puller CP performs far better than conventional crystal pullers.

Operation of the melt heat exchanger MHE tends to decrease the overall temperature of the melt M. The melt M also becomes more isothermal and thereby promotes uniform axial temperature gradients on the melt-side at the melt/crystal interface F. The melt heat exchanger MHE, in conjunction with the side heater, forms a distributed heat source to improve the radial uniformity. The novel crystal puller CP enables control of radial uniformity and variation in v/$G_{s,f,z}$ at the interface and limits the temperature of the crucible CR. Melt heat exchanger MHE power should remain relatively low to moderate. As the melt heat exchanger MHE power temperature increases significantly, the melt M can become very hot and the interface may start moving upward away from the M. But even if the melt M becomes very hot, manipulation of the melt heat exchanger MHE power can still be used to tune or control the interface shape and radial variation of $G_{s,f,r}$ (r).

Thermal (Time-Temperature) History

Crystal Puller for Production of Rapid Cooled Silicon (RCS)

The growth conditions at the melt/crystal interface F for a given crystal C section or segment affect initial point defect incorporation in the segment. However, subsequent defect dynamics is a function of the thermal history of the crystal segment. The temperature field in the crystal C changes as it grows. However, for the sake of simplicity, it is reasonable to assume that at a location in the crystal C, fixed from the stationary melt/crystal interface, the temperature does not change significantly even as the crystal C grows. In other words, all crystal segments may be assumed to traverse through the same temperature field. Thus, the time-temperature path of a crystal-segment is obtained by knowing the history of pull-rate as a function of time and the temperature field.

Figure 12A:
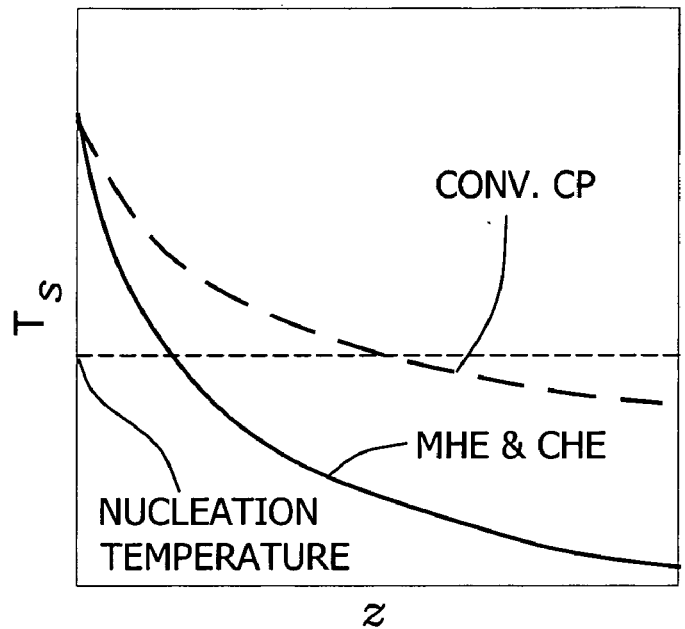
FIG. 12A is a graph showing the comparison between the axial temperature profile in a crystal in the novel crystal puller with active melt heat exchanger (MHE) and crystal heat exchanger (CHE), and that in a conventional crystal puller.
Figure 12B:
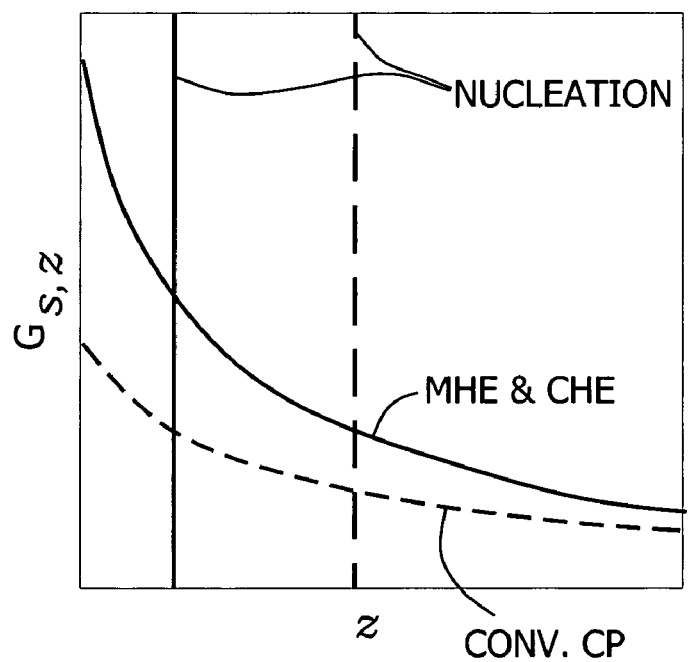
FIG. 12B is a graph showing the comparison of local axial temperature gradients ($G_{s,z} = -\partial Ts/\partial z$) in a crystal in the novel crystal puller with active melt heat exchanger (MHE) and crystal heat exchanger (CHE) and those in a conventional crystal puller.

The novel crystal puller CP can satisfactorily manufacture, for example, any rapid cooled silicon RCS product. The axial temperature profile of a crystal C grown in the FIG. 1 embodiment is given by FIG. 12A, qualitatively. FIG. 12A also compares the axial temperature profile in a crystal C in a typical conventional crystal puller with that in the crystal grown with active melt heat exchanger MHE and crystal heat exchanger CHE in the novel puller. As a result of efficient cooling of the crystal C, the temperature drop in the C in the novel crystal puller CP with active melt heat exchanger MHE and crystal heat exchanger CHE occurs at much higher rates very close to the melt/crystal interface F. As shown in FIG. 12B, the local cooling rates of crystal segments given by the product of pull-rate and the negative axial temperature gradient ($vG_{s,z}$) are much higher for the novel crystal puller CP.

As shown in FIG. 12B, the crystal cooling rates through the nucleation temperature of the chosen defect are higher for the novel crystal puller CP with active melt heat exchanger MHE and crystal heat exchanger CHE. Nucleation temperature is determined by the maximum in the nucleation rate versus temperature curve. If the cooling rates through nucleation temperature are very high, only insignificant nucleation typically takes place. Thus, nucleation temperature in FIGS. 12A and 12B indicates only the theoretical maximum in nucleation rate but not the number of nuclei formed. In a rapid cooled silicon RCS product, number of microdefects can be very low, although all crystal-segments traverse through a maximum in the nucleation rate. The gradient $G_{s,f,z}$ at the interface for the novel crystal puller CP can be controlled more efficiently than for a prior art crystal puller. Therefore, practically all rapid cooled silicon RCS products can be produced in the novel crystal puller CP shown in FIG. 1.

Note that the novel crystal puller CP of FIG. 1 mainly addresses the control and manipulation of interfacial conditions. Therefore, additional components (e.g., heaters) are desirably added to the design, as described with respect to FIG. 2, to manipulate and control the time-temperature path of a given crystal segment.

Some crystal types are manufactured by growing the entire or significant part of the crystal C above the nucleation range of the relevant point defect species, followed by rapid cooling of the crystal in a cooling chamber. Also, manufacture of some crystal relies on allowing extended residence time for crystal-segments through the high temperature zone before nucleation rates of point defects reach their maximum values. Since the residence time is marked by significant diffusion of point defects, it is often termed the "diffusion time." The axial temperature drop in the crystal growing in the novel-crystal puller with only active melt heat exchanger MHE and crystal heat exchanger CHE is relatively high. In other words, crystal segments spaced or distant from the melt/crystal interface F may cool too quickly. Therefore, some modifications to the novel crystal puller CP may be made to maintain a higher temperature or slow the cooling in such crystal segments.

Figure 2:
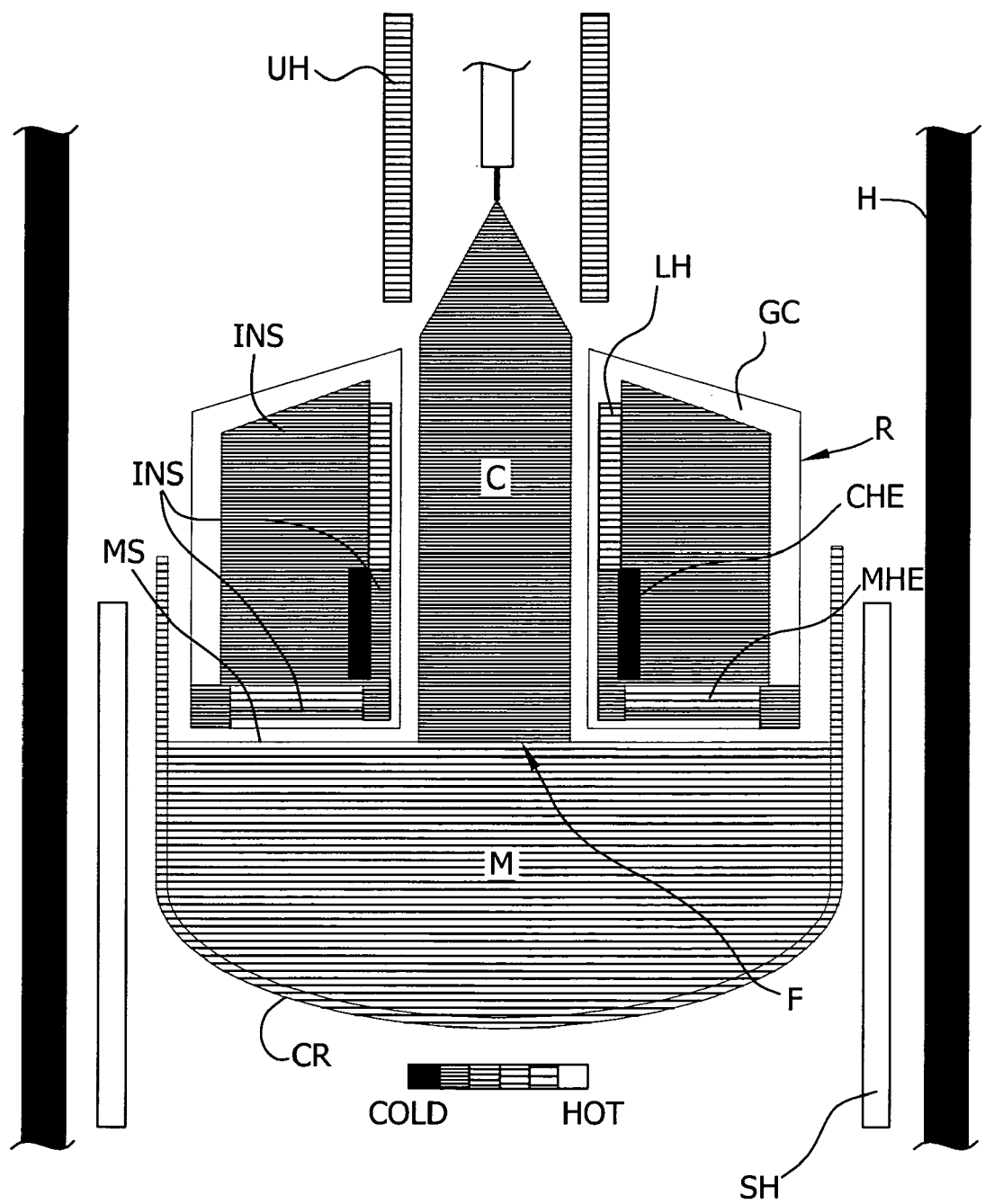
FIG. 2 is a schematic section of another embodiment of the novel crystal puller (with melt heat exchanger (MHE), crystal heat exchanger (CHE), lower heater (LH) and upper heater (UH))
Figure 3:
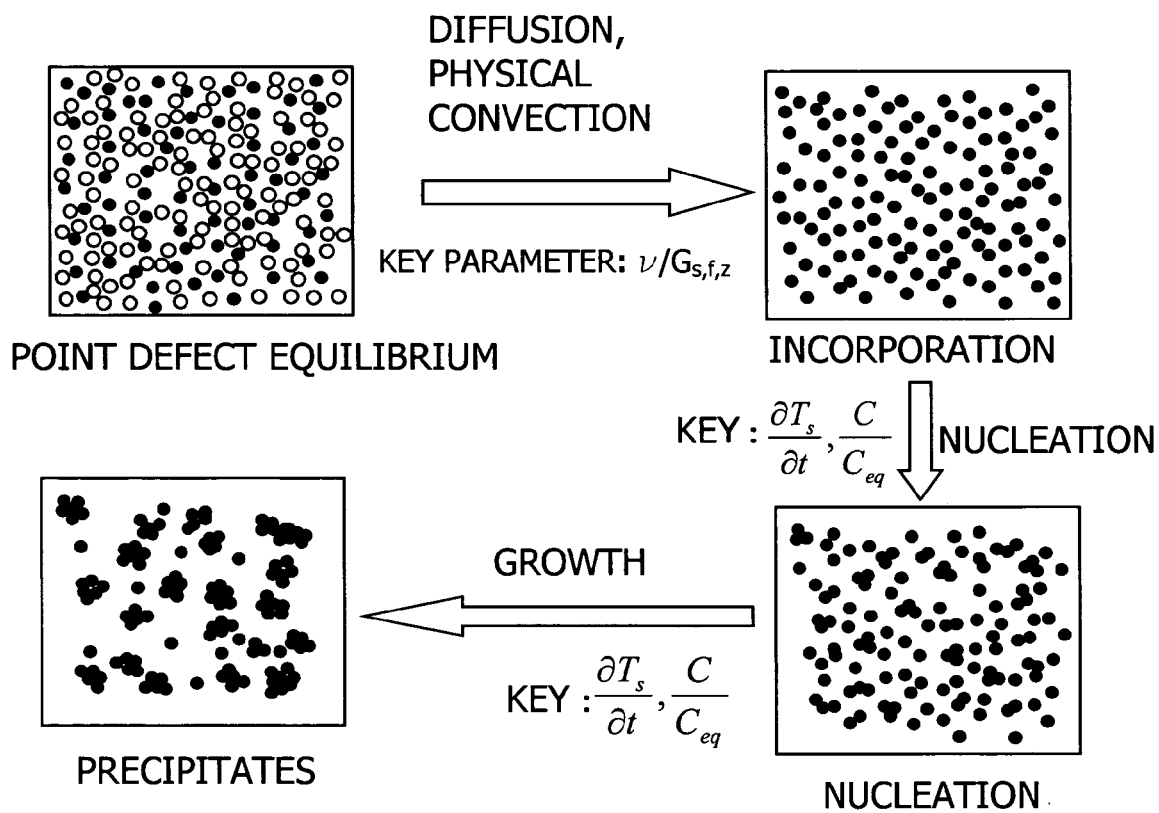
FIGS. 3 and 4 are schematic graphs of defect dynamics.
Figure 4:
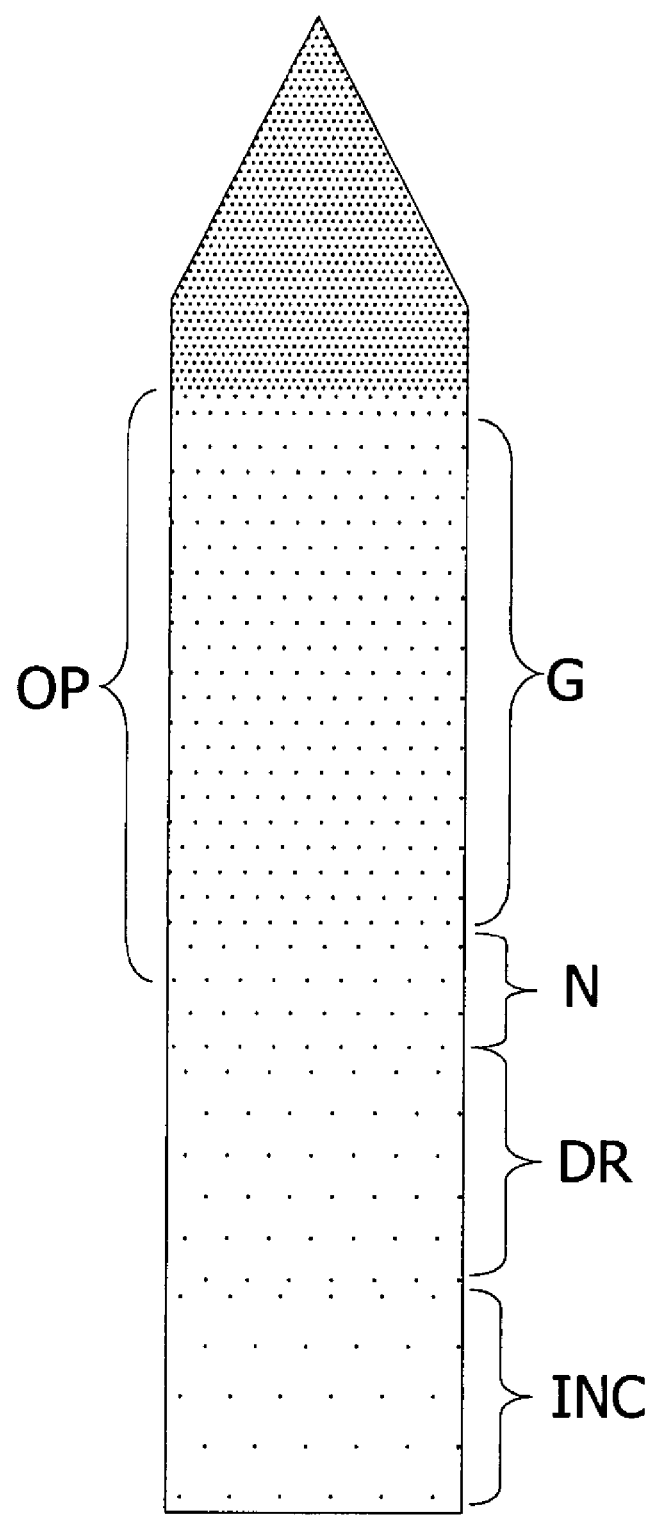

Referring to FIG. 2, the novel crystal puller CP of the second embodiment generally allows growth of the crystal C above a set temperature and extends the diffusion time. The second embodiment contains the components of the previous embodiment, including the reflector R, melt heat exchanger MHE and the crystal heat exchanger CHE. In addition, a tubular lower crystal heater LH and tubular upper heater UH are included. The lower heater LH is disposed inside the cover GC and above the crystal heat exchanger CHE for maintaining the crystal temperature above the required nucleation temperature range. As shown, there is little or no space between the crystal heat exchanger CHE and the lower heater LH, though it is contemplated to space the lower heater from the crystal heat exchanger. The lower crystal heater LH is suitably electrically heated, substantially similar to the melt heat exchanger MHE, and its power is controlled by regulating the current passing therethrough. The lower and upper heaters (LH and UH) may be constructed to have a controllable axial power profile, and the melt heat exchanger MHE may be constructed to have a controllable radial and/or axial power profile, and the crystal heat exchanger CHE may similarly be constructed to have controllable axial and/or radial cooling profile, as noted above. The lower heater LH profile and temperature typically depends on the cooling provided by the crystal heat exchanger CHE and the targeted nucleation temperature range.

Heat provided by the lower heater LH can keep the crystal segments that are distant from the interface warmer for an extended period of time, allowing the extended diffusion and interaction time for point defects and other impurities. The higher the axial location of the nucleation temperature from the melt/crystal interface, the longer the diffusion time. In addition, some crystal types rely on extended diffusion time for point defect diffusion and annihilation followed by rapid quenching through the nucleation temperature. Typically, the extended diffusion and rapid quenching is accomplished by growing the entire crystal below nucleation temperature and then transferring it to an optional cooling chamber (not shown) located inside the crystal puller. The distance between the melt/crystal interface F and the axial location of the relevant nucleation temperature determines the length of the diffusion time-dependent crystal.

The upper heater UH is disposed above the lower heater LH. The upper heater UH may be used for distributed axial heating over an extended length of the growing crystal, such as for extended diffusion. Note that due at least in part to the practical size limitations of the crystal puller CP and the reflector R, it may not be possible to have a very long lower heater LH to provide the required axially distributed heating to grow longer crystals. Accordingly, the upper heater UH is suitably disposed above and outside the reflector R and spaced significantly from the lower heater LH. Note that a cooling chamber (not shown) may be disposed above the upper heater UH to allow rapid quenching after growth, such as under conditions of extended diffusion and interaction. Preferably, the structural components need not be removed or added to the puller to produce a desired product. However, each component need not necessarily be operating during crystal growth.

Figure 13:
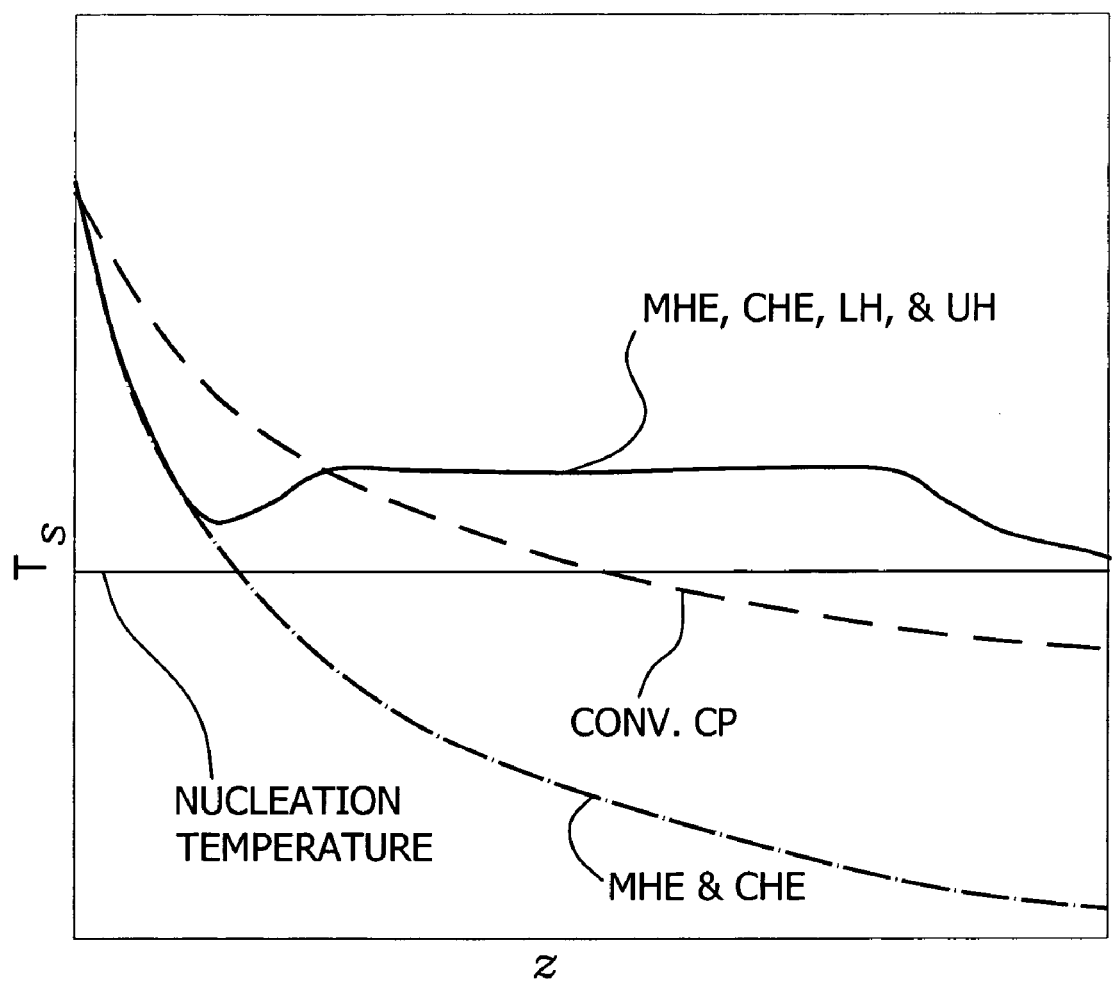
FIG. 13 is a graph of the axial temperature profiles in novel crystal pullers with various heat sources and heat sinks operating and a profile of a conventional crystal puller.

Referring to FIG. 13, with active (operating) melt heat exchanger MHE, crystal heat exchanger CHE, lower heater LH and upper heater UH, a desirable relatively flat axial temperature profile exists in the crystal C. FIG. 13 also compares the temperature profiles in growing crystals C in the novel crystal puller CP with operating melt heat exchanger MHE and crystal heat exchanger CHE, and a conventional crystal puller. In the novel crystal puller CP with active melt heat exchanger MHE, crystal heat exchanger CHE, lower heater LH and upper heater UH, the radial profile and the magnitude of $G_{s,f,z}$ at the interface also remain comparable to those in the first embodiment (FIG. 11).

The novel crystal puller CP with melt heat exchanger MHE, crystal heat exchanger CHE, lower heater LH and upper heater UH is versatile and can create different temperature fields in the crystal puller necessary for growing a variety of crystal types. The several heat sources (melt heat exchanger MHE, lower heater LH, upper heater UH) and the heat sink (crystal heat exchanger CHE) can be turned on or off depending on the desired temperature field. The magnitude and power profile of the heaters (melt heat exchanger MHE, lower heater LH, upper heater UH), and magnitude and axial profile of cooling capacity of the crystal heat exchanger CHE can be manipulated. For example, the second embodiment crystal puller can generate temperature fields similar to the first embodiment by switching off lower and upper heaters (LH and UH). Many different crystal types can be produced using the novel crystal puller CP.

Modes of the operation of the novel crystal puller CP are identified below by the active heat sources (heaters) and heat sink (crystal heat exchanger CHE). For example, novel crystal puller CP with active melt heat exchanger MHE and upper heater UH means that the CP operates with active MHE and UH while crystal heat exchanger CHE and lower heater LH are switched off. Thus, operations of the novel crystal puller CP are distinguished by specifying active heat sources and sinks while the crystal puller itself is generically referred to as the CP.

Numerical Experiments:

The novel crystal puller CP may be verified by performing various numerical experiments. The study was accomplished by comparing the performance of the novel crystal puller CP with a conventional crystal puller. The numerical experiments are accomplished, for example, by simulating the temperature field for the novel crystal puller CP and analyzing the results.

The Model

An acceptable quantitative model describing the crystal growth is used for numerical simulation of the growth process in the novel crystal puller CP. An acceptable model for crystal-growth includes momentum balance in the melt M and atmosphere, and an energy balance in all components of the crystal puller. Argon atmosphere is the typical atmosphere for crystal growth. Energy balances in each phase are coupled by boundary conditions defined by conduction, radiation and convection. System equations formed by momentum and energy balance can be a difficult to solve for turbulent flow involving radiative heat transfer. As the crucible CR size increases the buoyancy driven melt-flow becomes turbulent. This is true for practically all of today's crystal pullers. A direct numerical simulation of the system involving many solid and fluid phases exchanging energy by all modes of energy transfer, where a fluid exhibits turbulent flow can become very expensive and impractical. Therefore, an acceptable model used for the numerical simulation herein involves reasonable assumptions. In this study we use a popular model used by Virzi. The following assumptions are made:

The system is axi-symmetric.
The system is quasi-stationary i.e., system is at pseudo-steady state.
Momentum balance is approximated by effective solid body thermal conductivity, if necessary.
Two solid bodies are in perfect contact.
Energy transfer from the open edges takes place by radiation and convection.
Energy balance at the solid-liquid interface is important in predicting the interface shape.
Convection is predicted reasonably well by convective heat transfer coefficients.
A constant temperature Dirichlet condition accurately represents the boundary of the calculation domain.
Heat sources and sinks are either assigned a energy generation rate profile or a temperature profile.

The assumption of pseudo-steady state saves considerable computational time. The thermal history of a crystal segment can be obtained by generating the steady state temperature field in a crystal at various lengths. Further simplification can be made by assuming that all segments of a crystal pass through a temperature field fixed in r and z. This fixed temperature field can be computed once, for a long crystal, e.g., greater than 800 mm. Thus, the problem becomes simpler by fixing the temperature field independent of the crystal-length. However, it is not necessary to assume that the crystal temperature field is independent of the crystal length. Several pseudo-steady state temperature fields describing different crystal lengths can be simulated and the thermal history of a crystal segment can be computed by interpolation between these temperature fields.

The equation describing the energy balance in the melt M is same as that for a solid body because the M is assumed to be a solid body. In general, an energy balance for a solid body (including melt) is given by $$\nabla \cdot \{\alpha \nabla T\} - \{\rho C_p v\} \cdot \{\nabla T\} + S_H = 0 \tag{10}$$

where T, as defined before, is temperature of any solid body, $\alpha$ is the thermal conductivity, $\rho$ is density, $C_p$ is the heat capacity, $S_H$ is the volumetric heat generation rate, which is negative if heat is absorbed. The heat generation term, $S_H$, is present only for sources and sinks. The solid advection is present only when the solid is physically moving, and hence, is applicable only to a growing crystal. Thus, heat transfer by solid advection, $\{\rho C_p v\} \cdot \{\nabla T\}$, is present only in the energy balance of the crystal C. For the solid bodies in contact, perfect contact is assumed. Thus the normal flux balance between two solid surfaces describes the boundary between two solids in contact.

$$\{\alpha_1 \nabla T_1\} \cdot \{n\} = \{\alpha_2 \nabla T_2\} \cdot \{n\} \tag{11}$$

where, $\{n\}$ is the unit vector normal to the surfaces in contact. Subscripts 1 and 2 denote two solid bodies in contact. The boundary condition for the open solid surfaces inside the crystal puller are given by balancing the normal conductive flux with radiative and convective heat fluxes.

$$-\{\alpha \nabla T\} \cdot \{n\} = h(T - T_g) + \epsilon \sigma (T^4 - T_{\mathit{eff}}^4) \tag{12}$$

where h is the convective heat transfer coefficient between the solid body and the gaseous atmosphere at temperature $T_g$, $\epsilon$ is emissivity, $\sigma$ is the Stefan-Boltzmann constant, and $T_{\mathit{eff}}$ is the effective temperature of the environment felt by the solid body. Assuming gray body radiative heat transfer, effective temperature of the environment felt by a solid body is expressed in terms of Gebhardt factors. The external boundary of the crystal puller entirely covered by the external cooling jacket is assumed to be at a constant cooling water temperature, $T_{coolant}$. In addition, other coolers are also assumed to be at coolant temperatures.

$$T = T_{coolant} \tag{13}$$

The melt/crystal interface F is defined by an isotherm at the freezing temperature $$T_{s,f} = T_{l,f} = T_m \tag{14}$$

where subscript s stands for crystal, l stands for melt M and m stands for melting or freezing conditions. At the tri-junction node where gas, melt, and solid are in contact with each other, the temperature is defined to be equal to the freezing temperature.

$$T_{slg} = T_m \tag{15}$$

where subscript slg denotes the tri-junction node. The tri-junction node defines the intersection of the melt/crystal interface F with the outer crystal-surface. The spatial location of the tri-junction node is fixed. Thus, the melt/crystal interface F, defined by the isotherm at the melting temperature is anchored at the tri-junction node. As described in equation (1), the energy balance across the melt/crystal interface F is given by the balance between the sum of conductive heat flux from the melt-side and the heat generation rate by fusion per unit area, and the total conductive flux into the crystal across the interface.

@interface $$-\{\alpha_s \nabla T_s\} \cdot \{n\} = -\{\alpha_l \nabla T_l\} \cdot \{n\} + \{-\Delta H \rho_s v\} \cdot \{n\} \quad (1)$$

$$q_{s,f,n} = q_{l,f,n} + q_{fusion,f,n}$$

where $(-\Delta H)$ is the enthalpy of fusion, v is the pull-rate and q is the heat flux. Subscript f denotes interfacial conditions and fusion denotes fusion. Details of the equation (1) energy balance are described above. Condition of symmetry renders the problem two-dimensional.

$$\{\nabla T\} \cdot \{n_r\} = 0 \quad (16)$$

where $\{n_r\}$ is the unit vector in the radial direction.

The temperature field inside the crystal puller is predicted by simultaneous solution of equations (10) through (16) and equation (1). The interface shape is given by the isotherm at the melting point anchored at the tri-junction node.

During a crystal-pulling process, it can be assumed that substantially all portions of a crystal traverse through a temperature field in the crystal calculated over its final length at pseudo-steady state. This assumption is fairly accurate in studying the thermal history of a crystal-segment after its formation. However, initial point defect-incorporation is very sensitive to small changes in the gradient at the melt/crystal interface F. Therefore, $v/G_{s,f,z}$ conditions at the interface cannot be assumed to be constant throughout the crystal growth process. Process tuning (thermal control) is desirable to maintain the desired $v/G_{s,f,z}$ conditions at the interface. Therefore, several simulations for the temperature field at various crystal lengths should be performed for accurate mapping of the temperature field in the growing crystal. However, in a broader sense, a basic understanding of the process can be obtained by simulating the temperature field in the crystal puller for the final length of the crystal C. At best, it can be assumed that a crystal-segment traverses through this fixed temperature field only during the pulling process. After a crystal C is completely grown, each crystal segment is generally subjected to a unique thermal history. Thus, the thermal history of a segment in the crystal is calculated by its time-location history during the crystal-pulling defined by growth of subsequent segments, and its final cooling after this growing process. Thus, there is a difference between the cooling conditions for a crystal segment during crystal growth, as compared to after crystal growth. During crystal growth, the cooling rate of any segment is given by the product of pull-rate and the local axial temperature gradient ($v/G_{s,z}$). After crystal growth, the cooling rate of the segment is best calculated by energy balance calculations.

Figure 14:
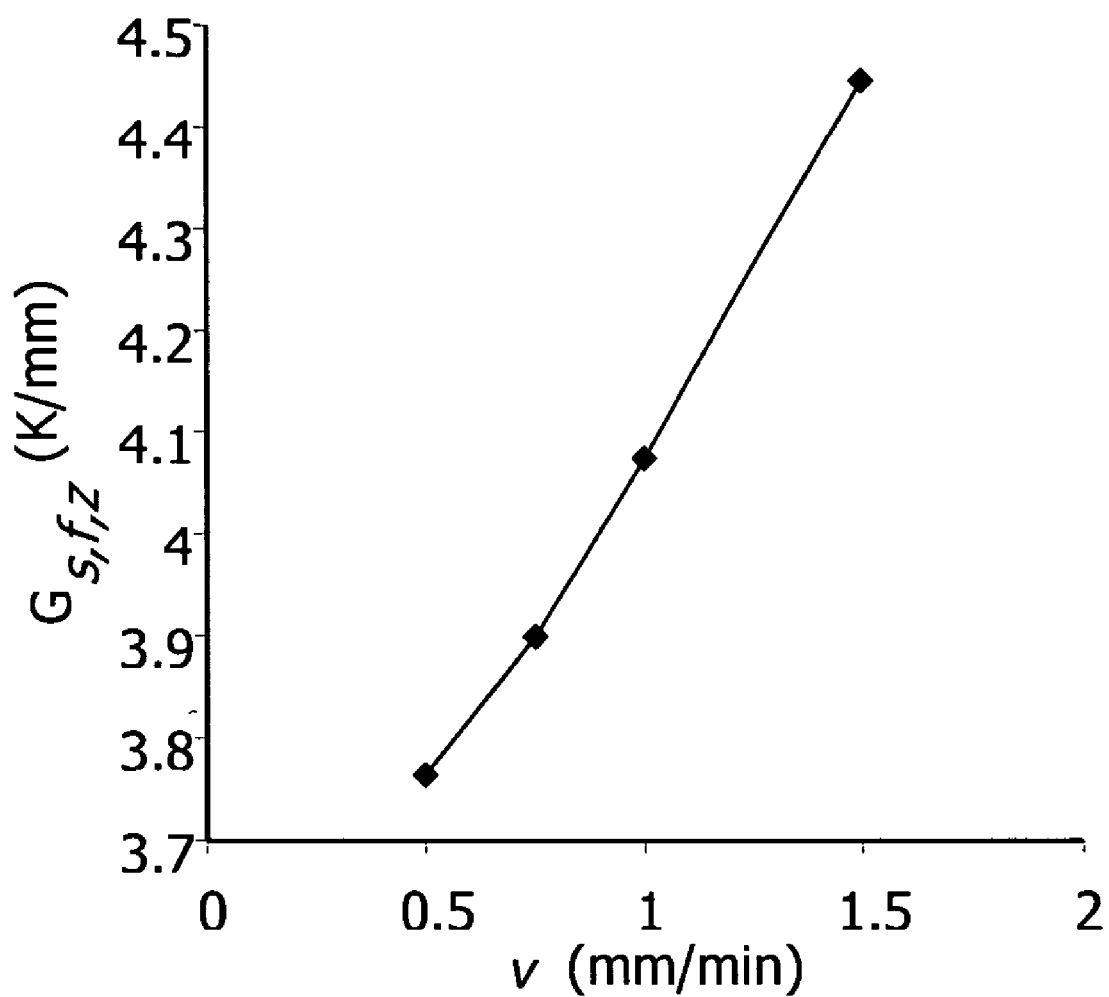
FIG. 14 is a graph of the relative variation in $G_{s,f,z}$ versus pull-rate in a conventional crystal puller.

Finally, all numerical experiments are accomplished using a pull-rate equal to 0.5 mm/min, unless mentioned otherwise. Although, $G_{s,f,z}$ changes with the pull-rate to some extent, it is reasonable to assume that $G_{s,f,z}$ calculated at pull-rate equal to 0.5 mm/min, can be used to represent $G_{s,f,z}$ values at pull-rates between 0.2 mm/min and 0.8 mm/min. FIG. 14 indicates that the change in $G_{s,f,z}$ of the crystal due to a small change in pull-rates is negligible. The assumption is reasonable as some change in the rate of solidification with change in pull-rate is compensated by an opposite change in the rate of heat conduction from the melt.

Performance of the Novel Crystal Puller

The relationships between different variables in the crystal-pulling process such as crucible temperature, crystal-side and melt-side temperature gradients at the interface, melt-side temperature gradients at the melt surface, heater powers etc. are discussed above. In this section, results of various numerical experiments are presented to validate the arguments made so far.

Conventional Crystal Puller

Figure 15:
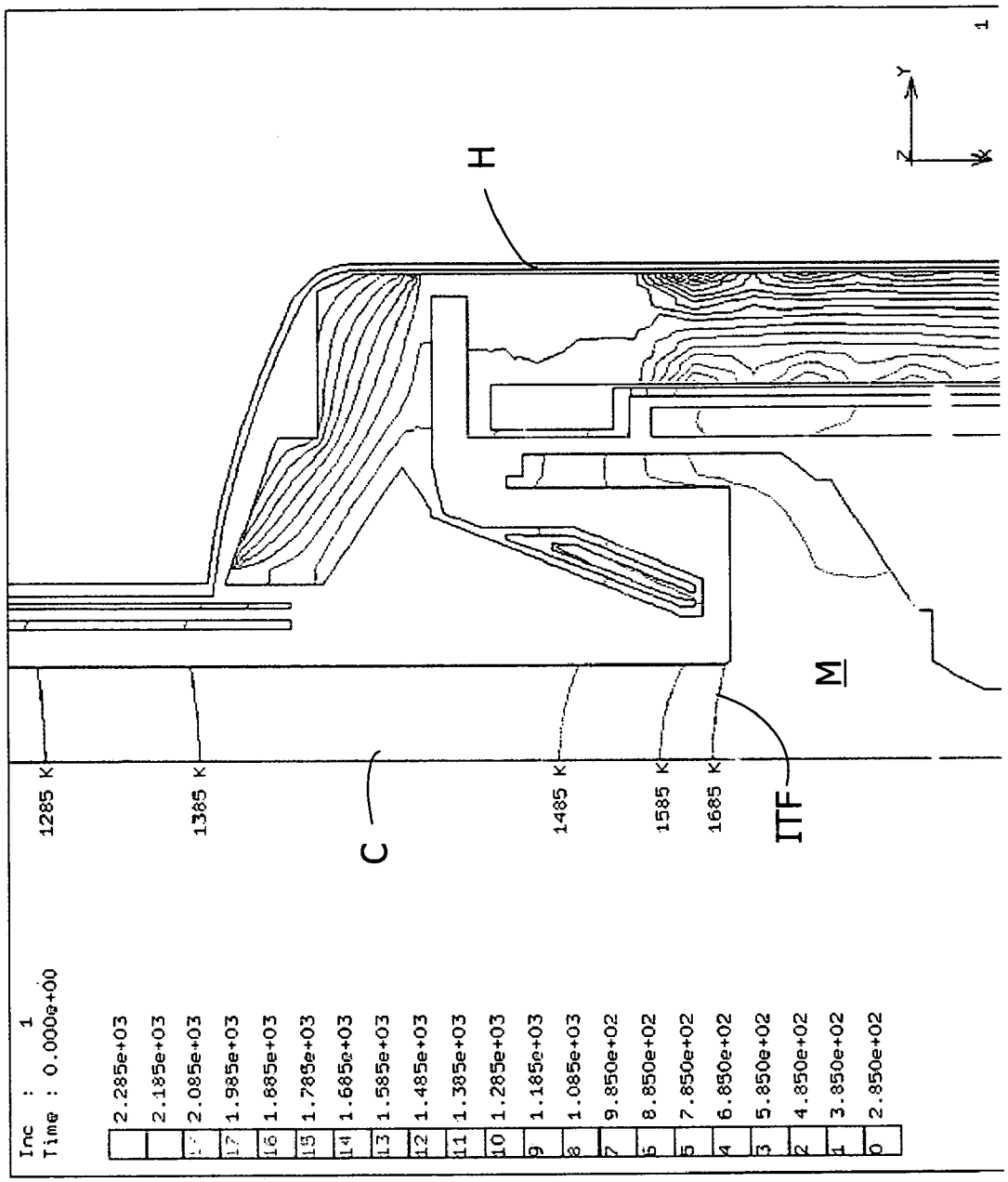
FIG. 15 is a simulated temperature field in the base-line conventional crystal puller.
Figure 16A:
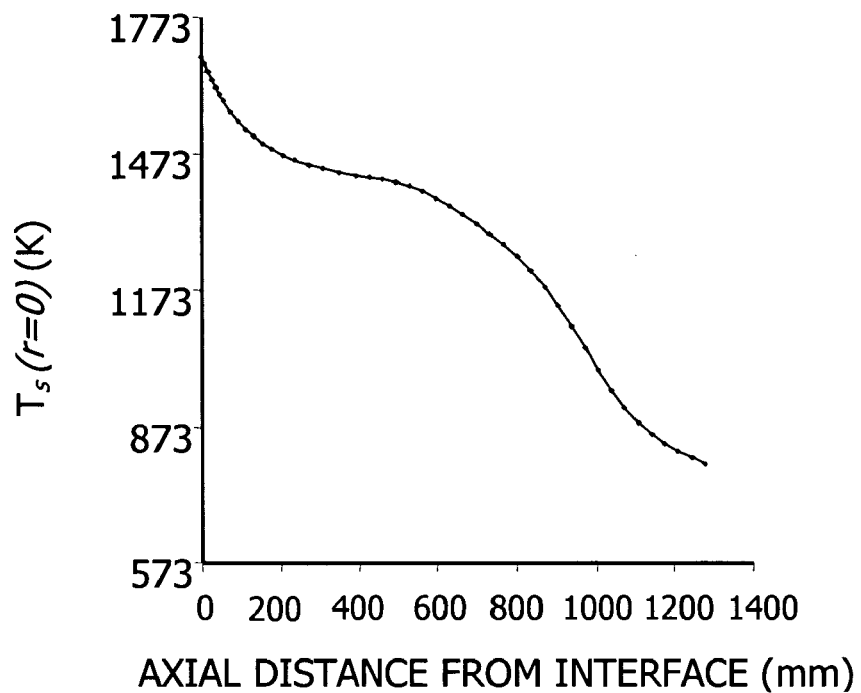
FIG. 16A is a graph of axial temperature profile in a growing conventional crystal and FIG. 16B is a graph of crystal-side negative axial temperature gradient ($G_{s,f,z}$) at the melt/crystal interface as a function of radial location.
Figure 16B:
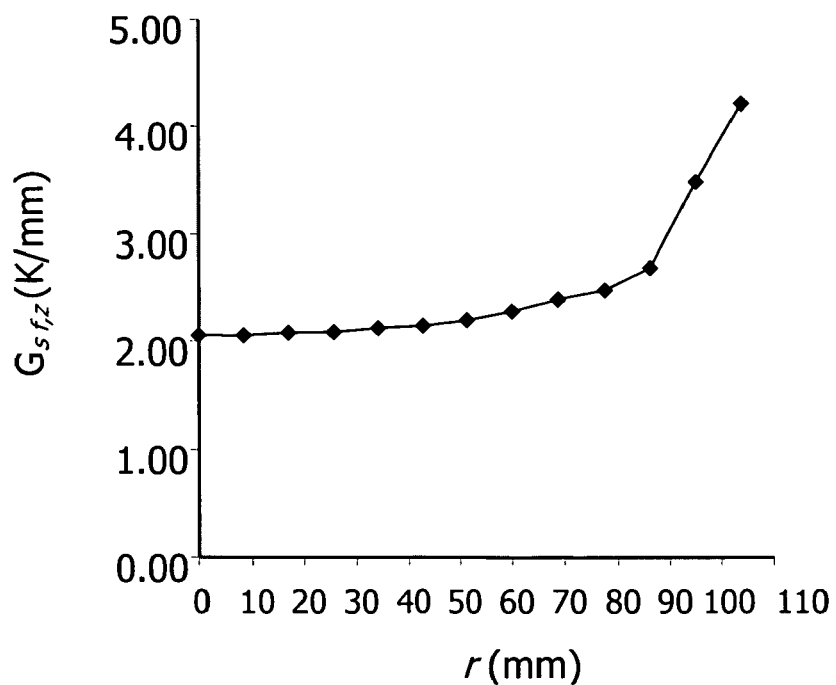

The typical design of the conventional crystal puller and its temperature field are shown in FIG. 15. (The temperature field in the crystal pullers is simulated using a commercially available finite-element based Software (MARC).) The conventional crystal puller in this study is the one that defines the upper limit in productivity of defect-controlled crystal. The conventional crystal puller is well-insulated. The passive reflector (no active heating or cooling) shields the crystal from the radiative heat exchange with the melt-surface, and the upper heater (upper heat exchanger) or UH keeps the crystal warmer such that the axial location of the relevant nucleation temperature, (in this case, nucleation temperature for self-interstitials, 1173 K) is around 900 mm above the melt/crystal interface F. The axial temperature profile in a relatively long crystal grown using the conventional crystal puller is shown in FIG. 16A. The corresponding radial variation of the negative axial crystal-side temperature gradients at the interface ($G_{s,f,z}$) is shown in FIG. 16B.

Configurations of the Novel Crystal Puller

Figure 17:
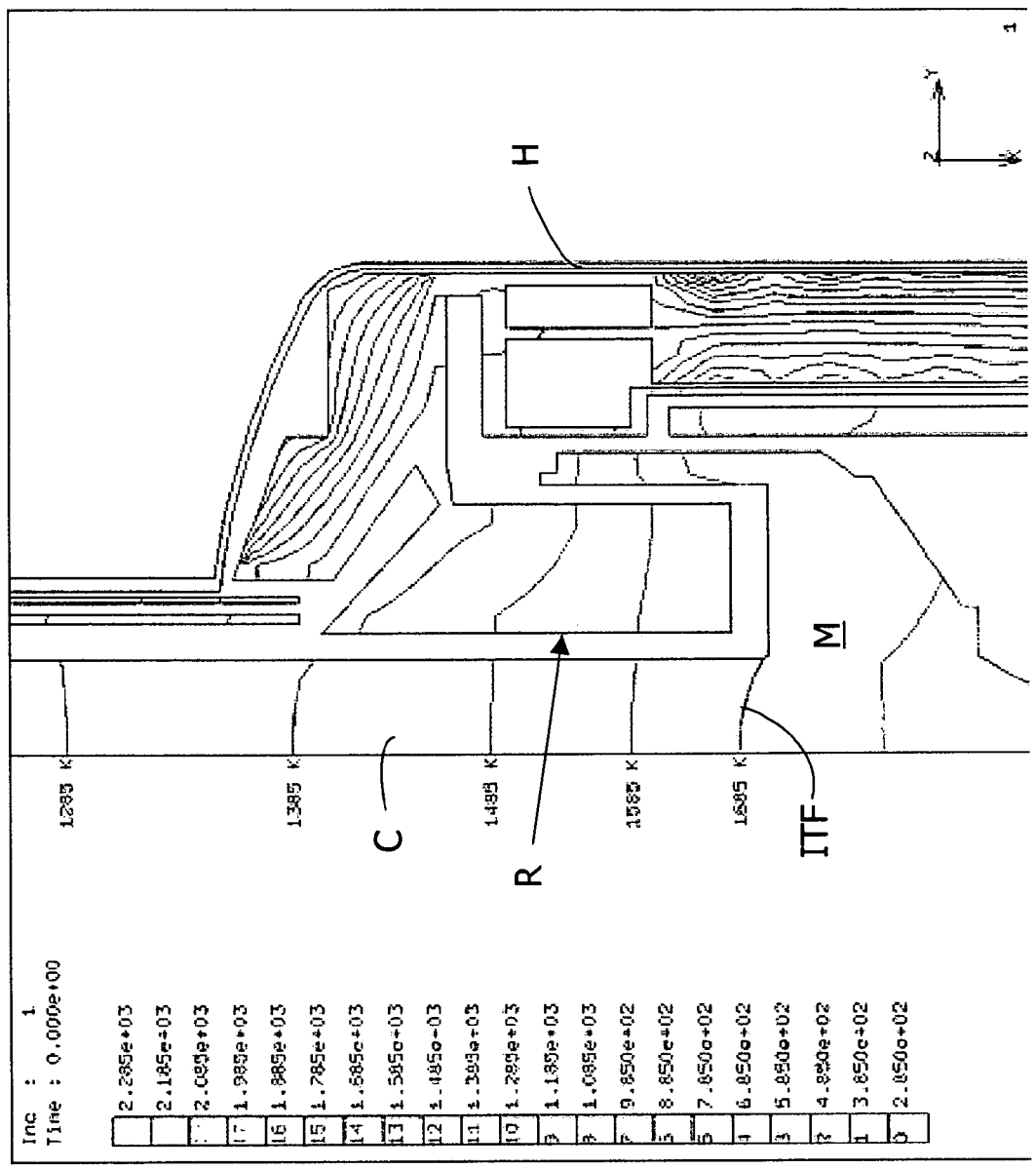
FIG. 17 is a simulated temperature field in the heavily insulated novel crystal puller with active upper heater (UH) and inactive melt heat exchanger (MHE), crystal heat exchanger (CHE), and lower heater (LH)
Figure 18A:
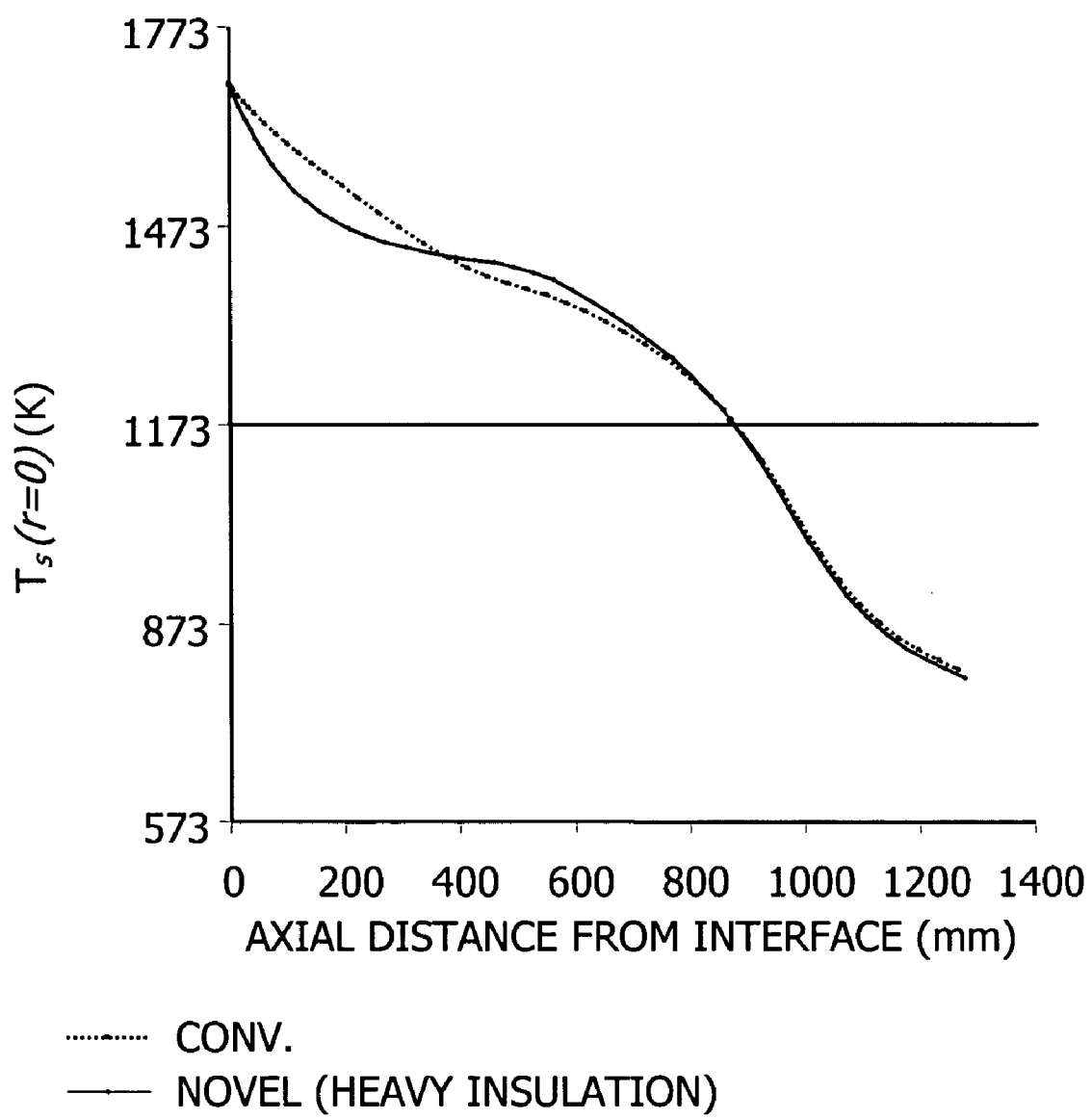
FIG. 18A is a graph showing axial temperature profiles in the conventional crystal puller and the insulated novel crystal puller with active upper heater (UH)
Figure 18B:
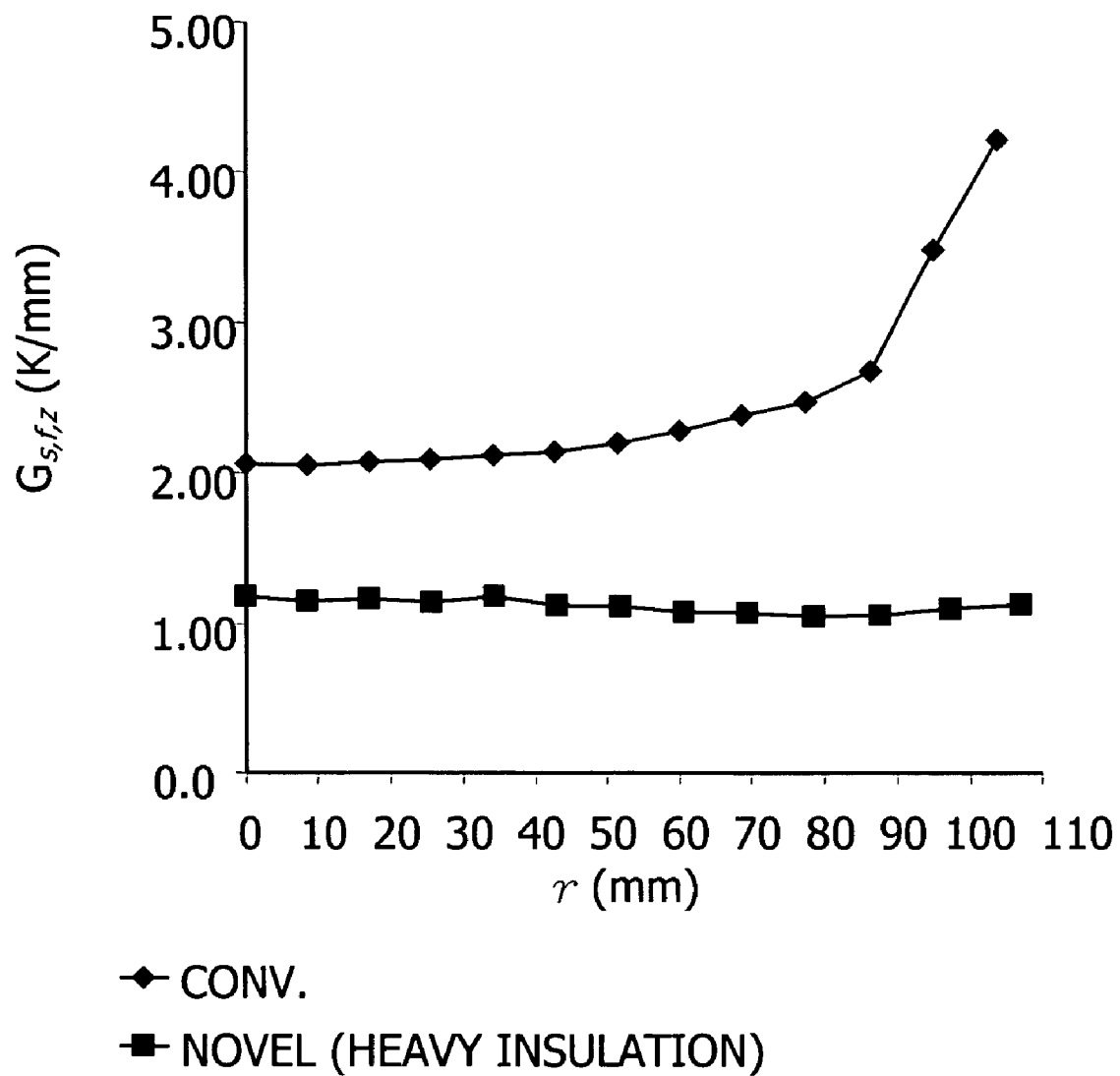
FIG. 18B is a graph comparing the conventional crystal puller and the insulated novel crystal puller with active upper heater (UH) with respect to $G_{s,f,z}$ at the interface.
Figure 18C:
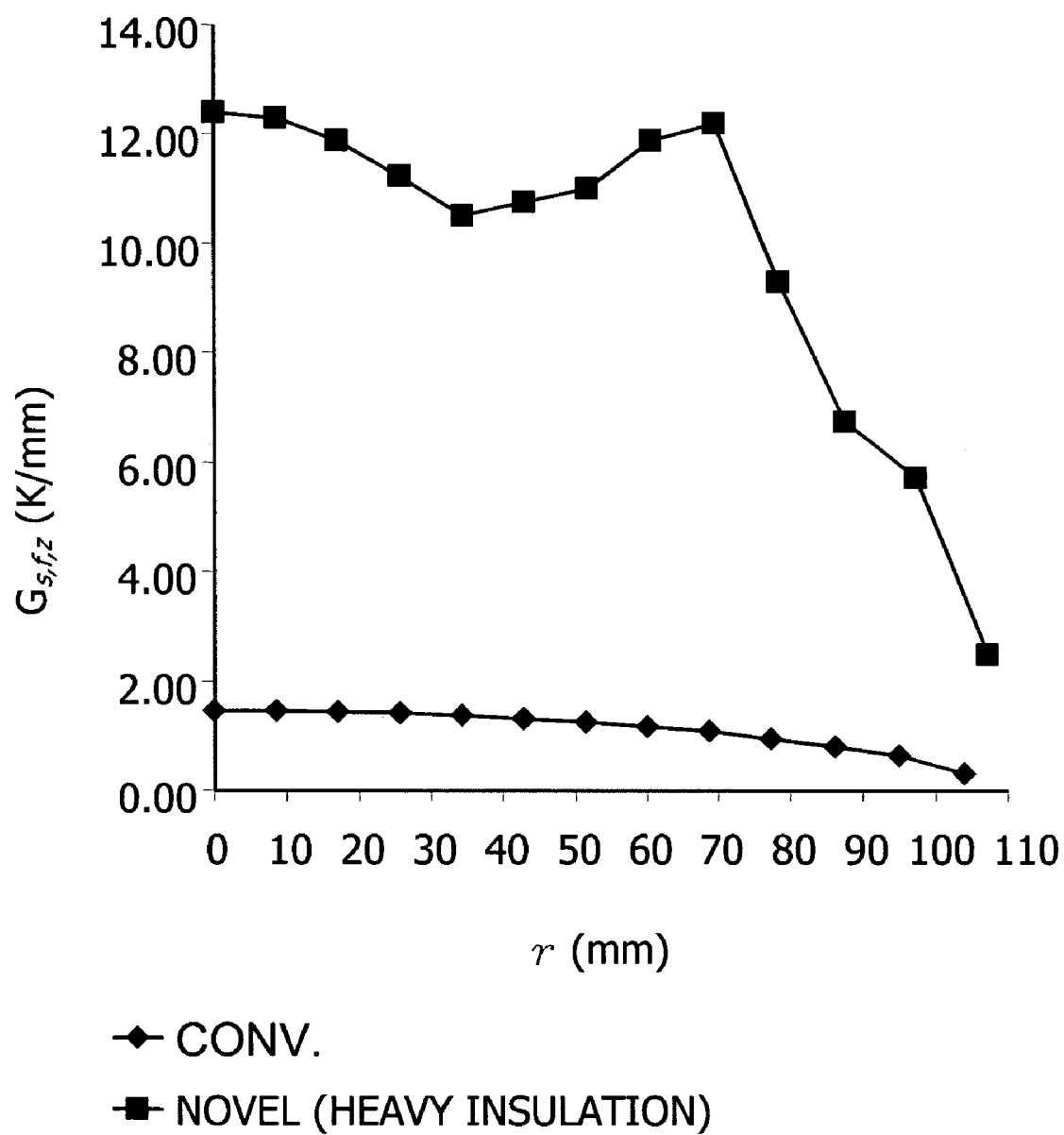
FIG. 18C is a graph of radial variation in the ratio of $q_{fusion,z}/q_{i,f,z}$ for the conventional crystal puller and the insulated novel crystal puller with active upper heater (UH)

Configurations Without Melt-Flux Control:

Performance of the heavily insulated novel crystal puller in which melt heat exchanger MHE, crystal heat exchanger CHE and lower heater LH are inactive (not operating) is compared against the conventional crystal puller. In both cases, upper heater UH supplies heat (power is fixed at about 20 kw) to the growing crystal to keep it above the interstitial nucleation temperature range. FIG. 17 shows the temperature field in the heavily insulated novel crystal puller CP. FIG. 18A shows that the heavily insulated novel crystal puller CP keeps a 900 mm long crystal above the nucleation temperature of self-interstitials. It can be seen that the radial variation in $G_{s,f,z}$ for the heavily insulated novel crystal puller CP is greatly minimized (FIG. 18B). However, the absolute value of $G_{s,f,z}$ is very low as a result of increased conduction path. In the novel crystal puller CP, the ratio of rate of heat generation by solidification to the rate of axial heat transfer from the melt M is relatively high. This ratio can be represented by $v/G_{l,f,z}$ (or $v/G_{s,f,z}$) at various radial locations. FIG. 18C shows radial variation of this ratio for the insulated crystal puller and conventional crystal puller. FIG. 18C should not be used for direct comparison between conventional and the heavily insulated novel crystal puller CP.

The upper heater UH helps to maintain the crystal C above the targeted nucleation temperature. Therefore, the upper heater UH is active (operates) for all simulations herein unless otherwise specified.

Figure 19:
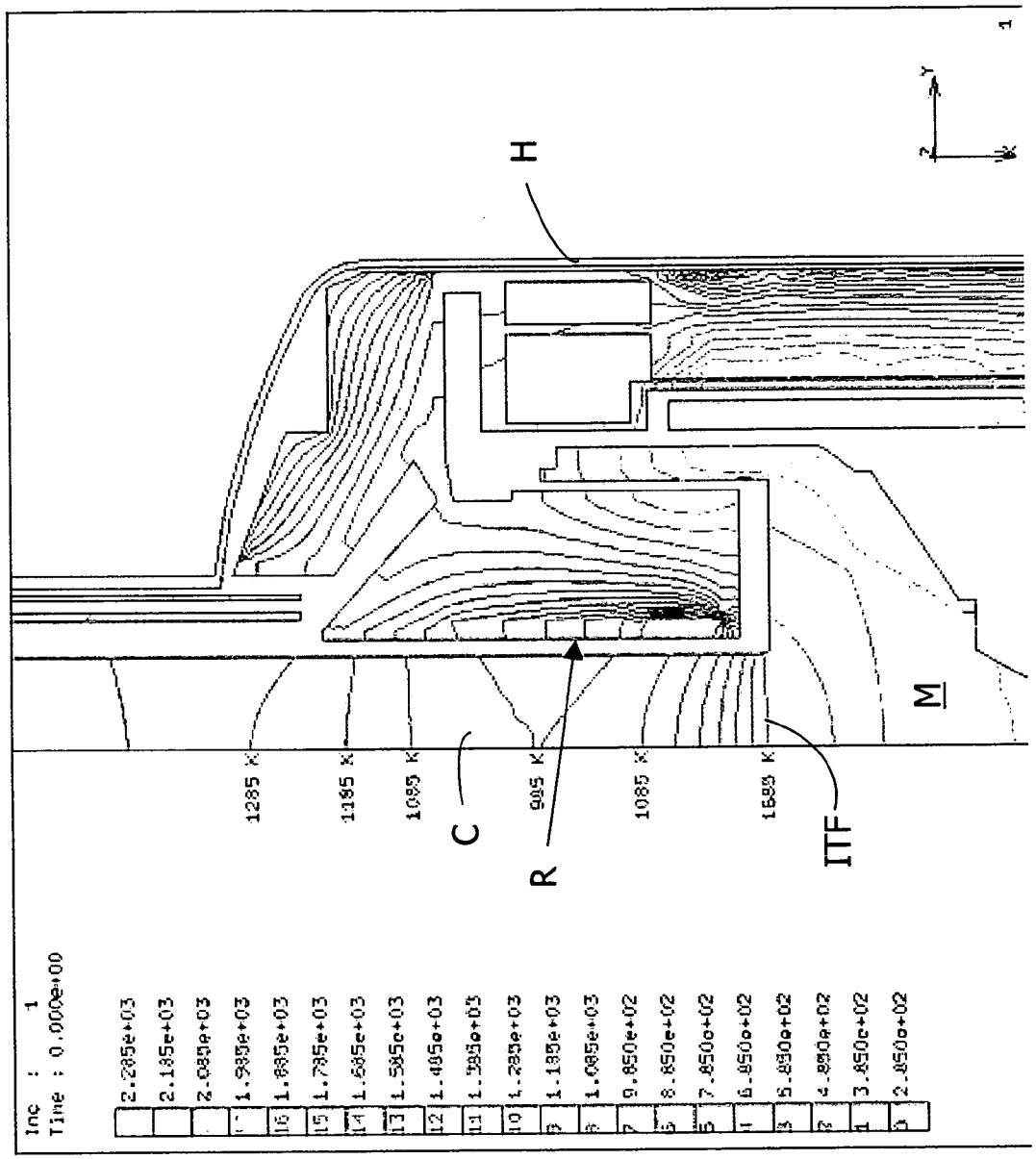
FIG. 19 is a simulated temperature field in the novel crystal puller with active crystal heat exchanger (CHE) and upper heater (UH) and inactive lower heater (LH) and melt heat exchanger (MHE)
Figure 20A:
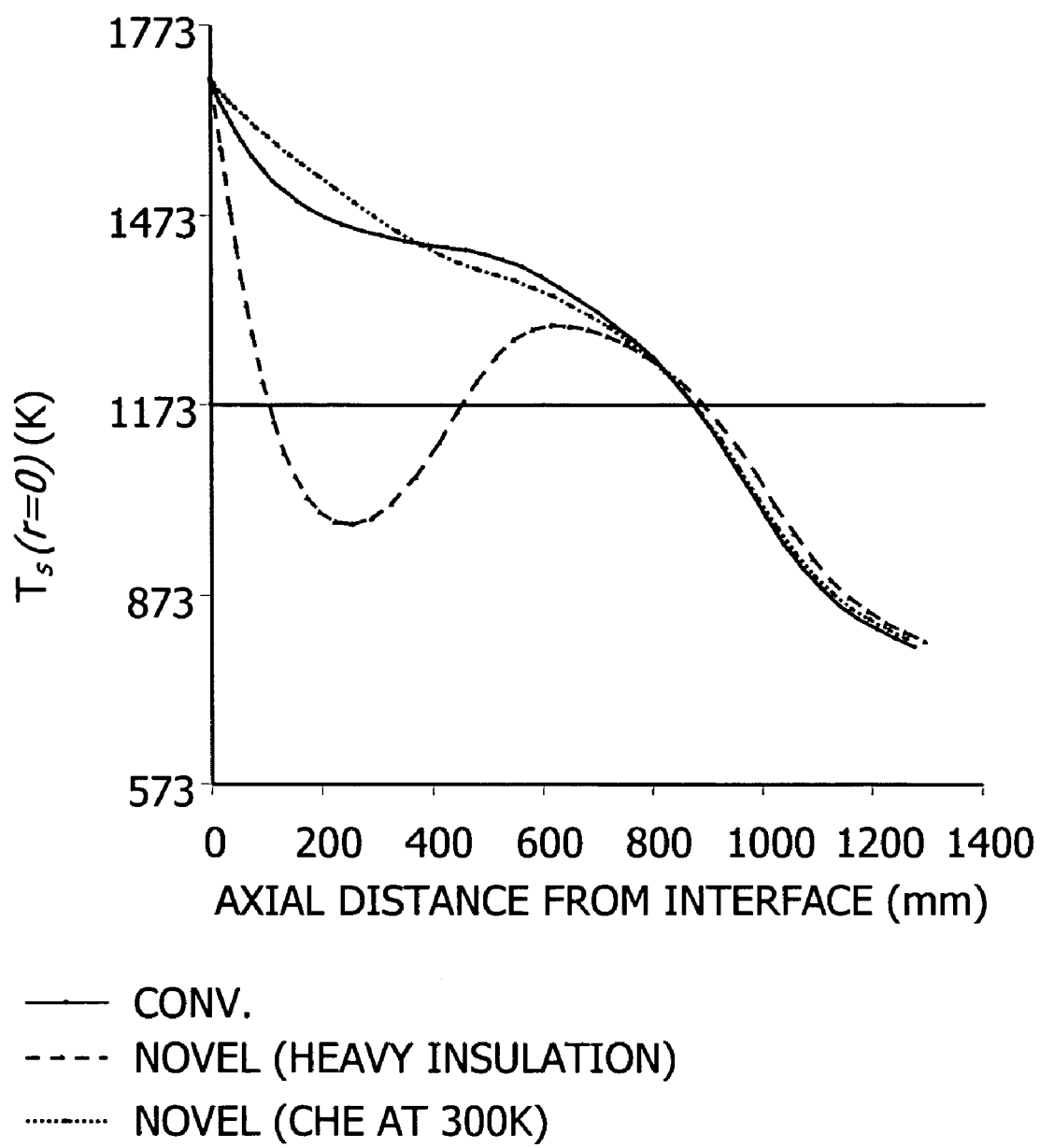
FIG. 20A is a graph comparing the conventional crystal puller, the insulated novel crystal puller with active upper heater (UH), and the novel crystal puller with active crystal heat exchanger (CHE) and upper heater (UH) with respect to axial temperature profiles.
Figure 20B:
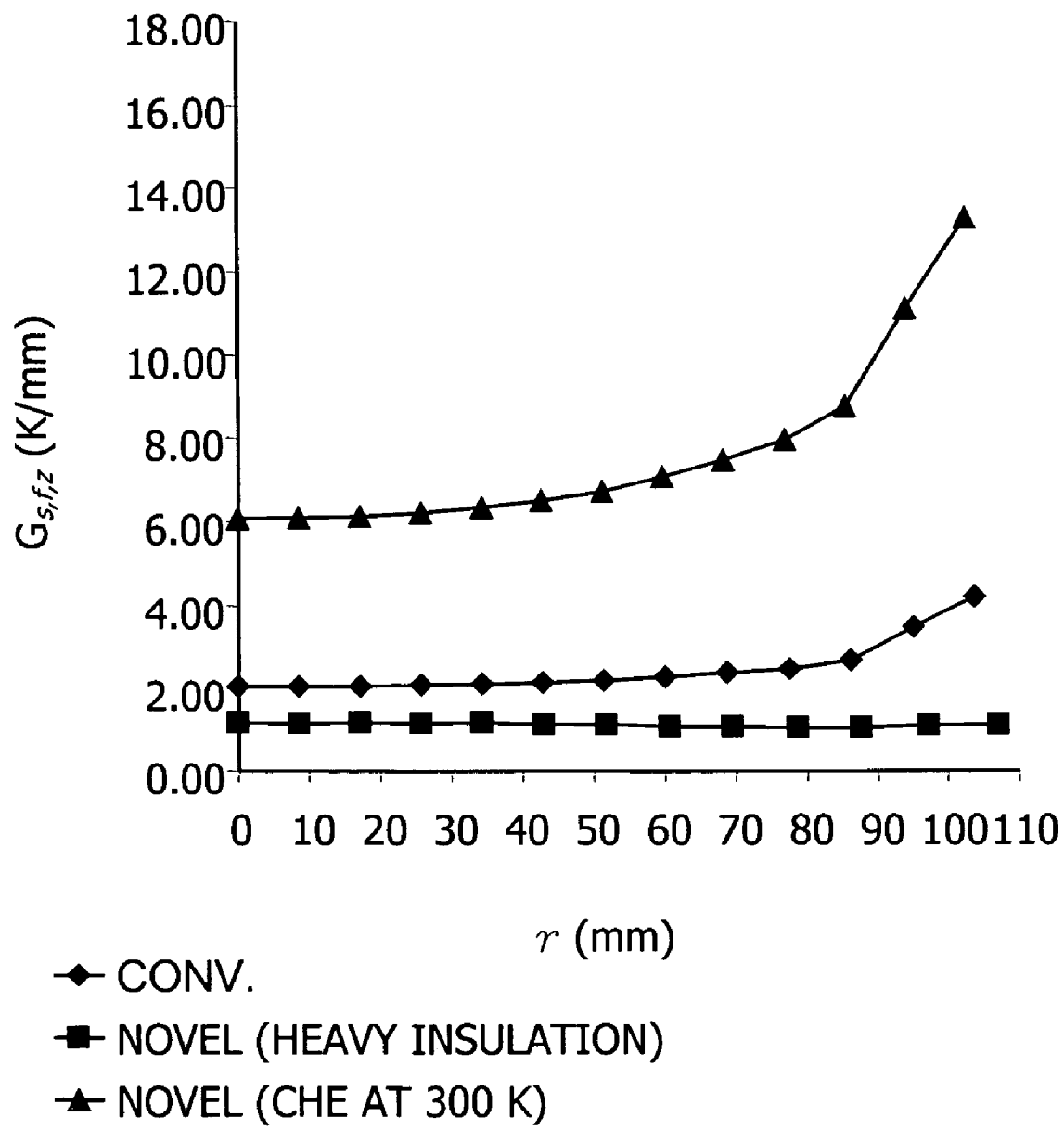
FIG. 20B is a graph showing a comparison between the conventional crystal puller, the insulated novel crystal puller with active upper heater (UH), and the novel crystal puller with active crystal heat exchanger (CHE) and upper heater (UH) with respect to $G_{s,f,z}$.
Figure 20C:
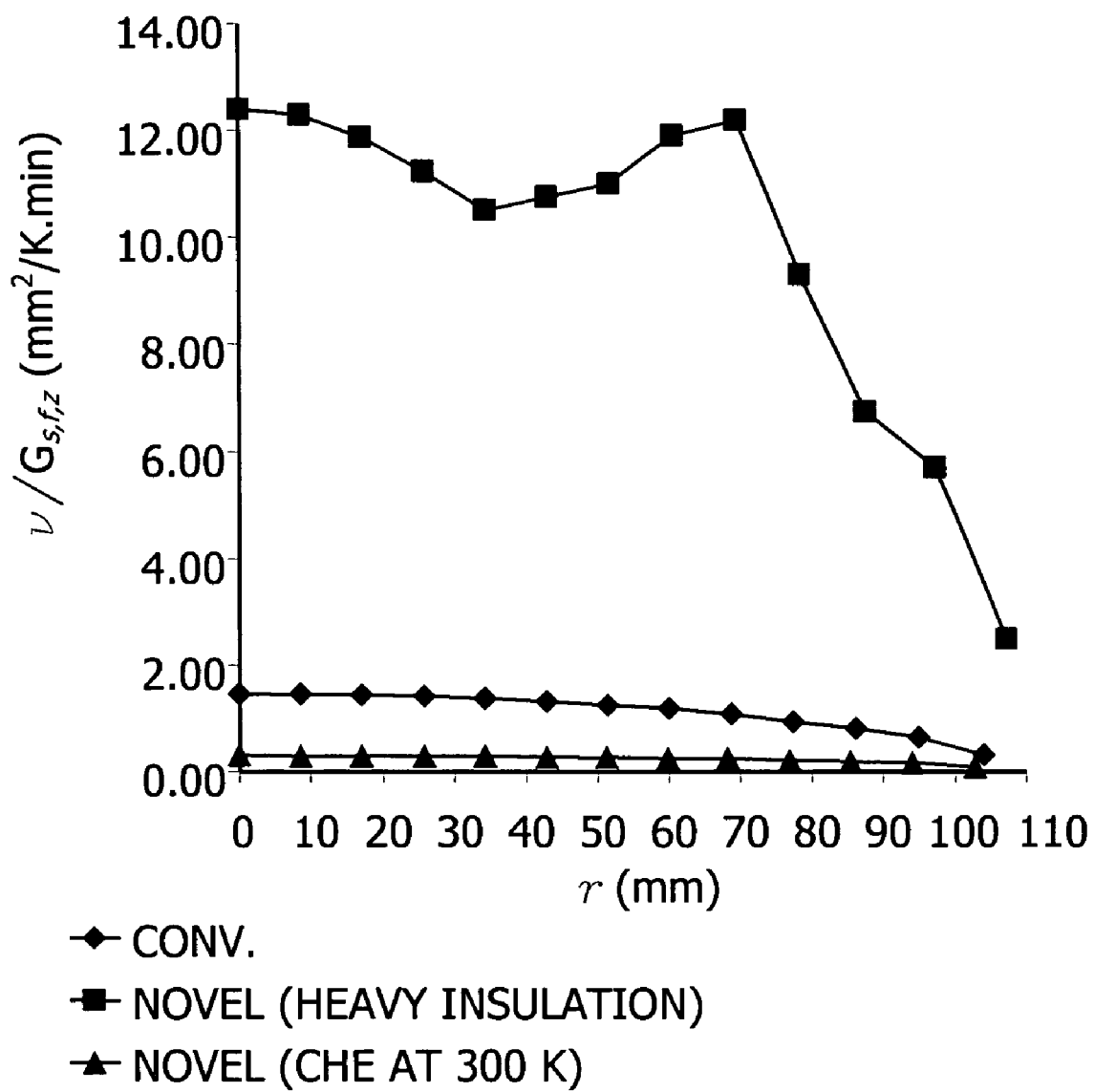
FIG. 20C is a graph of variation in the ratio of $q_{fusion,z}/q_{i,f,z}$ for the conventional crystal puller, the insulated crystal puller with active upper heater (UH), and the novel crystal puller with active crystal heat exchanger (CHE) and upper heater (UH)

The effect of the crystal heat exchanger CHE is studied when the melt heat exchanger MHE and the lower heat exchanger LH are not active. FIG. 19 shows the temperature field in the crystal C grown in the novel crystal puller CP with active crystal heat exchanger CHE and upper heater UH. FIGS. 20A and 20B display axial temperature profile and radial variation of $G_{s,f,z}$, respectively. The crystal C is rapidly cooled in the presence of an active crystal heat exchanger CHE so that in-situ cooling rates around the nucleation temperature can be very high. Pull-rates around 1.1 mm/min, for a target $v/G_{s,f,z}$ (at the interface) equal to 0.134 K·mm²/s can be achieved. However, the radial variation in $G_{s,f,z}$ at the interface is quite significant and a length of the crystal C below nucleation temperature may be reduced to less than 150 mm. The ratio $v/G_{l,fz}$ is very low for this configuration (FIG. 20C). The variation in $G_{s,fz}$ can result in significant variation in the incorporated point defect concentration. The pre-nucleation diffusion-time allowed for a particular crystal-segment to reduce the point defect concentration is also very low as a result of the steep axial temperature profile. The variation may require very high in-situ cooling rates around the nucleation temperature to quench or control the microdefect formation. In many cases, such in-situ cooling rates are not achieved. Therefore, a practical solution for making a defect sensitive crystal for such radial variation in $v/G_{s,fz}$ may involve increasing the pre-nucleation diffusion and annihilation time for point defects by activating the lower heater LH.

Figure 21:
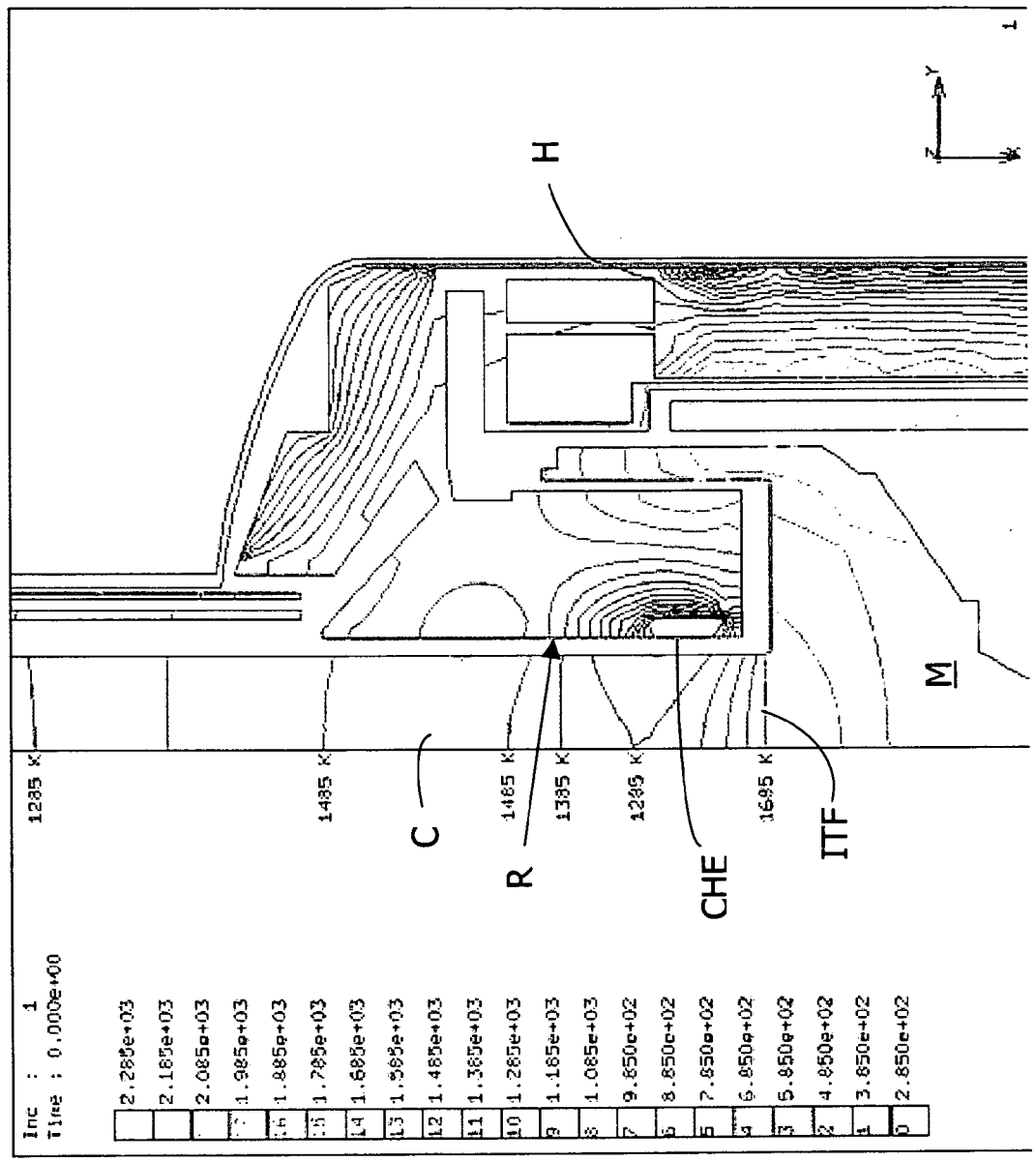
FIG. 21 is a simulated temperature field in the novel crystal puller with active crystal heat exchanger (CHE), lower heater (LH), and upper heater (UH) and with inactive melt heat exchanger (MHE)
Figure 22A:
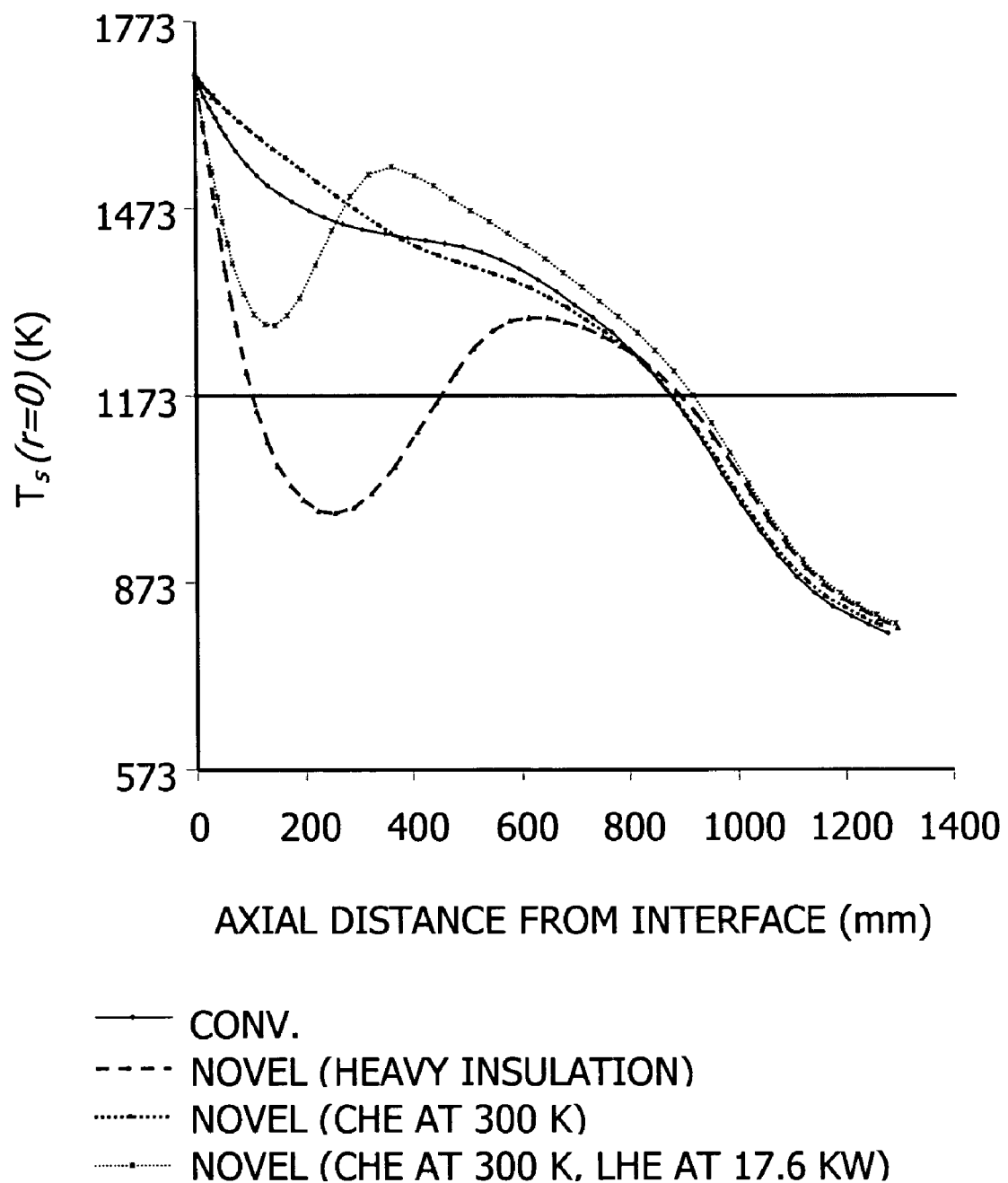
FIG. 22A is a graph comparing the conventional crystal puller, and the various configurations of the novel crystal puller with respect to axial temperature profiles.
Figure 22B:
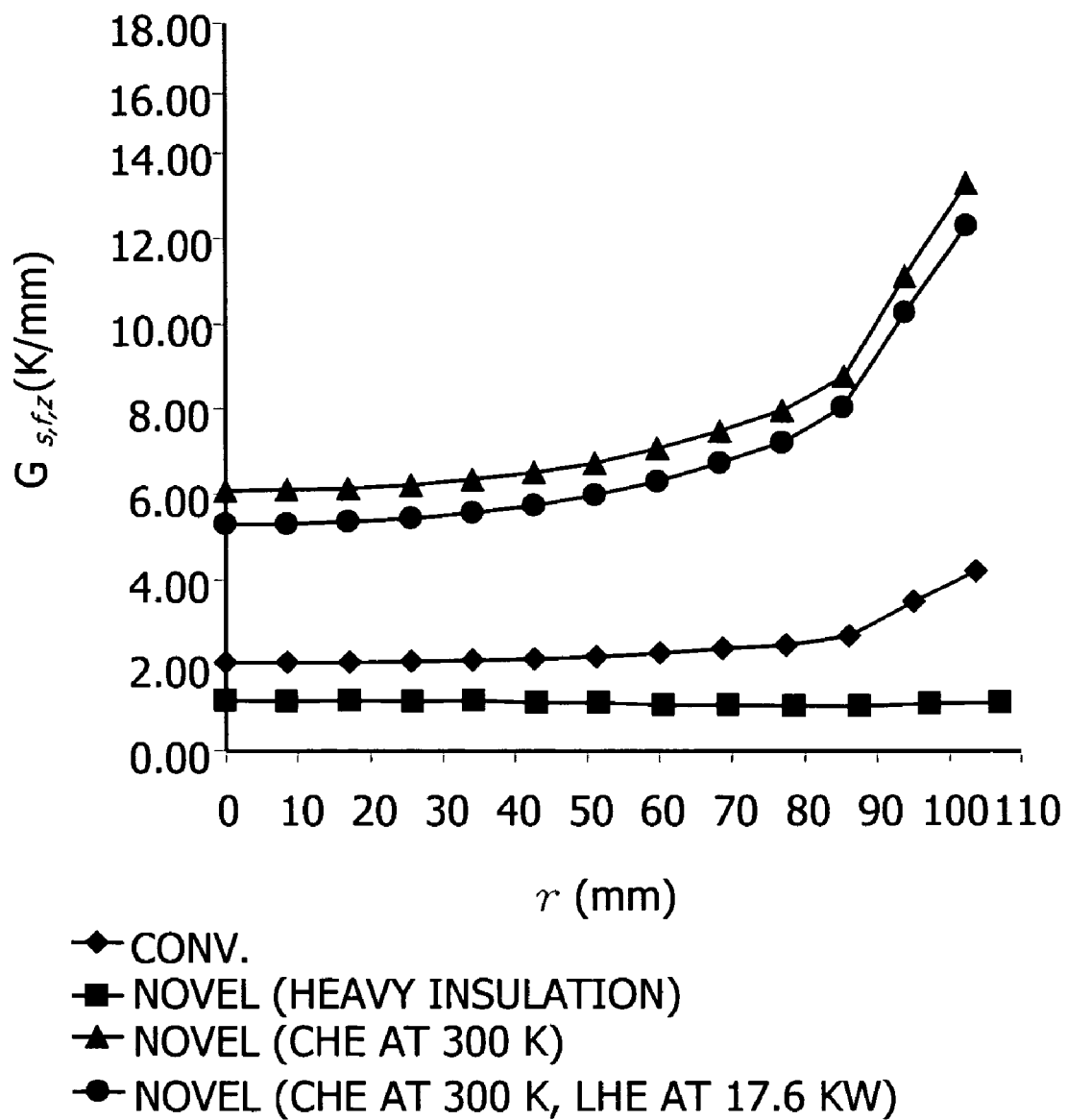
FIG. 22B is a graph comparing the conventional crystal puller, and the various configurations of the novel crystal puller with respect to $G_{s,fz}$.
Figure 22C:
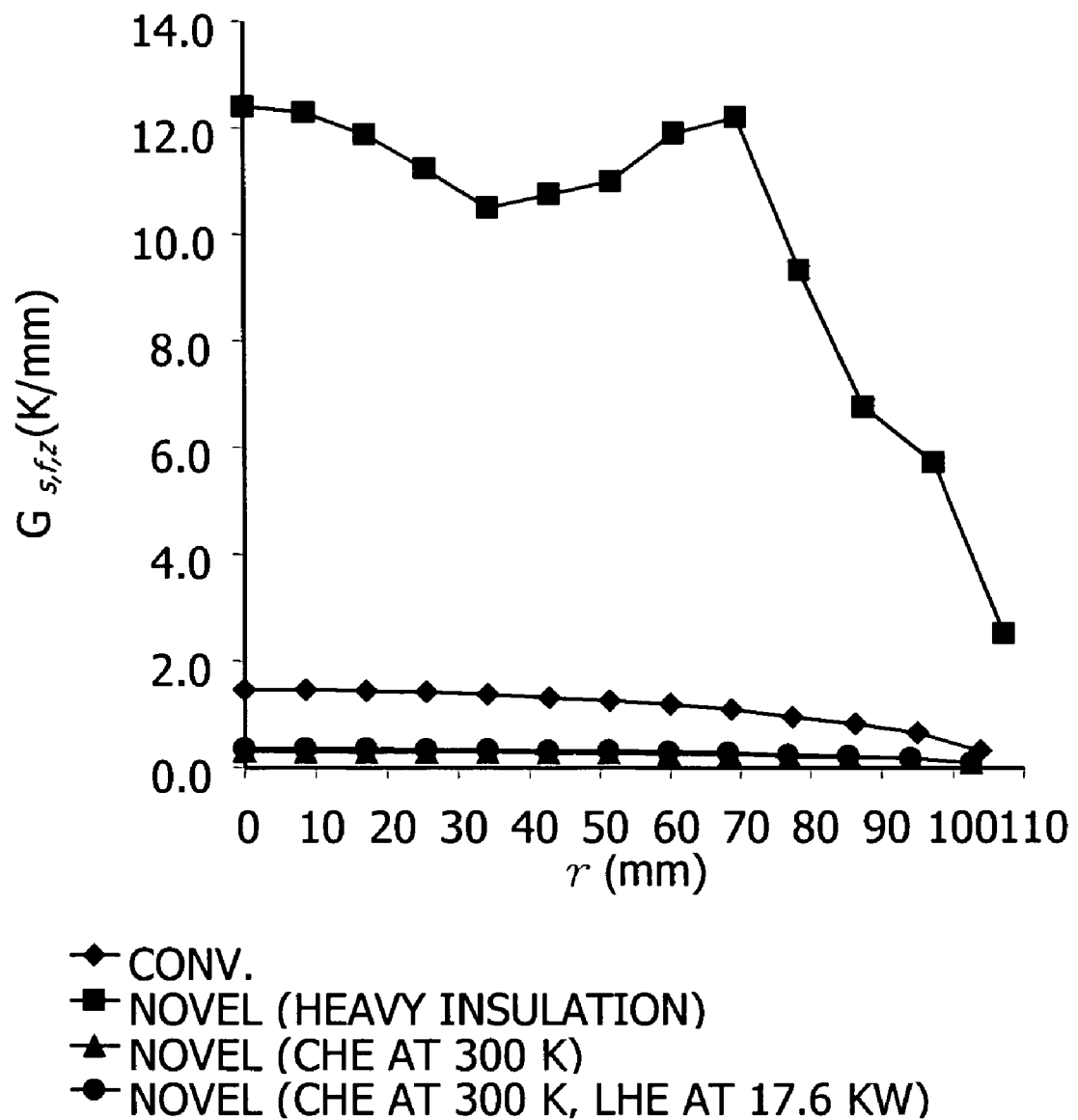
FIG. 22C is a graph of variation in the ratio of $q_{fusion,z}/q_{l,fz}$ for the conventional crystal puller and the various configurations of the novel crystal puller.

The temperature field in the novel crystal puller CP with active crystal heat exchanger CHE and lower heater LH is shown in FIG. 21. FIG. 22A shows the effect of lower heater LH on the axial temperature profile. The length of the crystal C above the interstitial-nucleation temperature is again around 900 mm. Steep axial temperature gradients (FIG. 22B) may allow relatively high pull-rates, e.g., around 1 mm/min, at critical $v/G_{s,fz}$. However, this active crystal heat exchanger CHE and lower heater LH configuration may still suffer from radial variation in $v/G_{s,fz}$. As can be seen from FIG. 22C, the contribution of heat of fusion to $G_{s,fz}$ is quite low compared to the contribution of melt-side conduction, which will be addressed below.

Figure 23A:
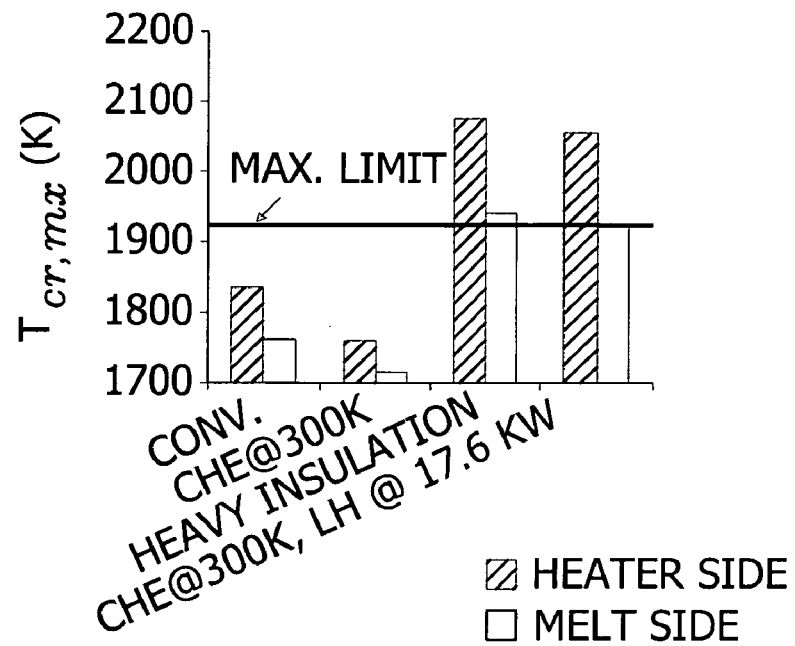
FIGS. 23A-23B are bar graphs of maximum crucible temperatures and side heater powers for different configurations of the conventional crystal puller and the novel crystal puller.
Figure 23B:
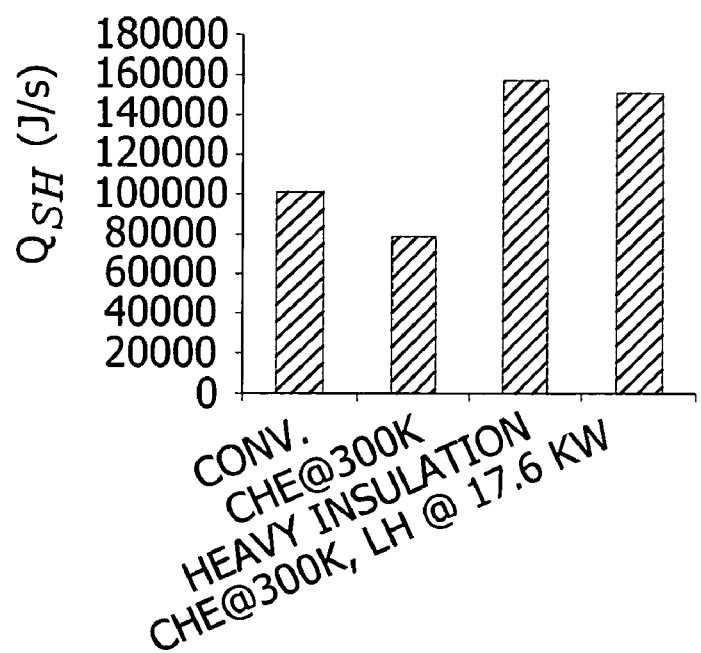
Figure 24A:
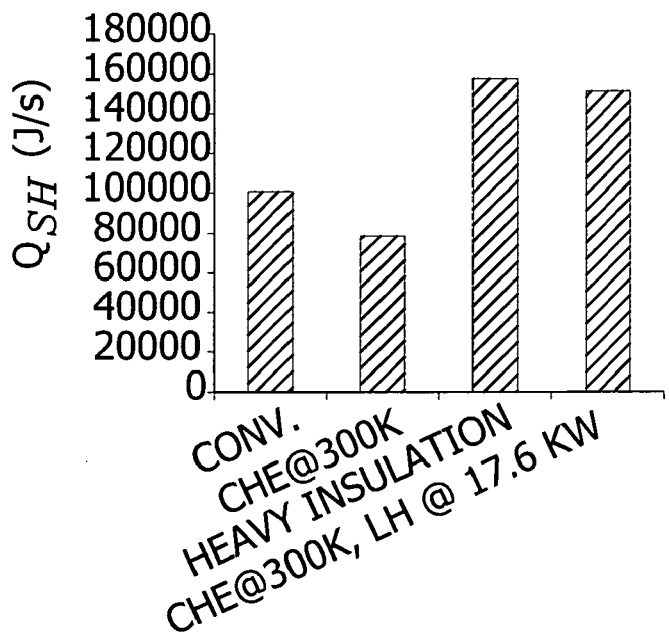
FIGS. 24A-24B are bar graphs of the relationship between the heat loss from the melt surface (in terms of $G_{l,os,z}$) and side heater powers for different configurations of the novel crystal puller.
Figure 24B:
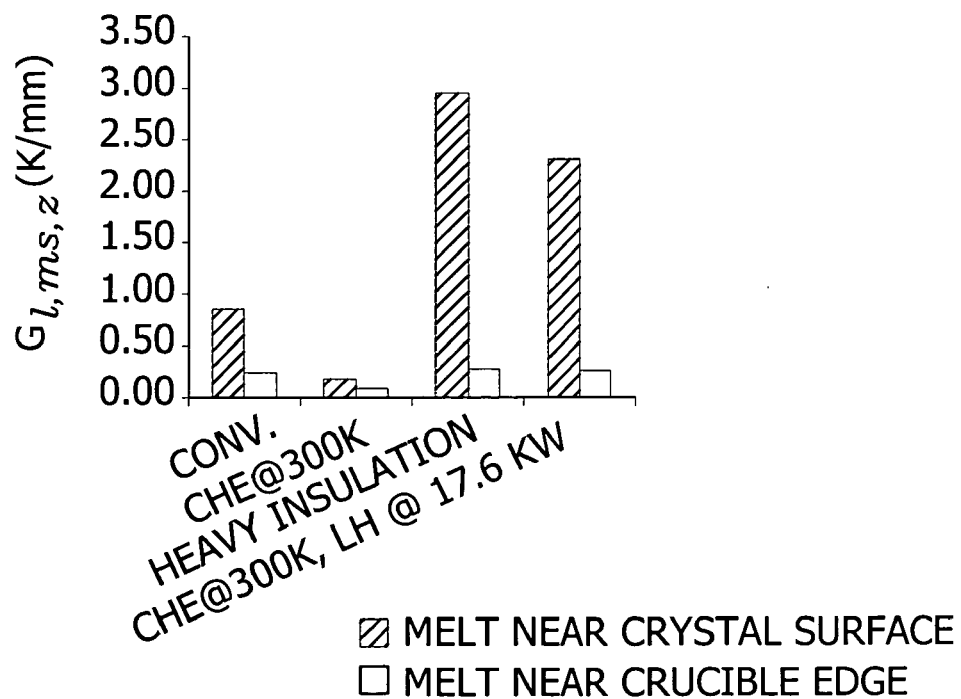
Figure 25:
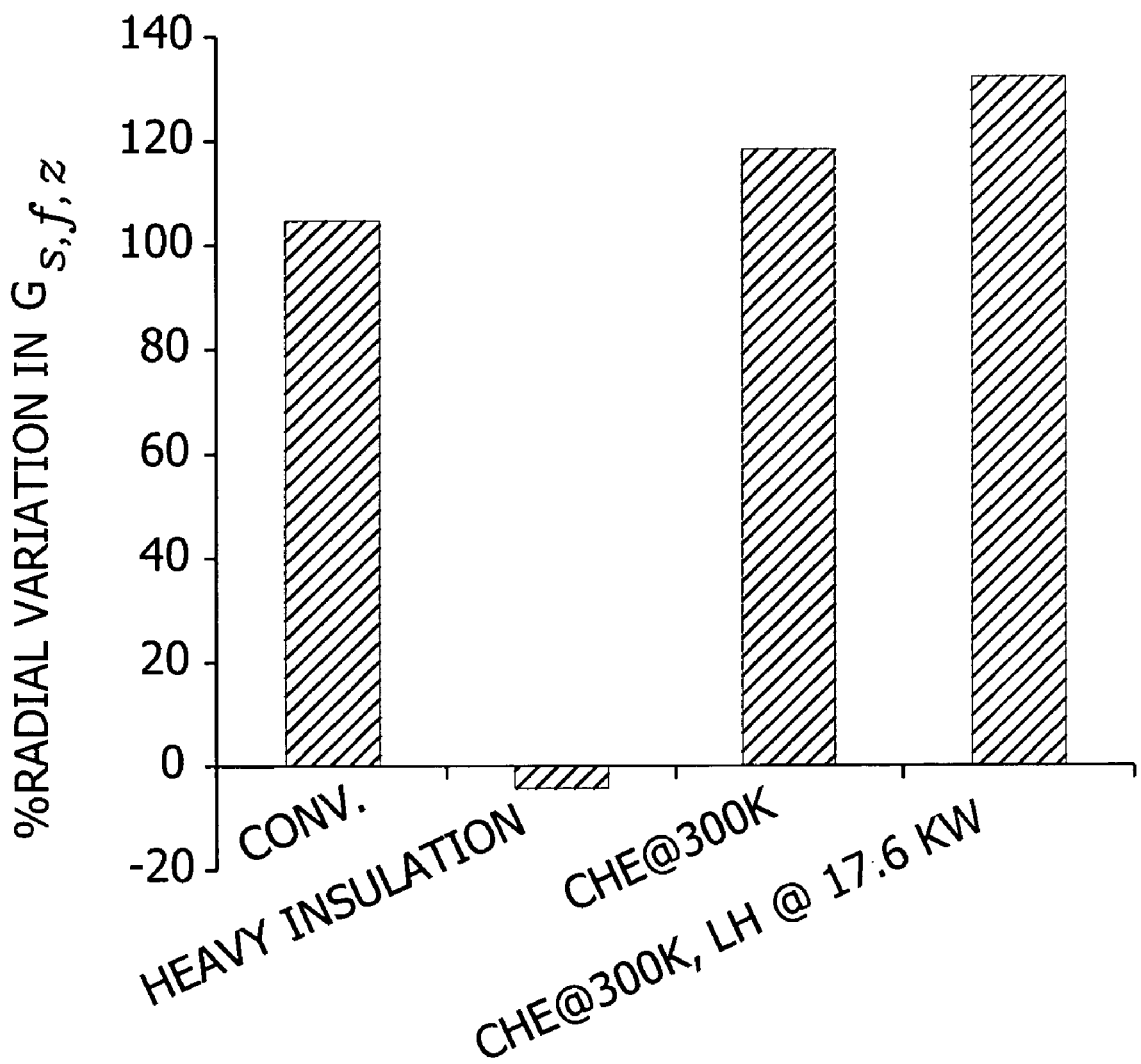
FIG. 25 is a bar graph of radial variation in $G_{s,fz}$ at the interface for various configurations of the novel crystal puller.

In the crystal puller configurations discussed above, there is no active control of the heat-loss (or melt flux) from the open melt surface MS. Therefore, the heat-loss from the melt M is very high, which may render the side heater power and crucible temperatures too high for most practical crystal pulling operations. FIGS. 23A-B show the maximum crucible temperatures $T_{cr,mx}$ and the side heater power $Q_{sh}$ for various configurations. As shown, side heater power ranges from about 80 KJ/s to about 160 KJ/s, though the power may range to as low as 40, or even as low as 0 KJ/s, within the scope of the invention. As can be seen in FIGS. 24A-B, increasing side heater power $Q_{sh}$ causes the heat loss from the open melt surface MS (measured in terms of $G_{l,os,z}$) to increase, as discussed above. Therefore, exposed melt surface flux control is desirable for a practical operation. Also, for the configurations discussed so far, with the exception of the heavily insulated novel crystal puller CP, radial variation of $G_{s,fz}$ is relatively high (FIG. 25). The exposed melt surface flux control is achieved by varying the effective temperature of the environment 'seen' by the melt surface. In the novel crystal puller CP, flux control is accomplished by controlling the melt heat exchanger MHE temperature and thereby the heat flux.

MHE Control

Figure 26:
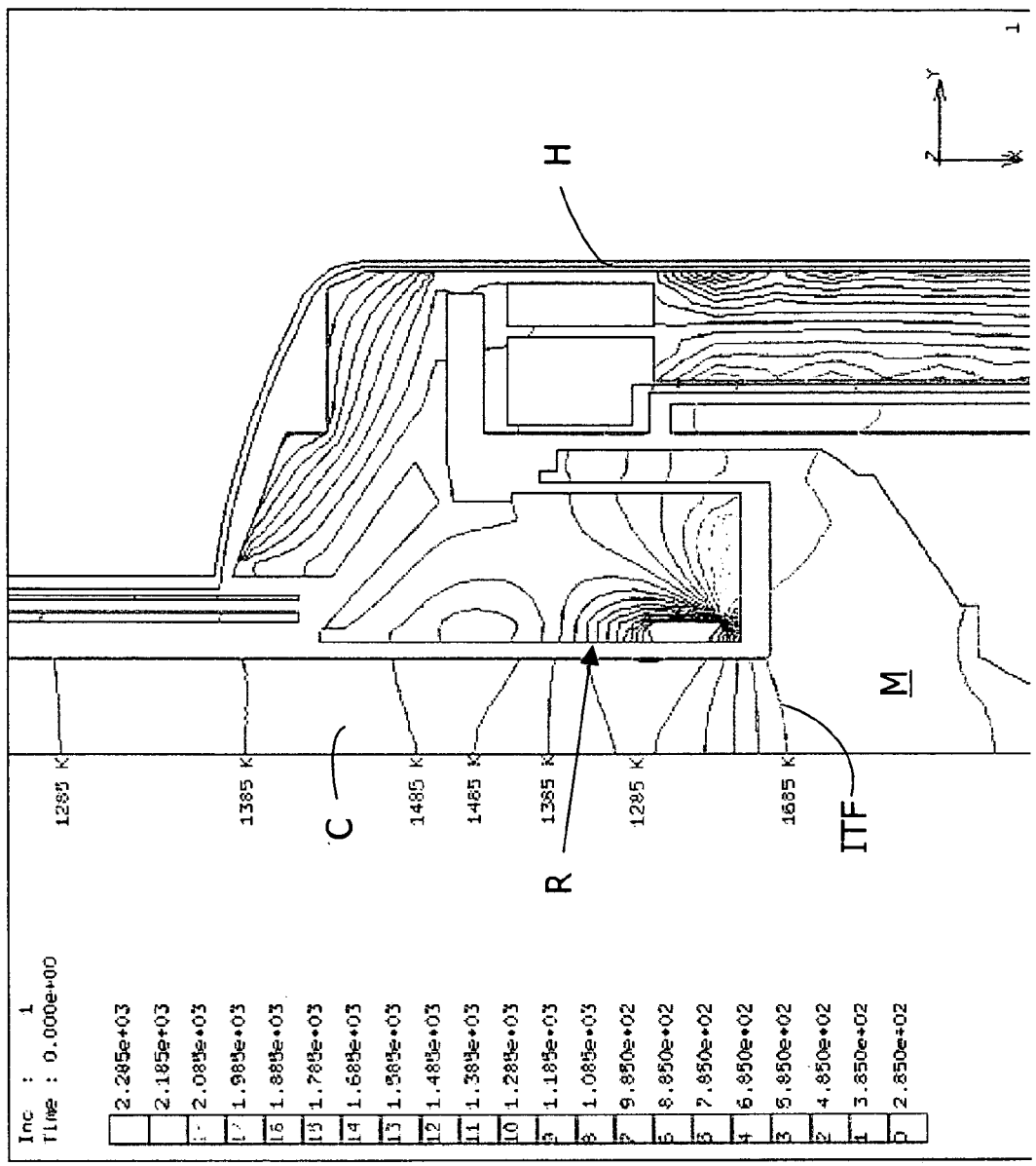
FIG. 26 is a simulated temperature field in the novel crystal puller (active melt heat exchanger (MHE), crystal heat exchanger (CHE), lower heater (LH), and upper heater (UH)) at MHE temperature equal to 2100 K and UH power equal to 20 kW.
Figure 27:
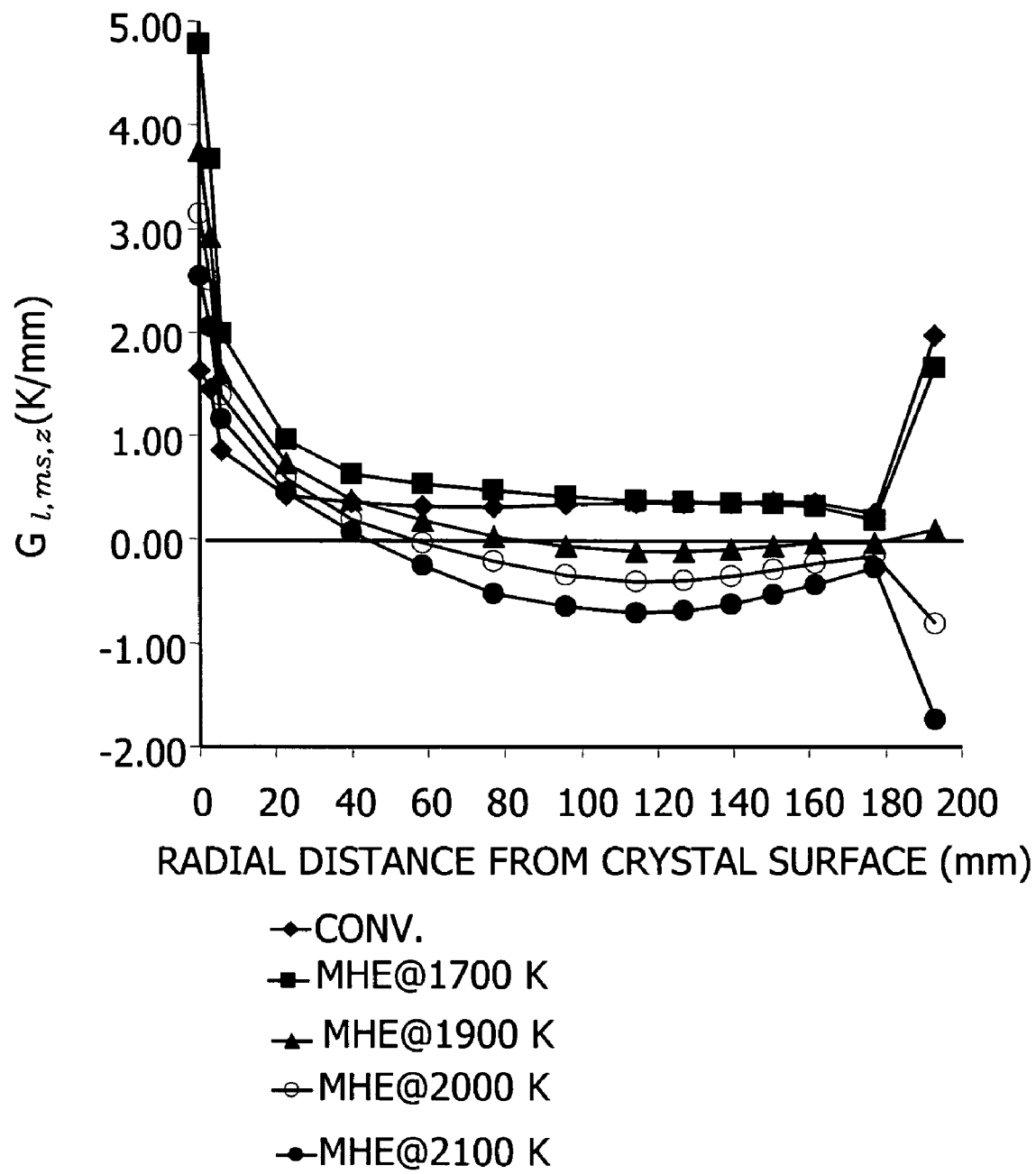
FIG. 27 is a graph of the effect of melt heat exchanger (MHE) temperature on the heat transfer at the open-melt surface for the novel crystal puller (active melt heat exchanger (MHE), crystal heat exchanger (CHE), lower heater (LH), and upper heater (UH))
Figure 28:
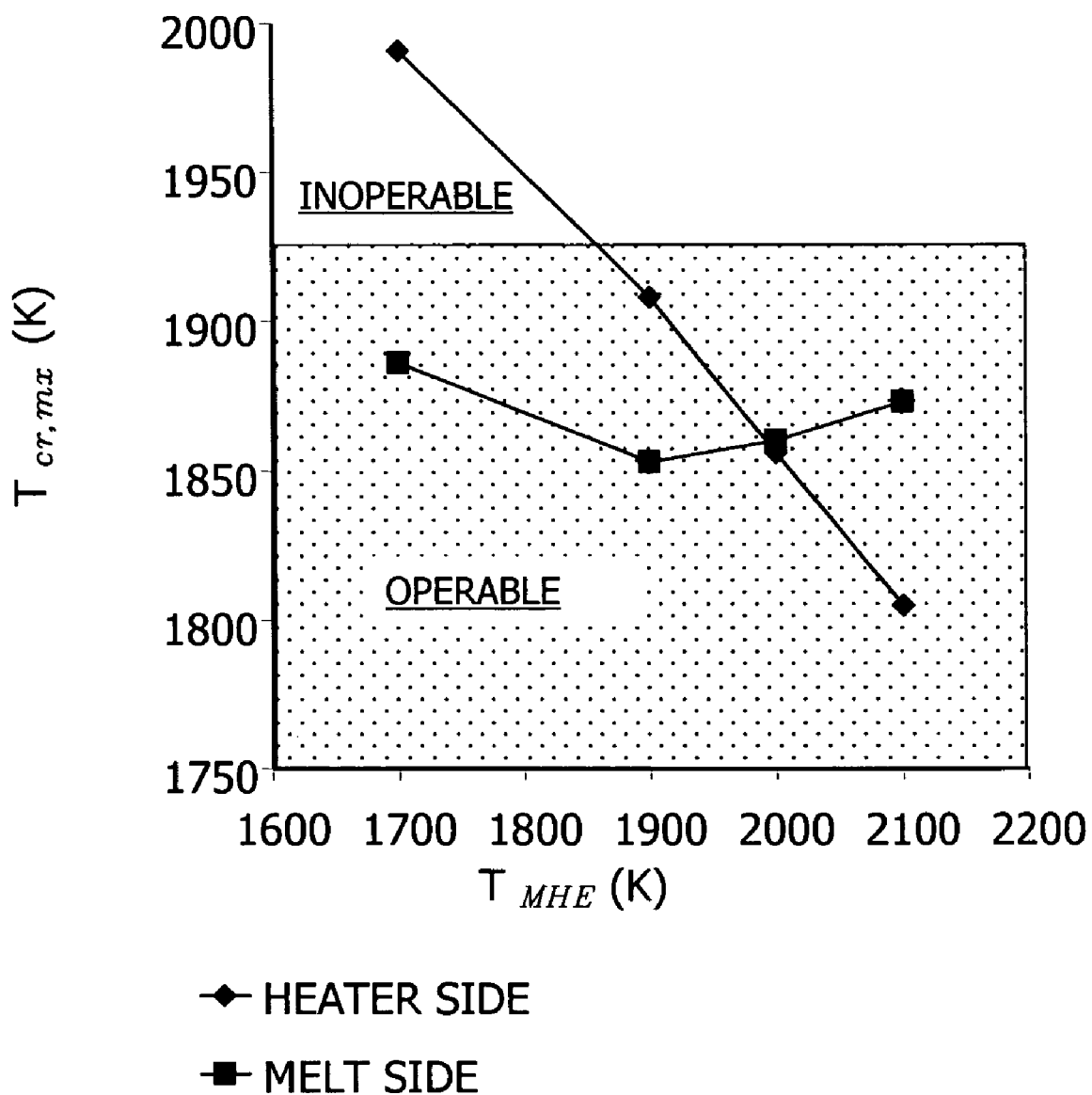
FIG. 28 is a graph of the effect of melt heat exchanger (MHE) temperature on the maximum crucible temperature for the novel crystal puller (active melt heat exchanger (MHE), crystal heat exchanger (CHE), lower heater (LH), and upper heater (UH))
Figure 29:
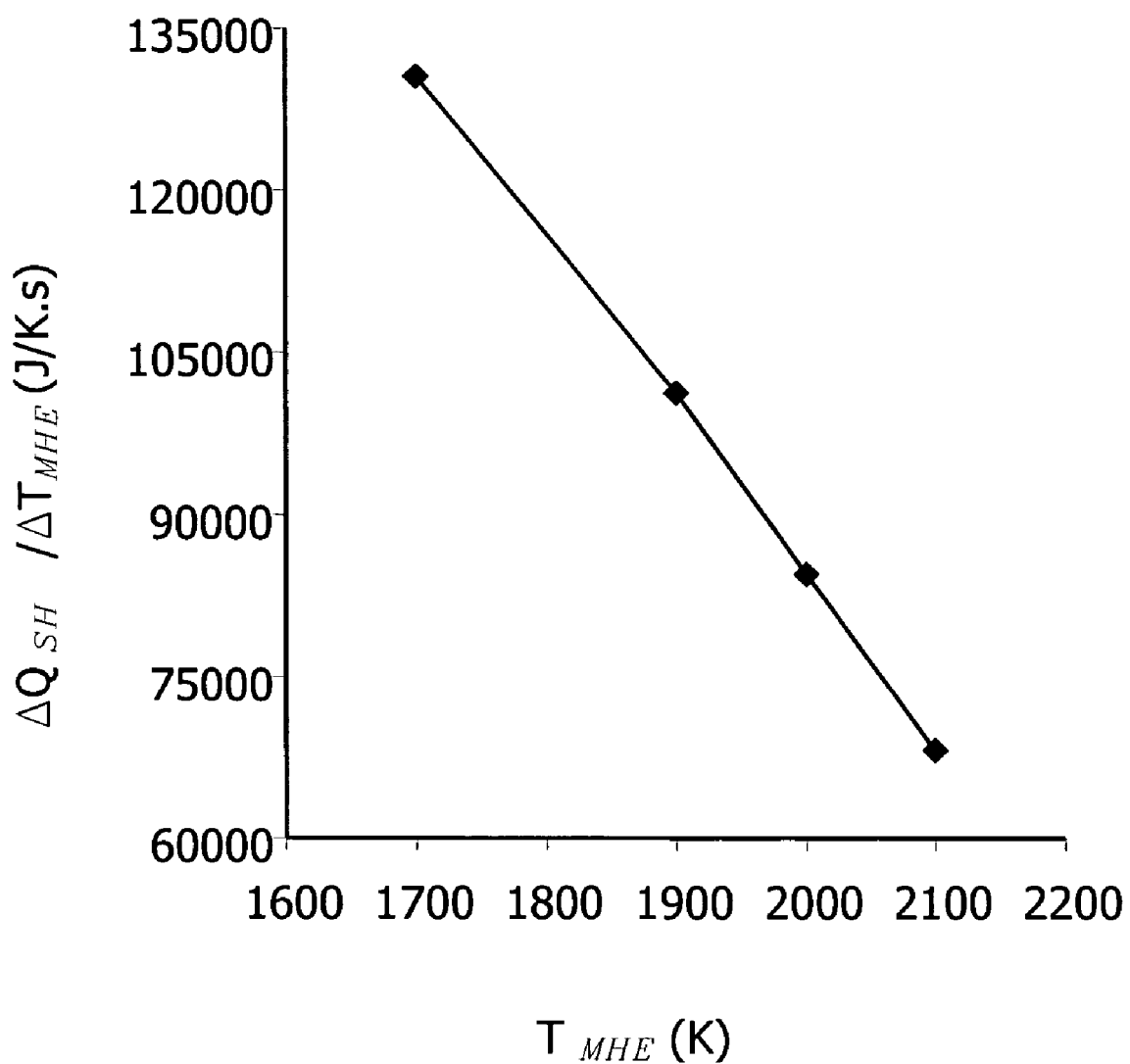
FIG. 29 is a graph of the effect of melt heat exchanger (MHE) temperature on the side heater power in the novel crystal puller (active melt heat exchanger (MHE), crystal heat exchanger (CHE), lower heater (LH), and upper heater (UH))
Figure 30:
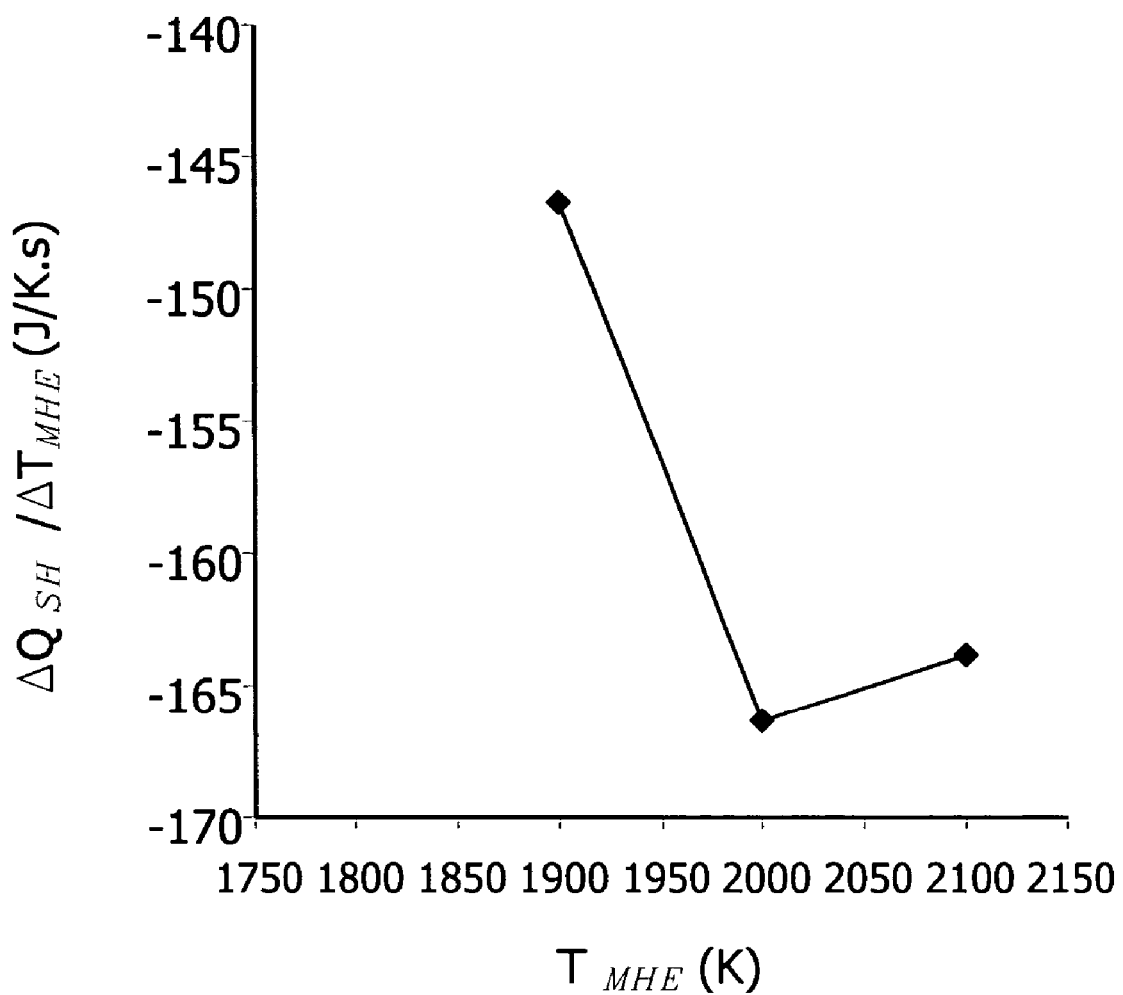
FIG. 30 is a graph of the sensitivity of the side heater power to the melt heat exchanger (MHE) temperature in the novel crystal puller (active melt heat exchanger (MHE), crystal heat exchanger (CHE), and lower heater (LH))
Figure 31A:
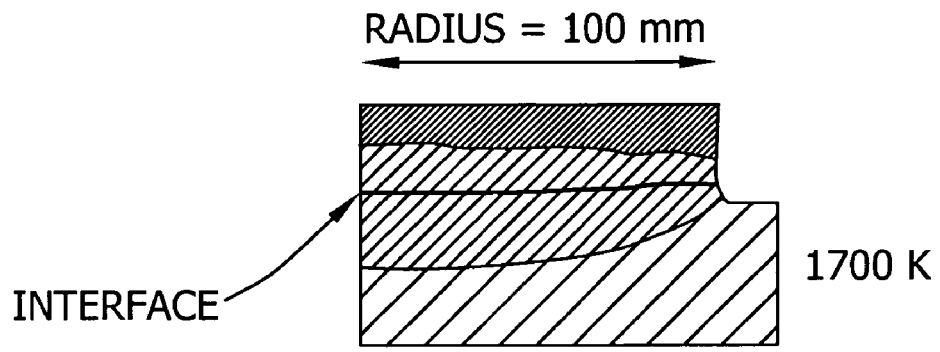
FIGS. 31A-31D are simulated temperature fields showing dependence of the interface shape on the MHE temperature in the novel crystal puller (active melt heat exchanger (MHE), crystal heat exchanger (CHE), lower heater (LH), and upper heater (UH))
Figure 31B:
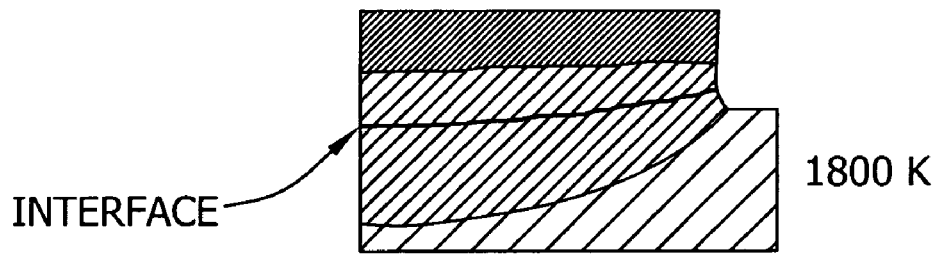
Figure 31C:
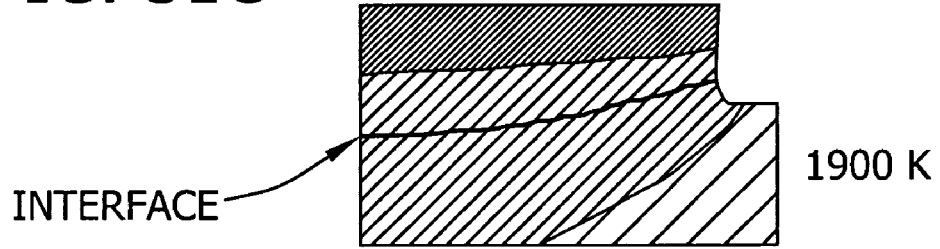
Figure 31D:
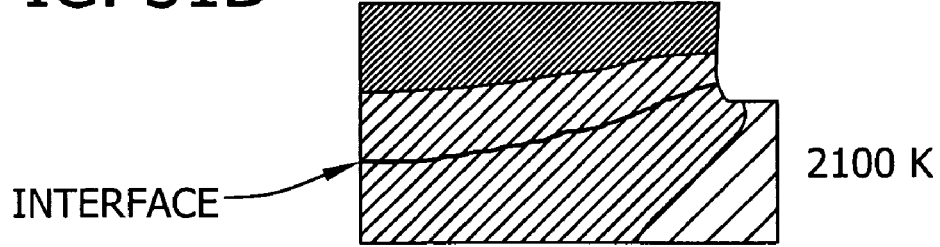

Increasing the temperature of the exposed melt surface MS environment (the environment 'seen' by the melt surface) can decrease the heat-loss from the open melt surface MS. The environmental temperature may be increased by increasing the melt heat exchanger MHE temperature. FIG. 26 shows the temperature field in the novel crystal puller CP with active melt heat exchanger MHE, crystal heat exchanger CHE (fixed at about 300° K), lower heater LH (fixed at about 17.6 kW) and upper heater UH (fixed at about 20 kW (UH is fixed at 20 kW for all simulations unless otherwise noted)) for a fixed MHE temperature of about 2100° K. The effect of varying melt heat exchanger MHE temperature on $G_{l,os,z}$ is shown in FIG. 27. It can be seen that the heat-loss from the melt-surface is effectively suppressed by controlling the melt heat exchanger MHE temperature. As a result, the side heater power and the crucible CR temperatures decrease (FIGS. 28 and 29, respectively). Suppressing the heat-loss from the melt surface MS tends to shift crucible temperatures from the substantially inoperable regime to the substantially operable regime. The crucible temperature at the side facing the heater monotonically decreases with the side heater power. Since the location and the magnitude of the maximum crucible temperature on the melt-side is influenced both by melt heat exchanger MHE temperature and the side heater power, there tends to be no monotonic decrease in the melt-side temperature with increasing MHE temperature. Increasing melt heat exchanger MHE temperature and cooperatively decreasing side heater power have opposite effects on the melt-side crucible temperature. In most cases, melt heat exchanger MHE temperature does not dominate enough to increase the melt-side crucible temperature levels to the inoperable regime. The melt-side crucible temperatures tend to be mainly affected by the combination of the melt heat exchanger MHE temperature and side heater power, and hence, do not vary much. However, the melt-side temperatures are desirably lower than the maximum allowable temperature, and thus, do not pose any problems for crystal C growth. As shown in FIG. 30, increasing the melt heat exchanger MHE temperature enables reduction, e.g., simultaneous reduction, of the side heater power ($Q_{SH}$). In this invention, melt heat exchanger MHE temperature is also increased so as to decrease the crucible CR temperature during crystal C growth. Care should be taken not to increase the melt heat exchanger MHE temperature beyond the maximum allowable temperature at which melt-side crucible temperatures become too high for most practical operations.

Figure 32:
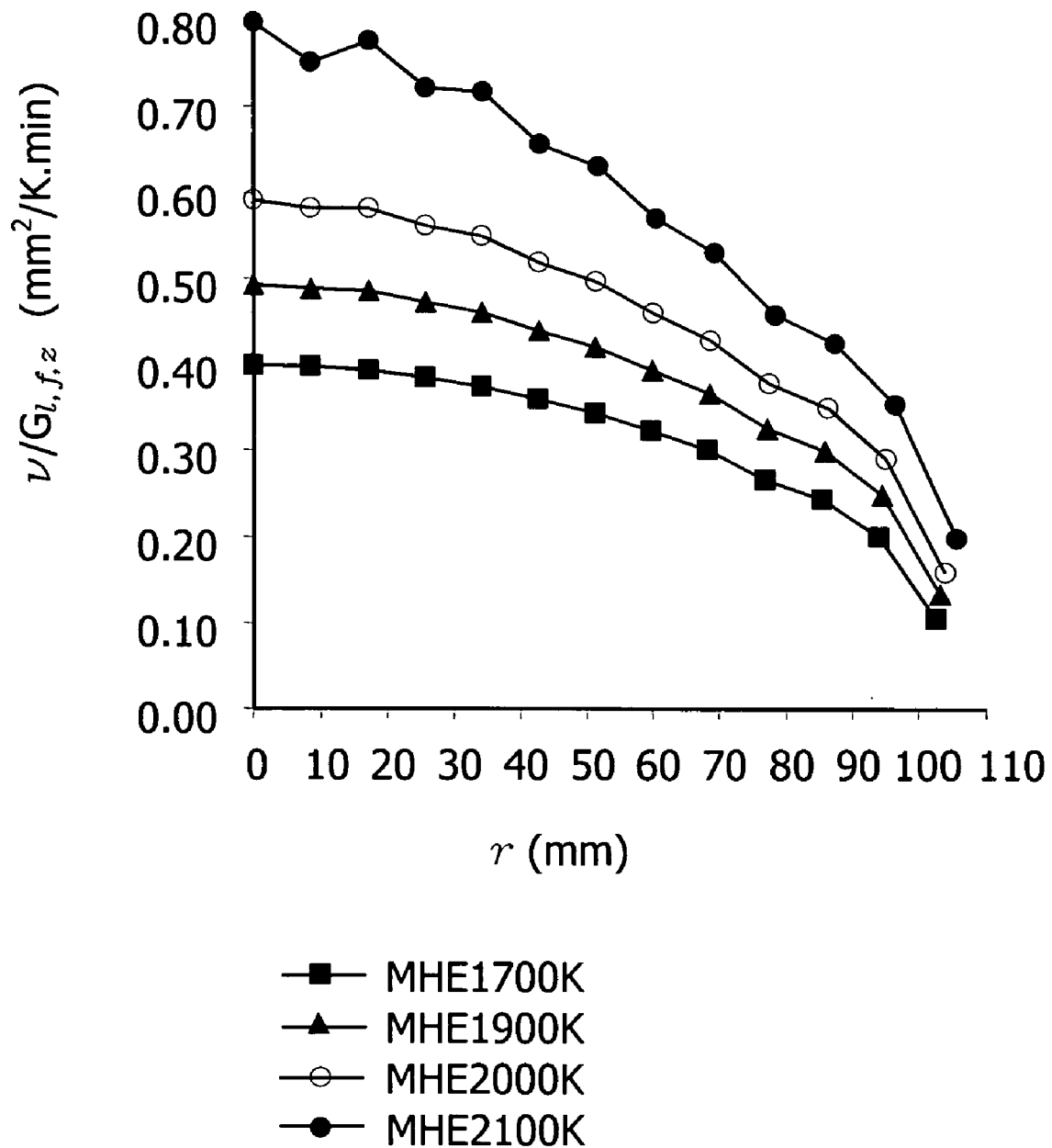
FIG. 32 is a graph of the decreasing $v/G_{l,fz}$ with increasing melt heat exchanger (MHE) temperature in the novel crystal puller (active melt heat exchanger (MHE), crystal heat exchanger (CHE), lower heater (LH), and upper heater (UH))
Figure 33A:
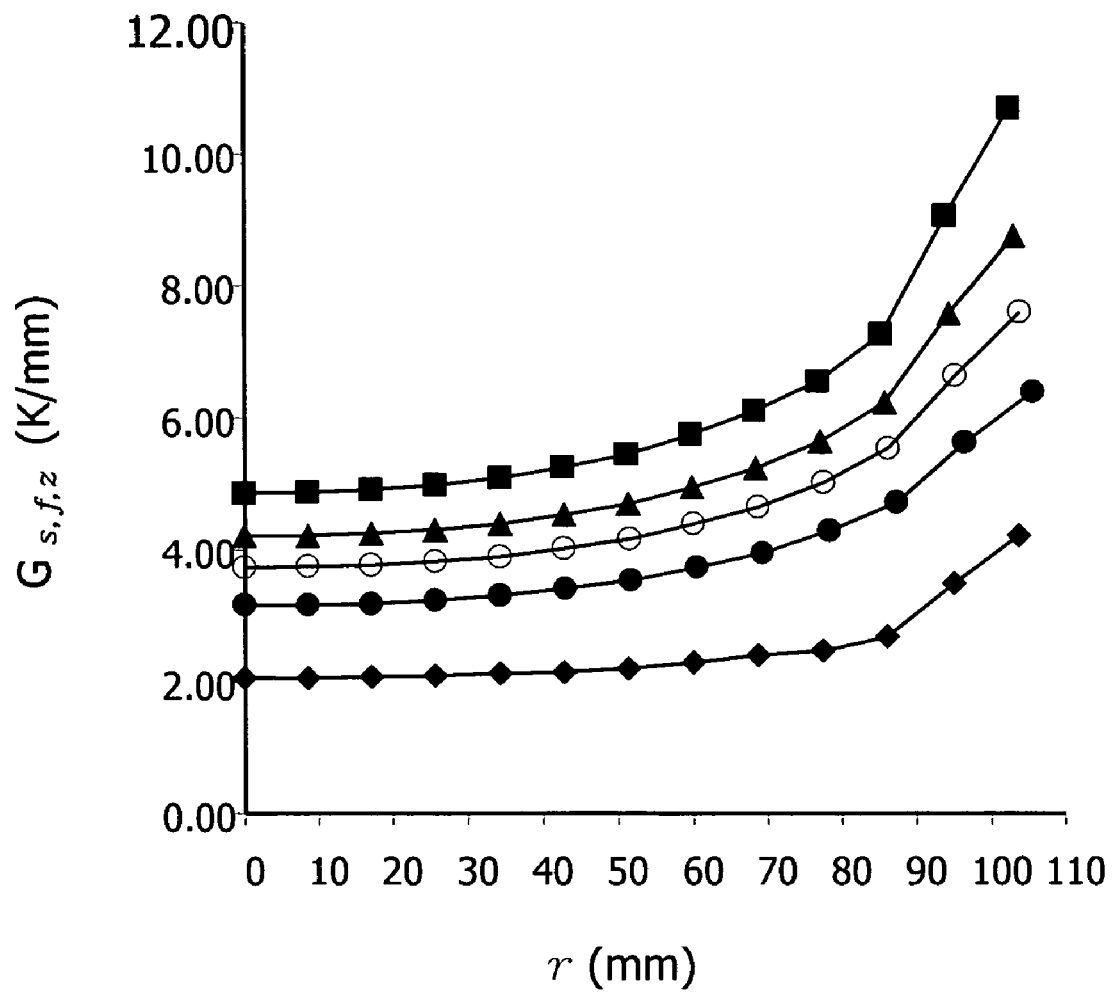
FIG. 33A is a graph of the effect of melt heat exchanger (MHE) temperature on $G_{s,fz}$ at the interface in a crystal grown in the novel crystal puller (active melt heat exchanger (MHE), crystal heat exchanger (CHE), lower heater (LH), and upper heater (UH))
Figure 33B:
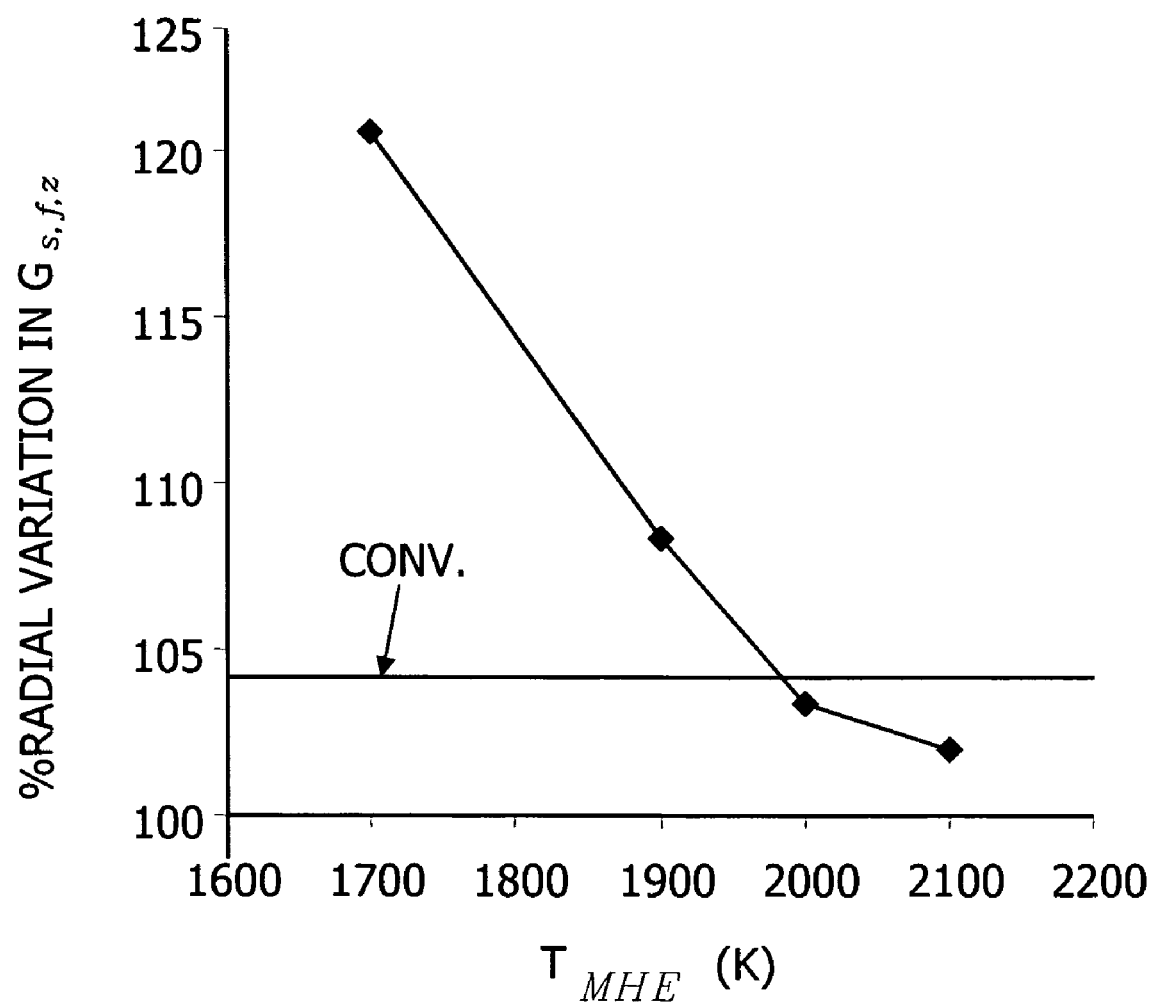
FIG. 33B is a graph of the radial variation in $G_{s,fz}$ in the novel crystal puller (active melt heat exchanger (MHE), crystal heat exchanger (CHE), lower heater (LH), and upper heater (UH))
Figure 33C:
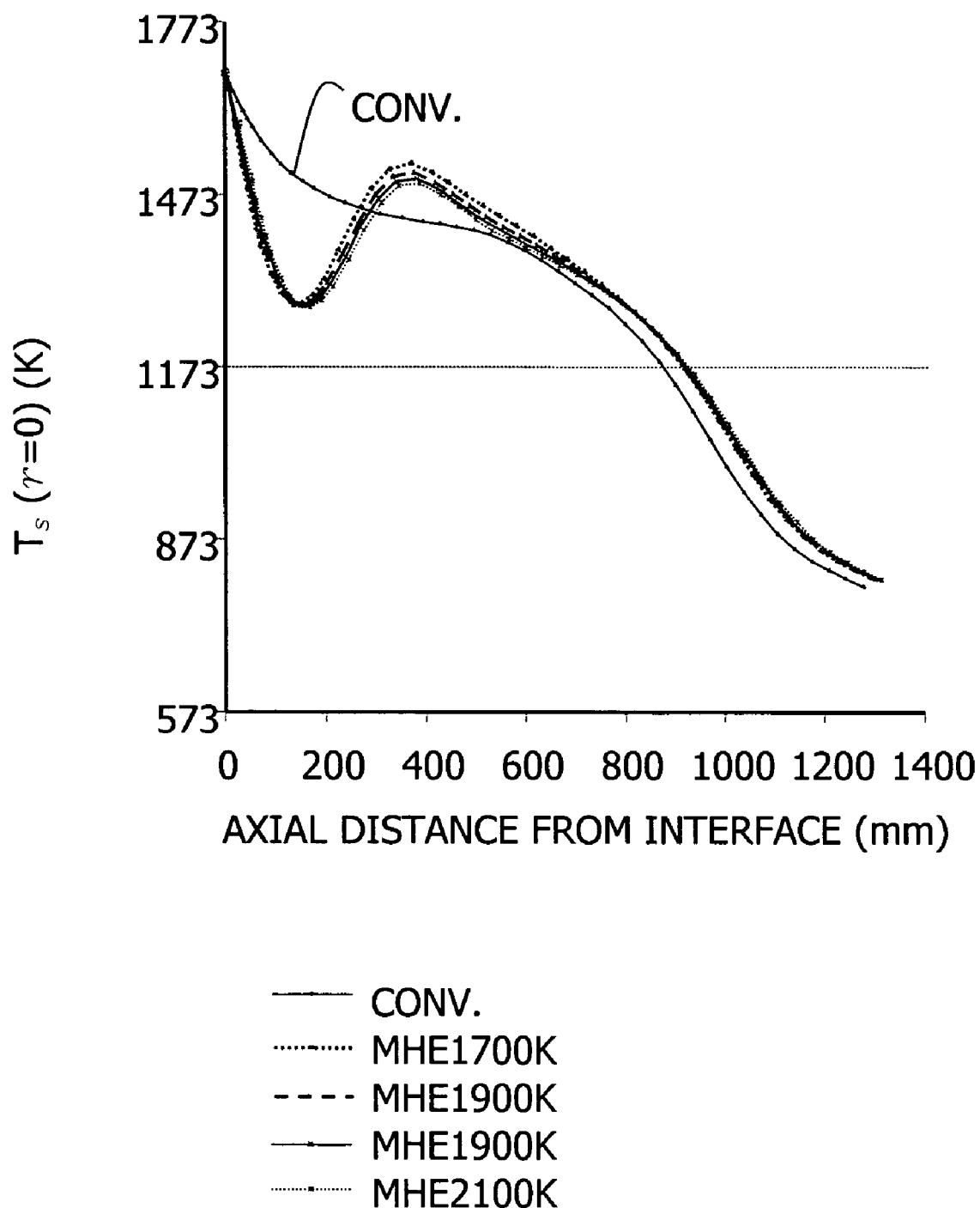
FIG. 33C is a graph of the axial temperature profiles in a crystal grown in the novel crystal puller (active melt heat exchanger (MHE), crystal heat exchanger (CHE), lower heater (LH), and upper heater (UH)) at various MHE temperatures.

FIGS. 31A-D show the change in the interface shape with increasing melt heat exchanger MHE temperature, the lower heater LH power being fixed at about 17.6 kW, the crystal heat exchanger CHE temperature fixed at about 300° K and the upper heater UH power fixed at 20 kW. As the melt heat exchanger MHE temperature increases, the side heater power required to maintain the melt M at temperature decreases. Simultaneously, the melt crystal interface moves downward to cause an increase in the radial heat flux in the crystal C closer to the surface, but without significantly increasing the axial flux. In addition, except near the crystal-edge, the radial uniformity of the melt-side axial heat-flux improves with increasing melt heat exchanger MHE temperature. Thus the radial uniformity or the variation of $G_{s,fz}$ is controlled by controlling the interface shape. As the melt M becomes colder below the interface with increasing melt heat exchanger MHE power and decreasing side heater power, the axial heat-flux from the melt M into the crystal C decreases. FIG. 32 shows decreasing contribution of the axial heat-flux $v/G_{l,fz}$ from the melt-side with increasing melt heat exchanger MHE temperature. As noted above, the radial uniformity of the melt-side axial heat-flux improves with increasing melt heat exchanger MHE temperature, which increases the ratio of the heat flux by fusion to the melt-side axial heat flux and contributes to the improvement in the radial uniformity of $G_{s,fz}$. FIG. 33A compares the effect of changing melt heat exchanger MHE temperatures on $G_{s,fz}$. Note that there is some heat leak from melt heat exchanger MHE to the crystal C. However, the net effect is that the radial uniformity and magnitude of $G_{s,fz}(r)$ in the crystal C increase (FIG. 33B). Increasing melt heat exchanger MHE temperature compensates for the radial non-uniformity which tends to be introduced by the crystal heat exchanger CHE. When melt heat exchanger MHE temperature is at least about 1950° K, the radial uniformity of $G_{s,fz}$ for the novel crystal puller CP with active (operating) melt heat exchanger MHE, crystal heat exchanger CHE, lower heater LH and upper heater UH is better than it is for the conventional puller. Use of this novel crystal puller CP also allows higher G and therefore allows higher pull-rates at the same or similar $v/G_{s,fz}$. The axial temperature profiles in a crystal C as a function of changing melt heat exchanger MHE temperatures are shown in FIG. 33C. One of the objectives of designing the novel crystal puller CP (active melt heat exchanger MHE, crystal heat exchanger CHE, lower heater LH and upper heater UH) is to control the thermal history of crystal segments irrespective of the MHE effect. As can be observed from FIG. 33C, the melt heat exchanger MHE temperature tends to have a minor effect on the thermal history.

Manipulating the melt heat exchanger MHE power, rather than MHE temperature, can also change the effective temperature of the environment of the melt-surface. In fact, in practice it is much easier to control power than the temperature. Therefore, in the following sections some of the examples based on varying the effective melt heat exchanger MHE power are discussed.

EXAMPLE

Perfect and Semi-Perfect Silicon

Use of the novel crystal puller CP with active melt heat exchanger MHE, crystal heat exchanger CHE, lower heater LH and upper heater UH enables maintenance of $v/G_{s,fz}(r)$ closer to its critical value while providing sufficient diffusion and annihilation time for point defects before significant nucleation (broadly, formation and growth) of the relevant species takes place. The novel crystal puller CP also can achieve higher productivity than what is achievable in the conventional crystal puller. The melt-flux control may be achieved by manipulation or control of the melt heat exchanger MHE power/temperature. Also, the magnitude of $G_{s,fz}$ at the interface may be controlled by manipulation and control of the crystal heat exchanger CHE. The prolonged diffusion and annihilation time above interstitial nucleation temperature range may be provided by manipulation and control of the lower heater LH and the upper heater UH.

Fixed MHE POWER

Figure 34:
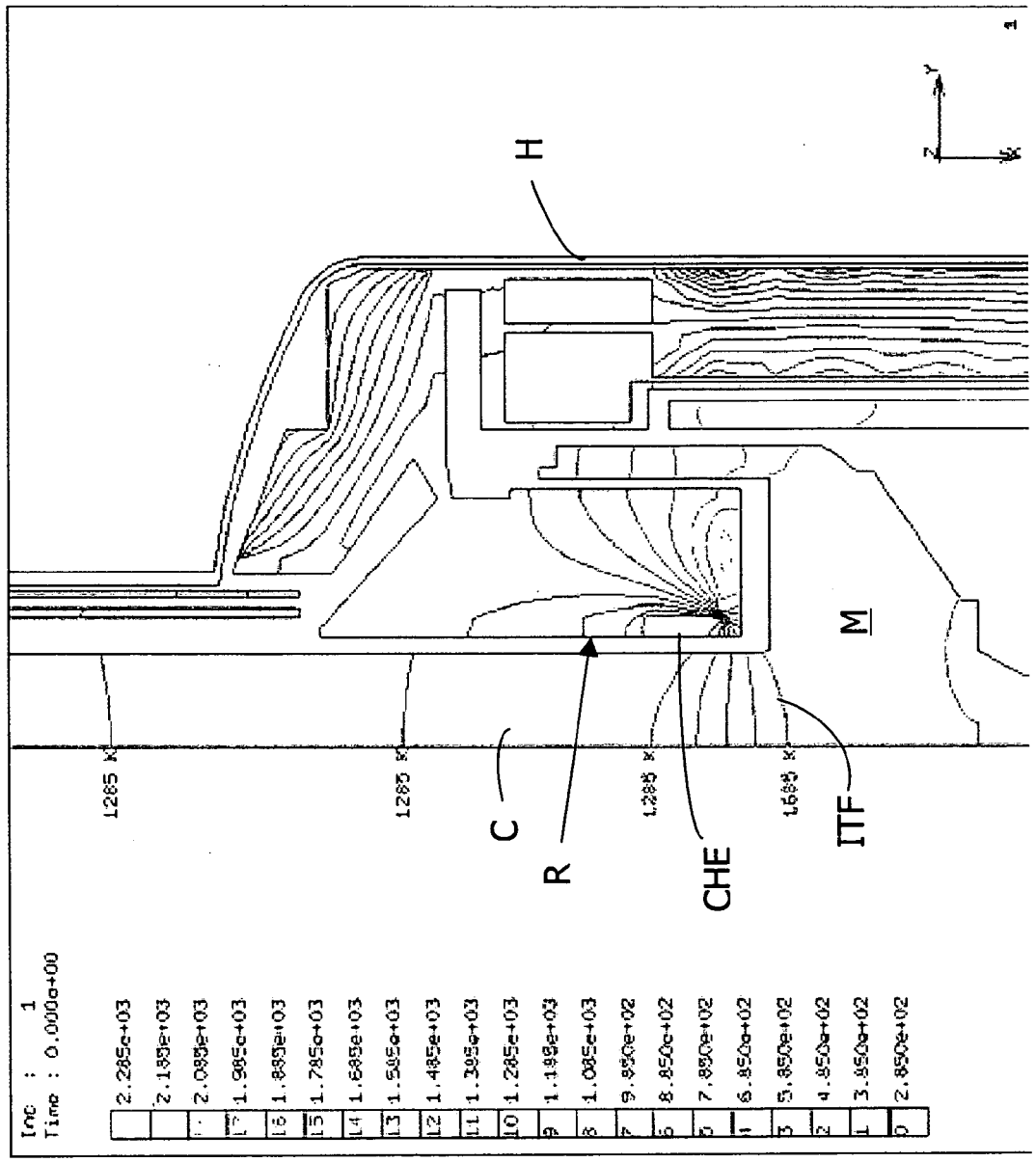
FIG. 34 is a simulated temperature field in the novel crystal puller (active melt heat exchanger (MHE), crystal heat exchanger (CHE), lower heater (LH), and upper heater (UH)) at MHE power equal to about 27.02 kW.
Figure 35:
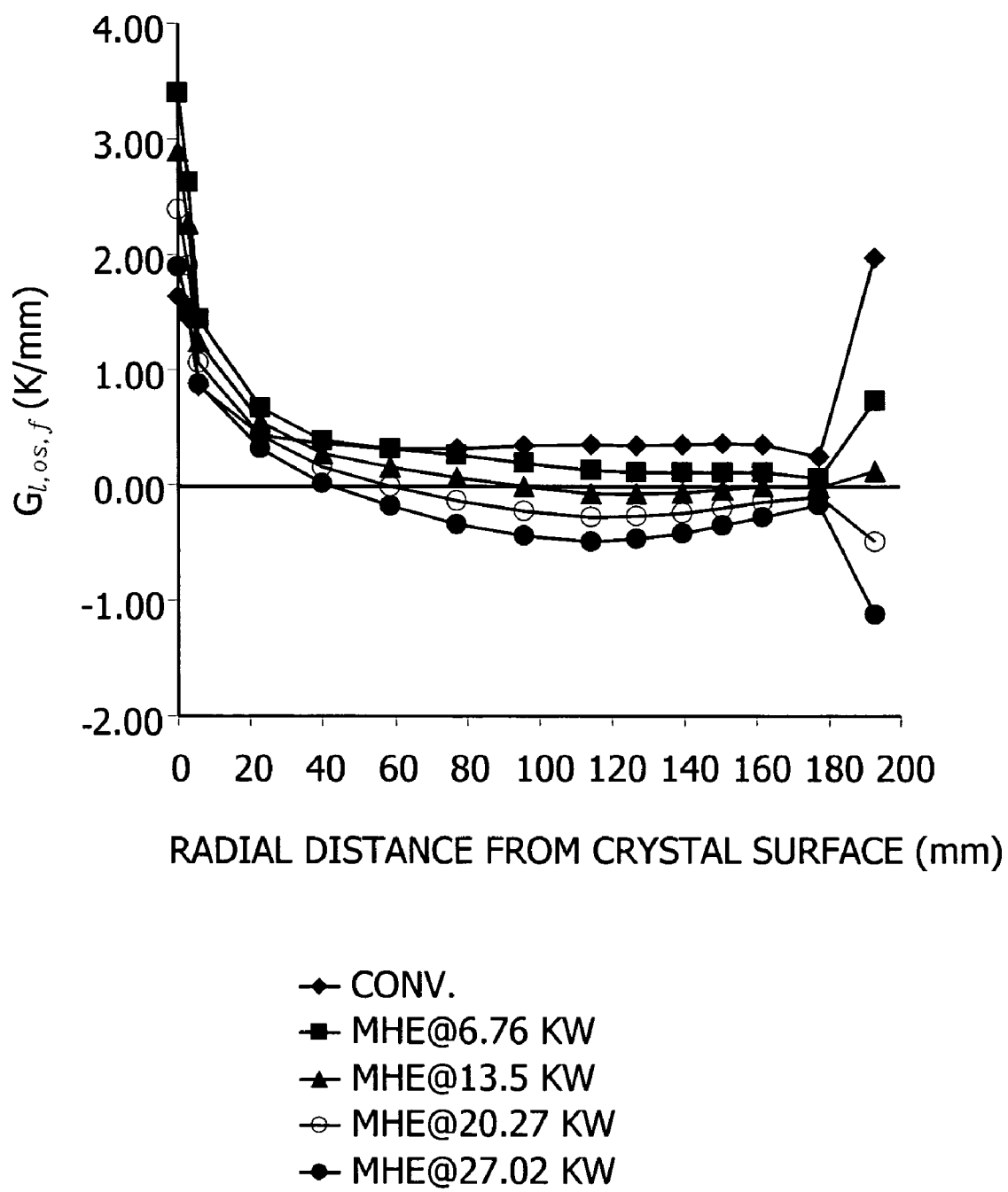
FIG. 35 is a graph of the effect of melt heat exchanger (MHE) power on $G_{l,os,z}$ in the novel crystal puller (active melt heat exchanger (MHE), crystal heat exchanger (CHE), lower heater (LH), and upper heater (UH))
Figure 36:
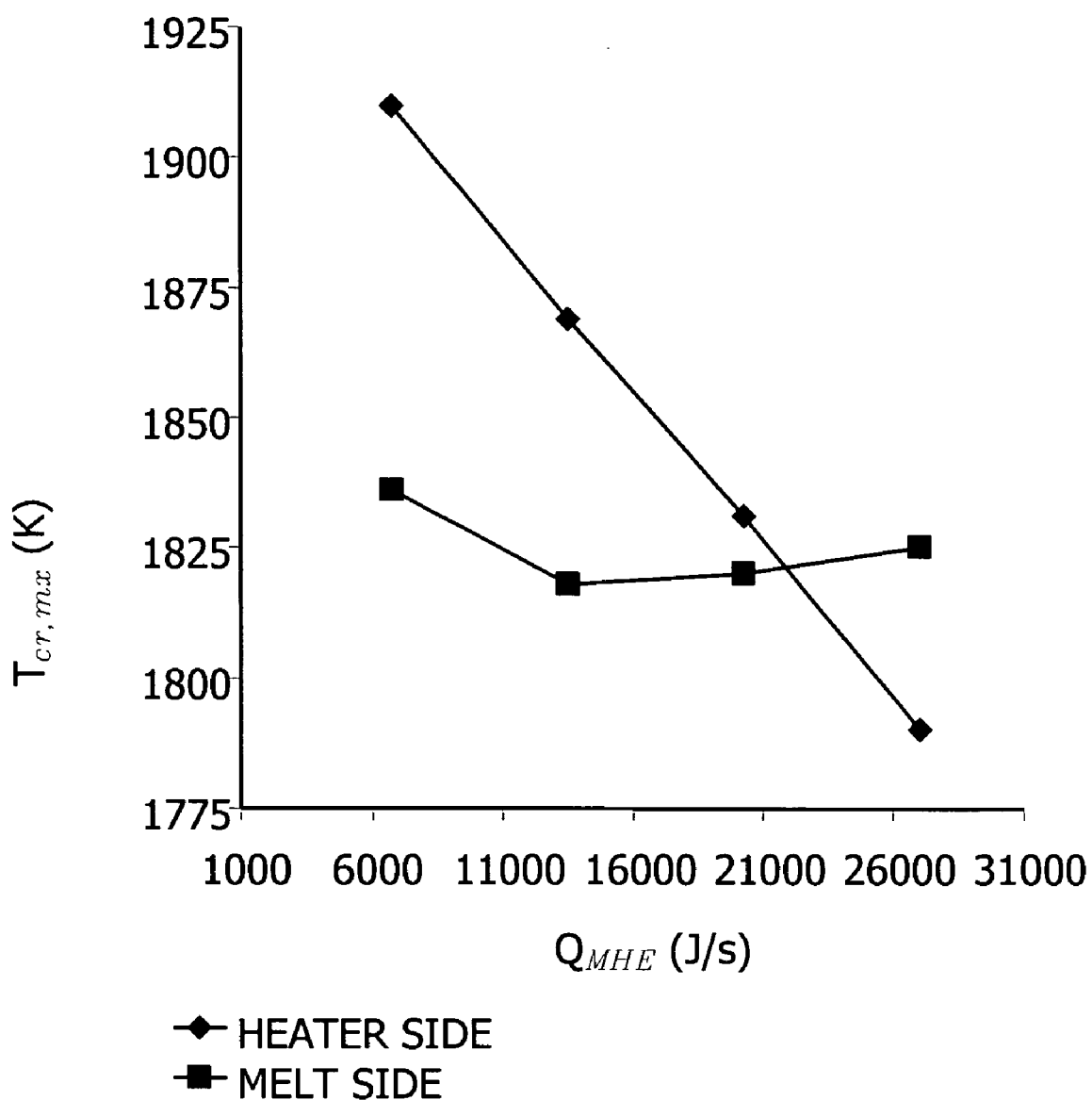
FIG. 36 is a graph of the effect of melt heat exchanger (MHE) power on the maximum crucible temperature in the novel crystal puller (active melt heat exchanger (MHE), crystal heat exchanger (CHE), lower heater (LH), and upper heater (UH))
Figure 37:
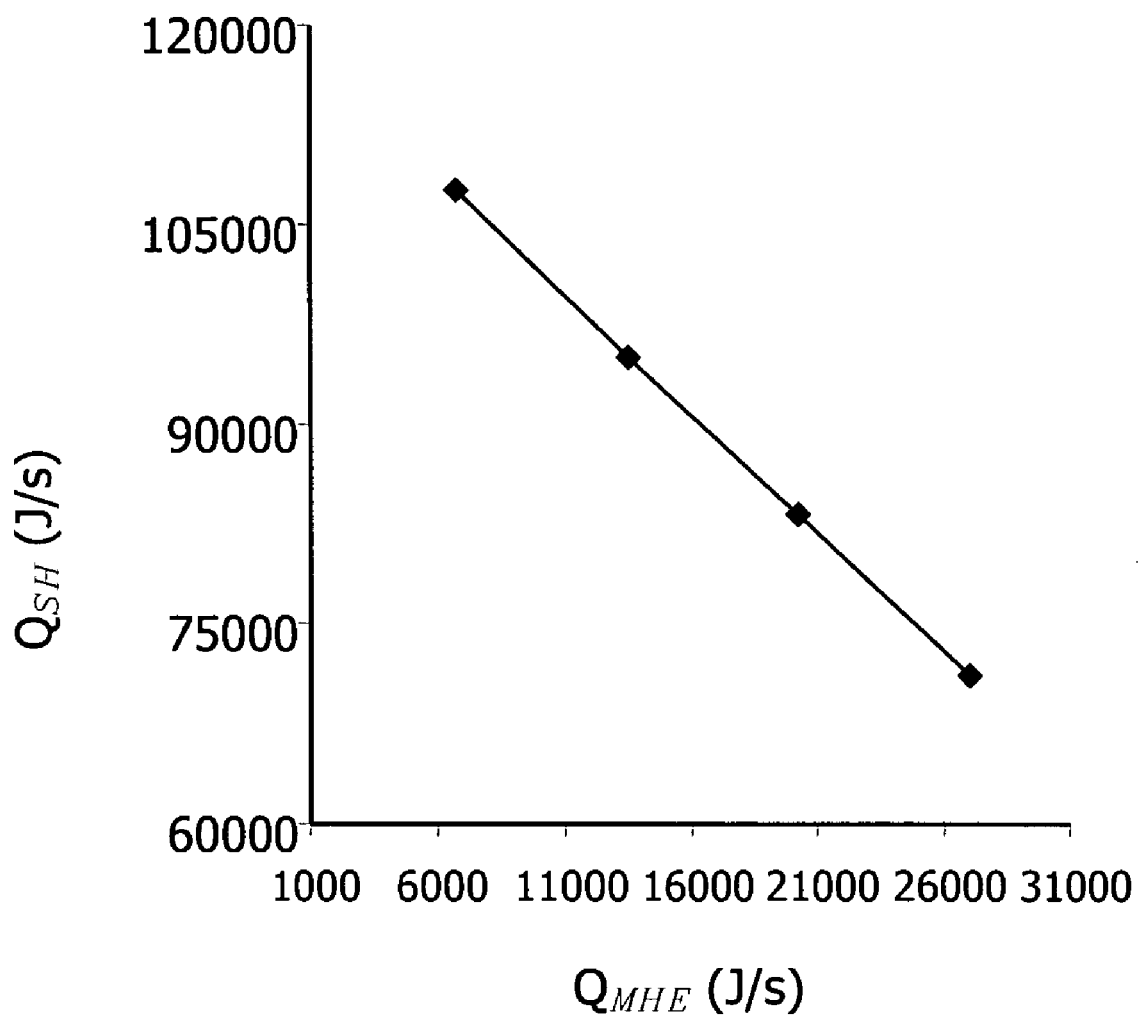
FIG. 37 is a graph of the melt heat exchanger (MHE) power on the side heater power in the novel crystal puller (active melt heat exchanger (MHE), crystal heat exchanger (CHE), lower heater (LH), and upper heater (UH))
Figure 38A:
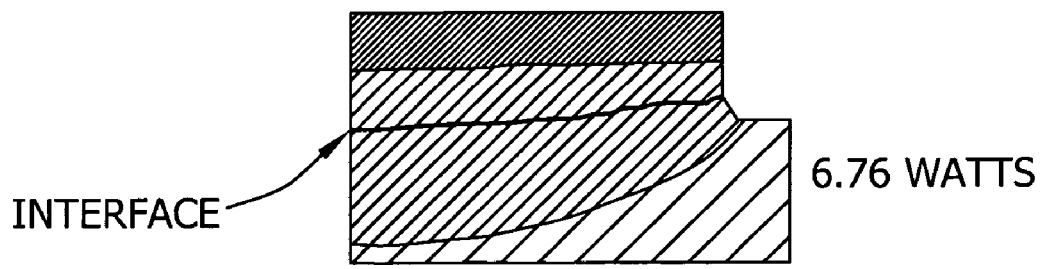
FIGS. 38A-38D are simulated variations in the interface shape as a function of the melt heat exchanger (MHE) power in the novel crystal puller (active melt heat exchanger (MHE), crystal heat exchanger (CHE), lower heater (LH), and upper heater (UH))
Figure 38B:
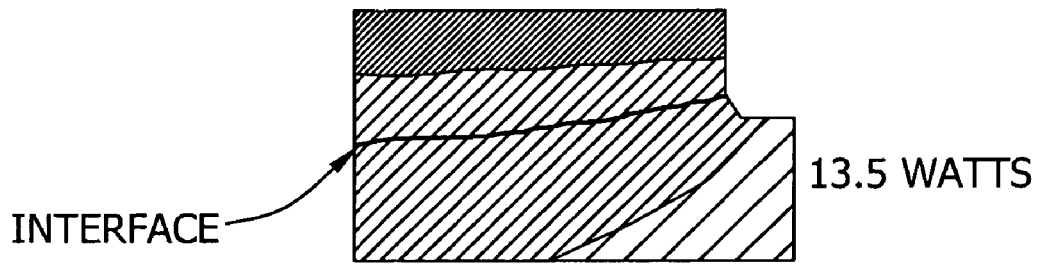
Figure 38C:
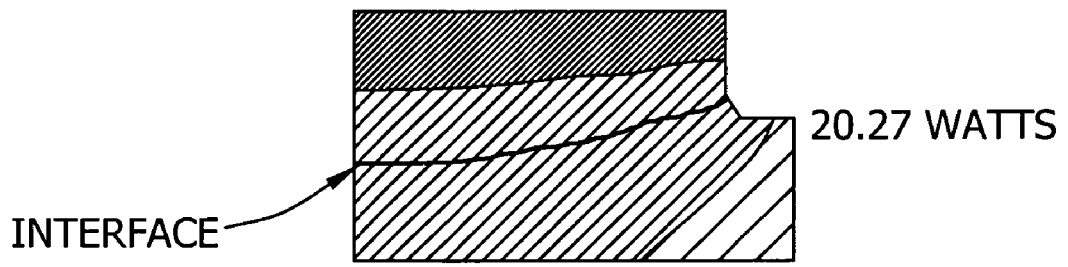
Figure 38D:
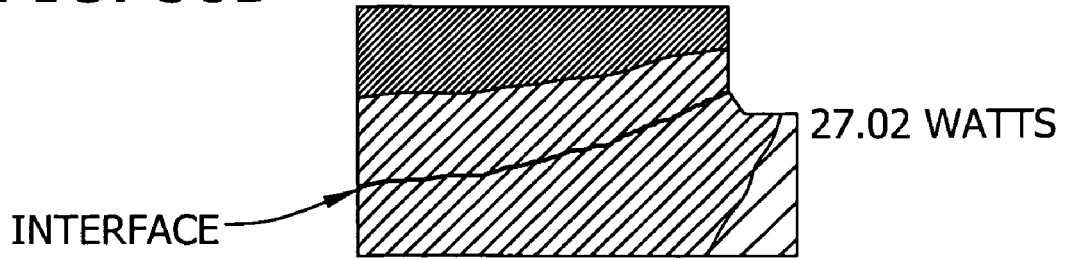
Figure 39:
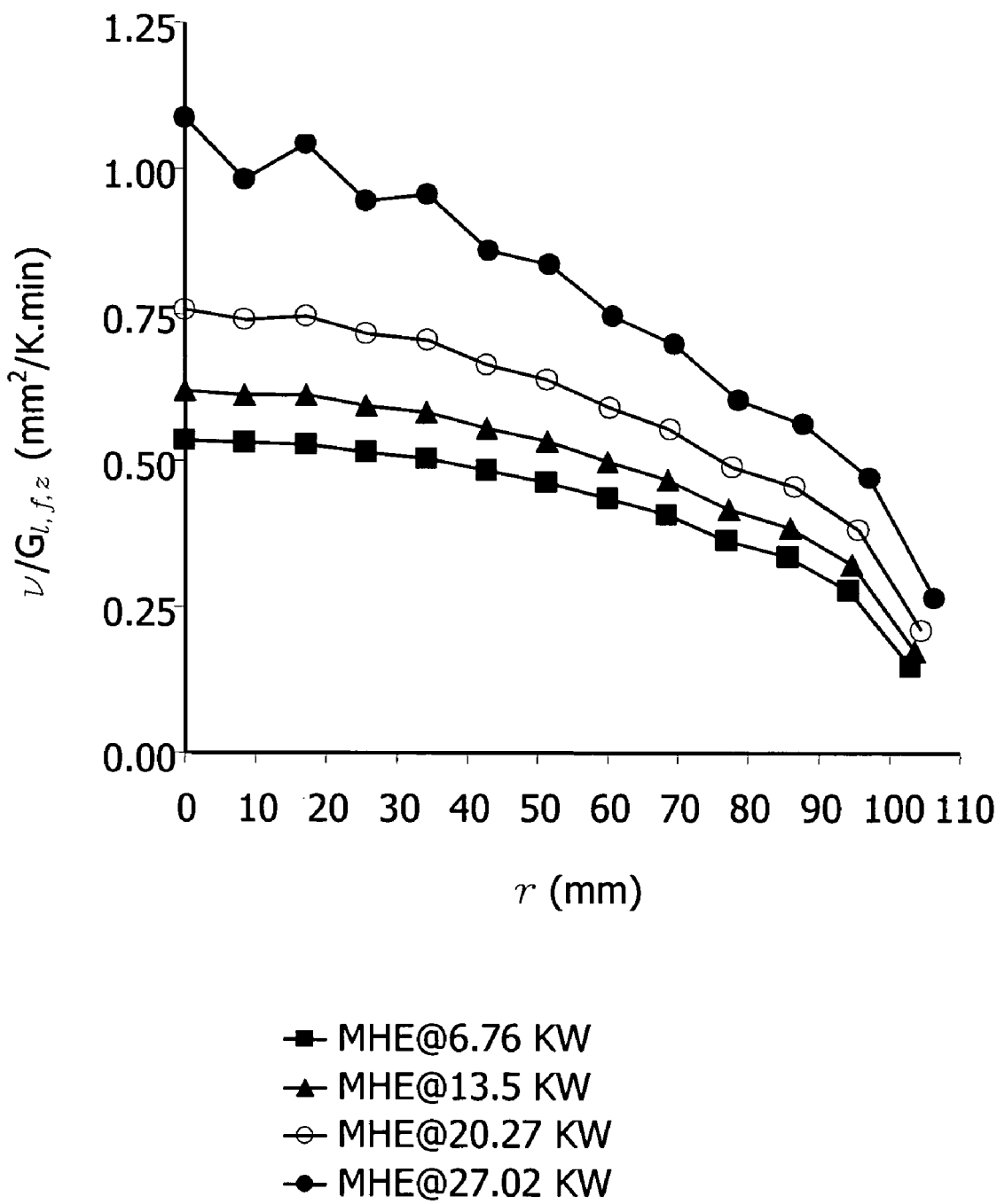
FIG. 39 is a graph of the dependence of $G_{l,fz}$ on the melt heat exchanger (MHE) power in the novel crystal puller (active melt heat exchanger (MHE), crystal heat exchanger (CHE), lower heater (LH), and upper heater (UH))
Figure 40A:
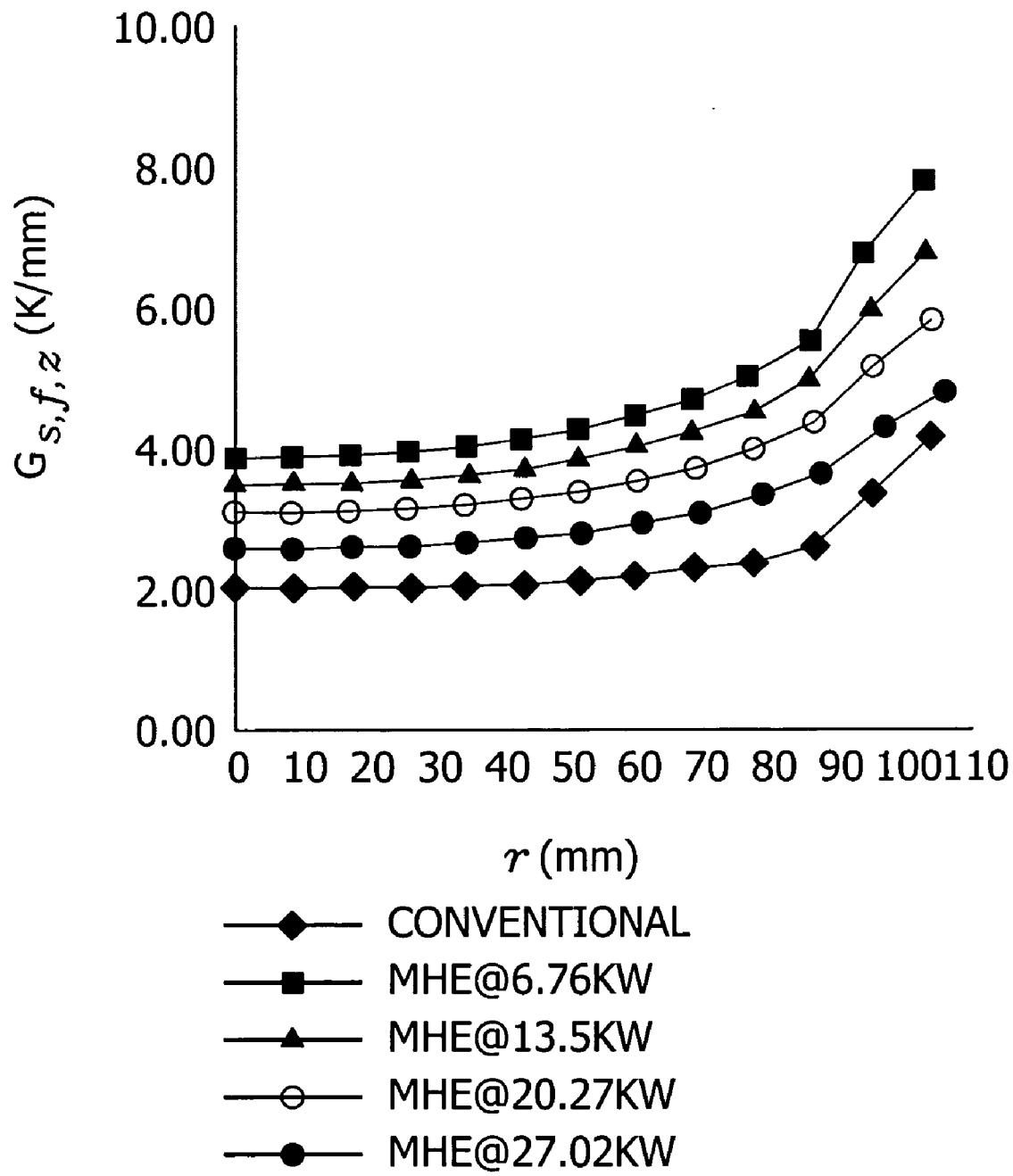
FIG. 40A is a graph of the effect of melt heat exchanger (MHE) power on $G_{s,fz}$ in the novel crystal puller (active melt heat exchanger (MHE), crystal heat exchanger (CHE), lower heater (LH), and upper heater (UH))
Figure 40B:
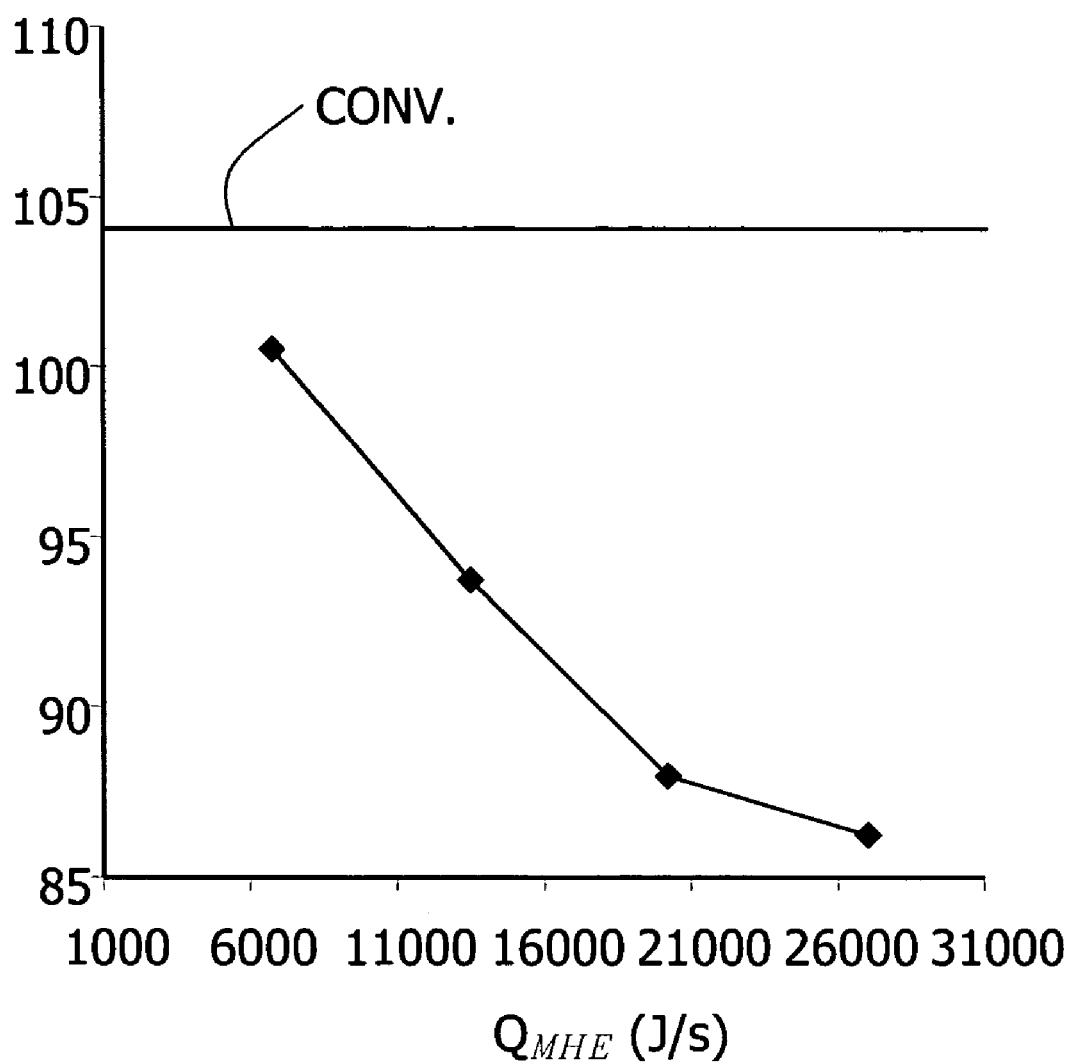
FIG. 40B is a graph of the effect of melt heat exchanger (MHE) power on the relative uniformity of $G_{s,fz}$ in the novel crystal puller (active melt heat exchanger (MHE), crystal heat exchanger (CHE), lower heater (LH), and upper heater (UH))
Figure 40C:
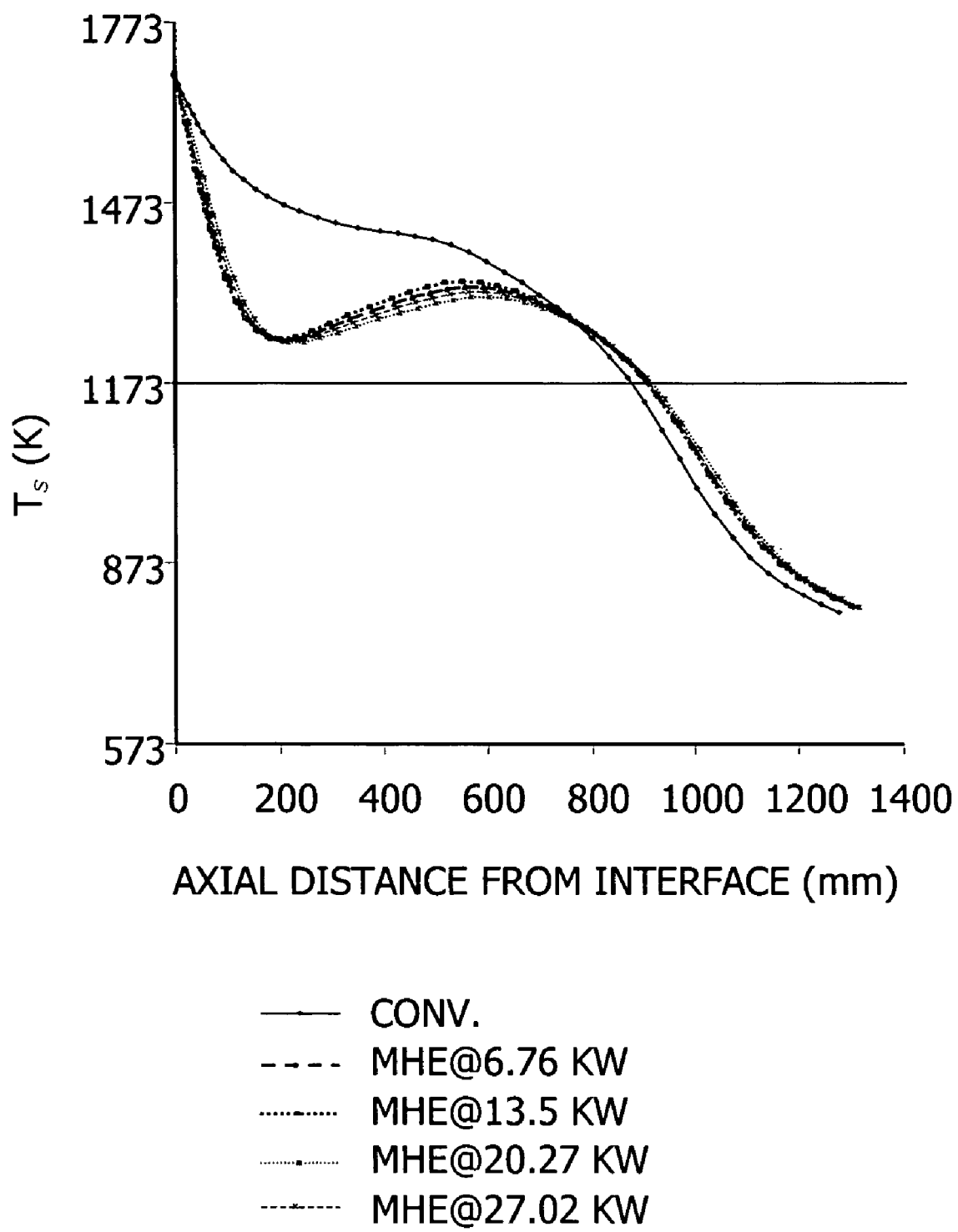
FIG. 40C is a graph of the effect of melt heat exchanger (MHE) power on the time-temperature history of a crystal-segment in the novel crystal puller (active melt heat exchanger (MHE), crystal heat exchanger (CHE), lower heater (LH), and upper heater (UH))

In the following numerical experiments lower heater LH power is fixed at about 2.8 kW, upper heater UH power is fixed at about 20 kW and crystal heat exchanger CHE temperature is fixed at about 1173 K. The temperature field in the novel crystal puller CP (with operating melt heat exchanger MHE, crystal heat exchanger CHE, lower heater LH and upper heater UH) with MHE power of approximately 27 kW is shown in FIG. 34. As expected, $G_{l,os,z}$ decreases with increasing melt heat exchanger MHE power (FIG. 35). As a result, the side heater power and the heater side maximum crucible temperature decrease, allowing the operation to occur below the threshold crucible temperature (FIGS. 36 and 37, respectively). Since the location and magnitude of the maximum crucible temperature on the melt-side is influenced both by the power through the melt heat exchanger MHE and the side heater, there tends to be no monotonic decrease in the melt-side temperature with increasing MHE power. Increasing melt heat exchanger MHE power and decreasing side heater power (with increasing MHE power), have opposite effects on the melt-side crucible temperature. Melt heat exchanger MHE power should not be increased to a level detrimental to crystal C growth. The interface shapes for different melt heat exchanger MHE powers are shown in FIGS. 38A-D. As the melt heat exchanger MHE power increases, the side heater power decreases and the interface moves downward towards the melt M. The increasing curvature of the interface decreases the dramatic increase in $G_{s,fz}$ closer to the crystal C surface. The net effect is an improvement in the radial uniformity of $G_{s,fz}$. The corresponding decrease in the axial heat-flux from melt-side is shown in terms of $v/G_{l,fz}$ in FIG. 39. The radial variations of $G_{s,fz}$ for changing melt heat exchanger MHE power are shown in FIG. 40A. At the interface, very high $G_{s,fz}$ values are achieved. Radial uniformity of $G_{s,fz}$ allows pull-rates around 0.6 mm/min at critical $v/G_{s,fz}$ (FIG. 40B). The melt heat exchanger MHE effect on the time-temperature history of a crystal-segment is negligible as shown in FIG. 40C.

MHE Temperature

The crystal C, including perfect silicon crystal products, can be efficiently manufactured by controlling the melt heat exchanger MHE temperature. The relationships between various parameters are similar to those exhibited in the crystal puller with the melt heat exchanger MHE power control. Therefore, in this section results obtained at various fixed melt heat exchanger MHE temperatures are discussed only in relation to certain parameters, such as $G_{s,fz}$ and $T_{cr,mx}$.

Several numerical experiments at various melt heat exchanger MHE temperatures in the novel crystal puller CP with active MHE, crystal heat exchanger CHE, lower heater LH and upper heater UH were accomplished. Lower heater LH power was fixed at 2.28 kW and crystal heat exchanger CHE temperature was fixed at 900 K. UH (upper heater) was operating at 20 kW.

Figure 42B:
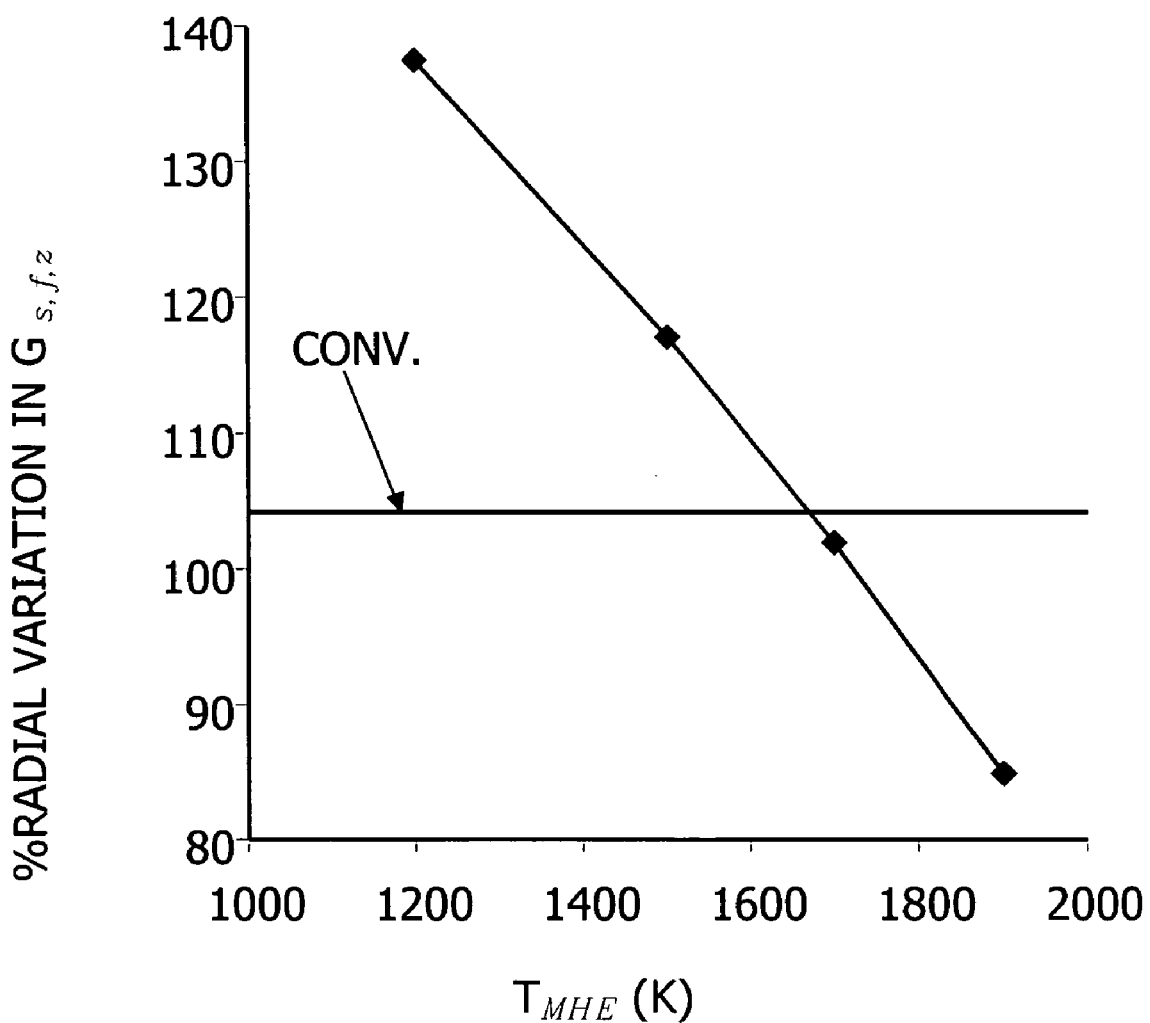
FIG. 42B is a graph of the effect of melt heat exchanger (MHE) temperature on the relative uniformity of $G_{s,fz}$ (r) in the novel crystal puller (active melt heat exchanger (MHE), crystal heat exchanger (CHE), lower heater (LH), and upper heater (UH))
Figure 42C:
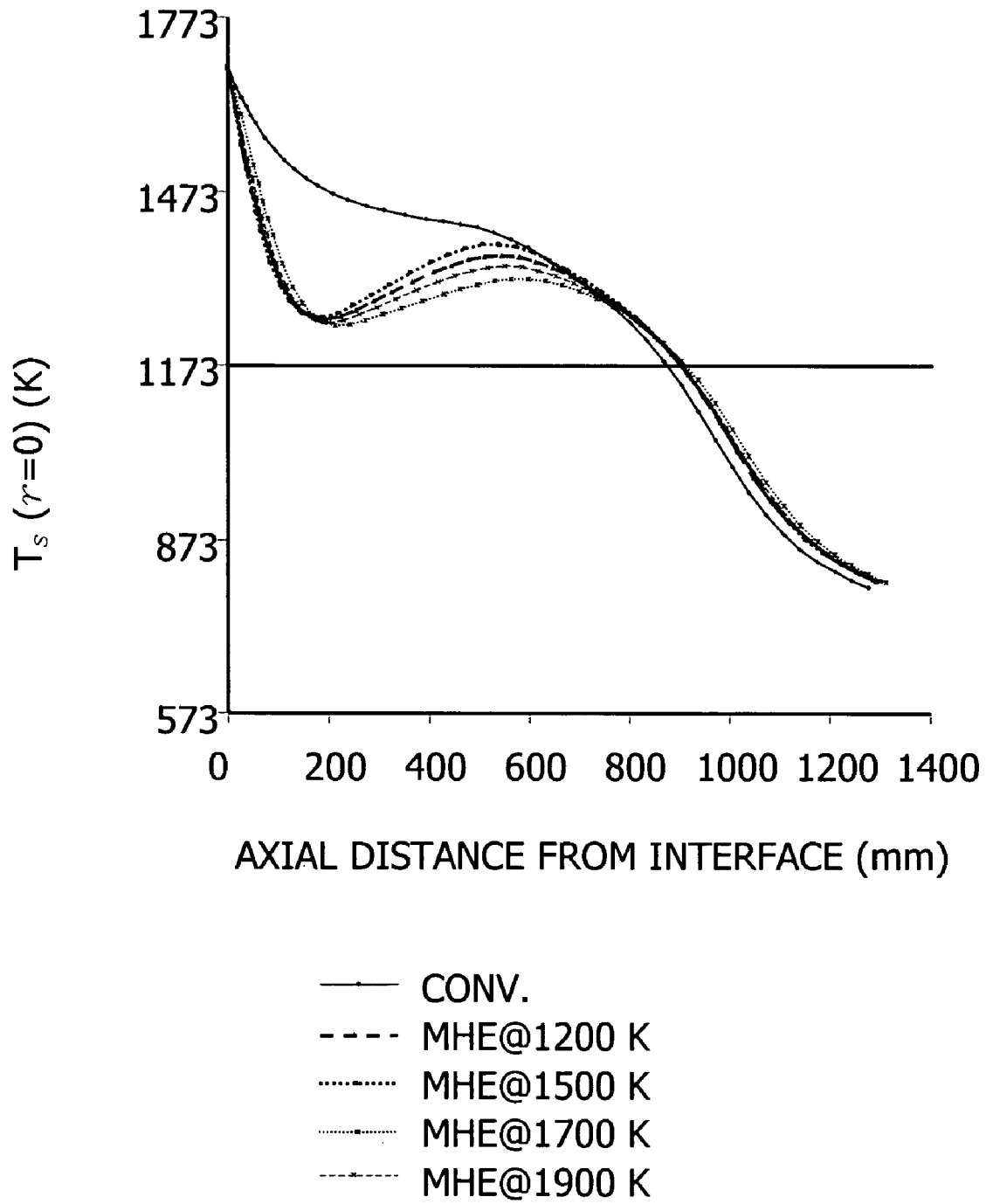
FIG. 42C is a graph of the effect of melt heat exchanger (MHE) temperature on the time-temperature history of a crystal-segment in the novel crystal puller (active melt heat exchanger (MHE), crystal heat exchanger (CHE), lower heater (LH), and upper heater (UH))

The effect of the melt heat exchanger MHE temperature on the maximum crucible CR temperature both on the heater side and the melt-side is shown in FIG. 41. As expected, the crucible temperatures decrease with increasing melt heat exchanger MHE temperature. In this case, cumulative effects of the melt heat exchanger MHE temperature and side heater power result in a net decrease in the melt-side crucible temperature. Crystal growth can be accomplished at melt heat exchanger MHE temperatures above 1700 K. The radial variation in $G_{s,fz}$ as a function of melt heat exchanger MHE temperature is shown in FIG. 42A. Radial uniformity of $G_{s,fz}$ in this crystal puller CP, at melt heat exchanger MHE temperatures above 1700 K, is better than that for the conventional crystal puller, as shown in FIG. 42B. Pull-rates closer to 0.68 mm/min can be achieved at critical $v/G_{s,fz}$. The time-temperature path of crystal segments allows extended diffusion time above the interstitial nucleation temperature range (FIG. 42C). Long crystal C, such as at least, 900 mm long crystal (including crown and taper) can be grown in this manner.

Complete Insulation

As shown in the previous section, the radial uniformity $v/G_{s,fz}$ in the heavily insulated novel crystal puller CP is better than all cases studied above. For a flat and parabolic interface shape, radial uniformity improves uniformity of the incorporated point defect field and decreases the required diffusion time. However, the cost of improving radial uniformity in $G_{s,fz}$ tends to be paid by decreasing its magnitude (FIGS. 17 and 18A-C), and thus decreasing pull-rate and productivity.

Effect of Pull-Rate

The numerical experiments above have been accomplished at the pull-rate equal to 0.5 mm/min. As the pull-rate increases, $G_{s,fz}$ increases and $G_{l,fz}$ decreases to allow heat transfer required by the increased rate of heat generation at the interface F. The higher pull-rate is achieved at least in part, by decreasing the side heater power. The reduction in the side heater power decreases the melt M temperature and temperature variations in melt decrease. The following results are obtained at melt heat exchanger MHE temperature equal to 1900 K, crystal heat exchanger CHE temperature equal to 900 K, lower heater LH power equal to 2.28 kW, and upper heater UH power equal to 20 kW.

Figure 43:
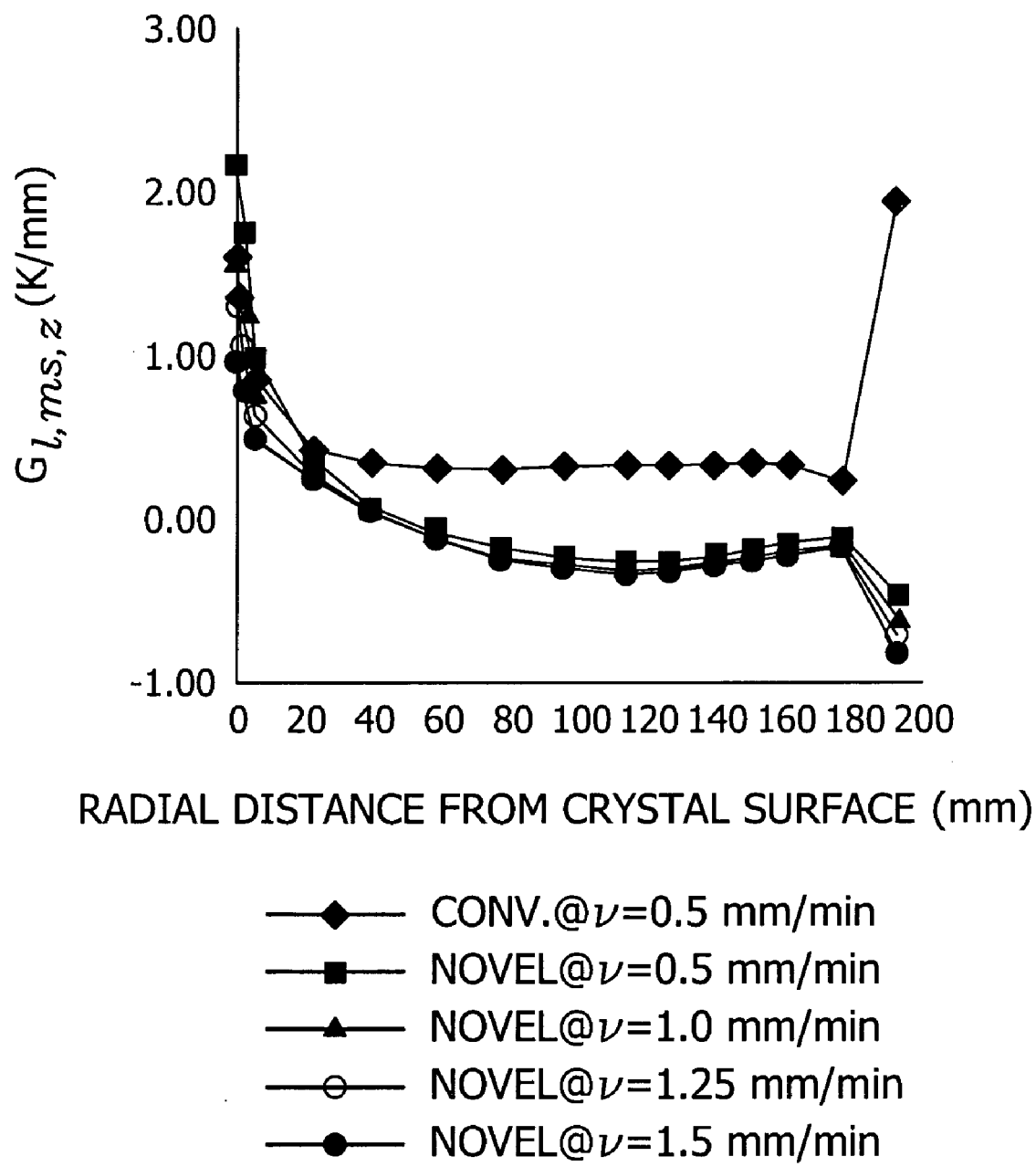
FIG. 43 is a graph of the effect of pull-rate on the heat transport between MHE and melt in the novel crystal puller (active melt heat exchanger (MHE), crystal heat exchanger (CHE), lower heater (LH), and upper heater (UH))
Figure 44:
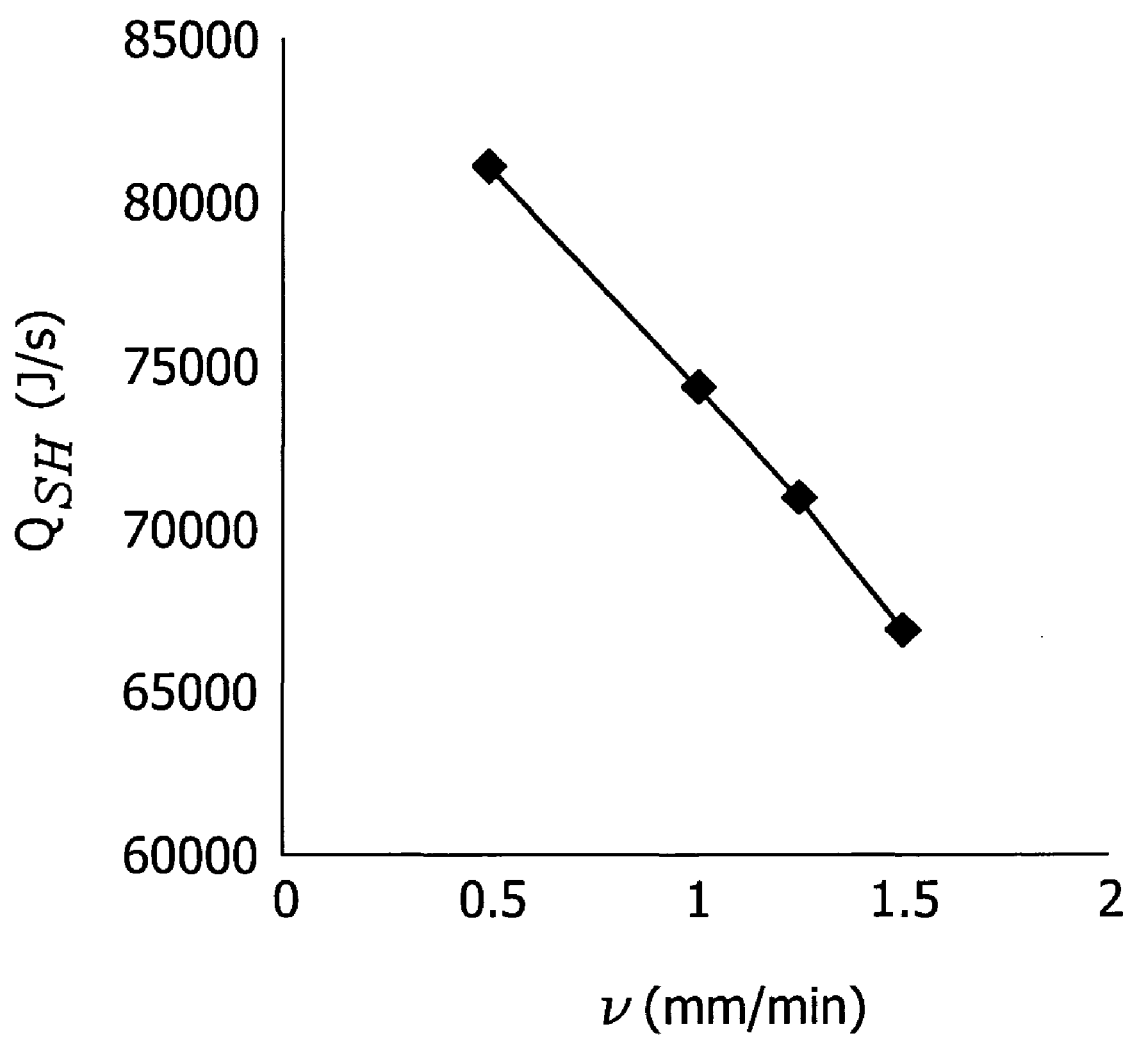
FIG. 44 is a graph of the effect of pull-rate on the side heater power in the novel crystal puller (active melt heat exchanger (MHE), crystal heat exchanger (CHE), lower heater (LH), and upper heater (UH)), the MHE temperature is fixed at 1900K, the LH and UH powers are fixed at 2.28 kW and at 20 kW, respectively.
Figure 45:
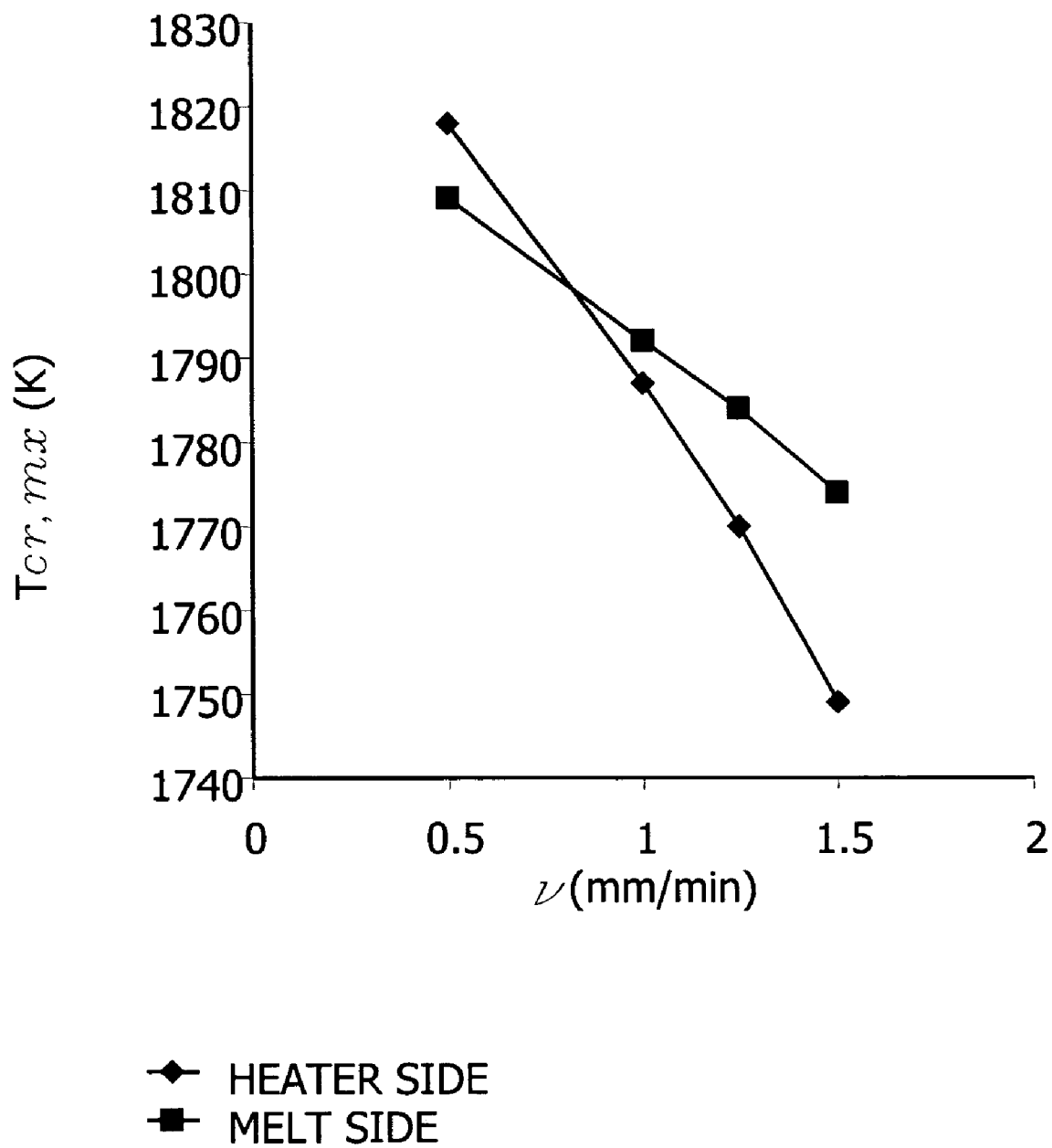
FIG. 45 is a graph of the effect of increasing pull-rate on the maximum crucible temperature in the novel crystal puller (active melt heat exchanger (MHE), crystal heat exchanger (CHE), lower heater (LH), and upper heater (UH)), the MHE temperature fixed at 1900 K.
Figure 46:
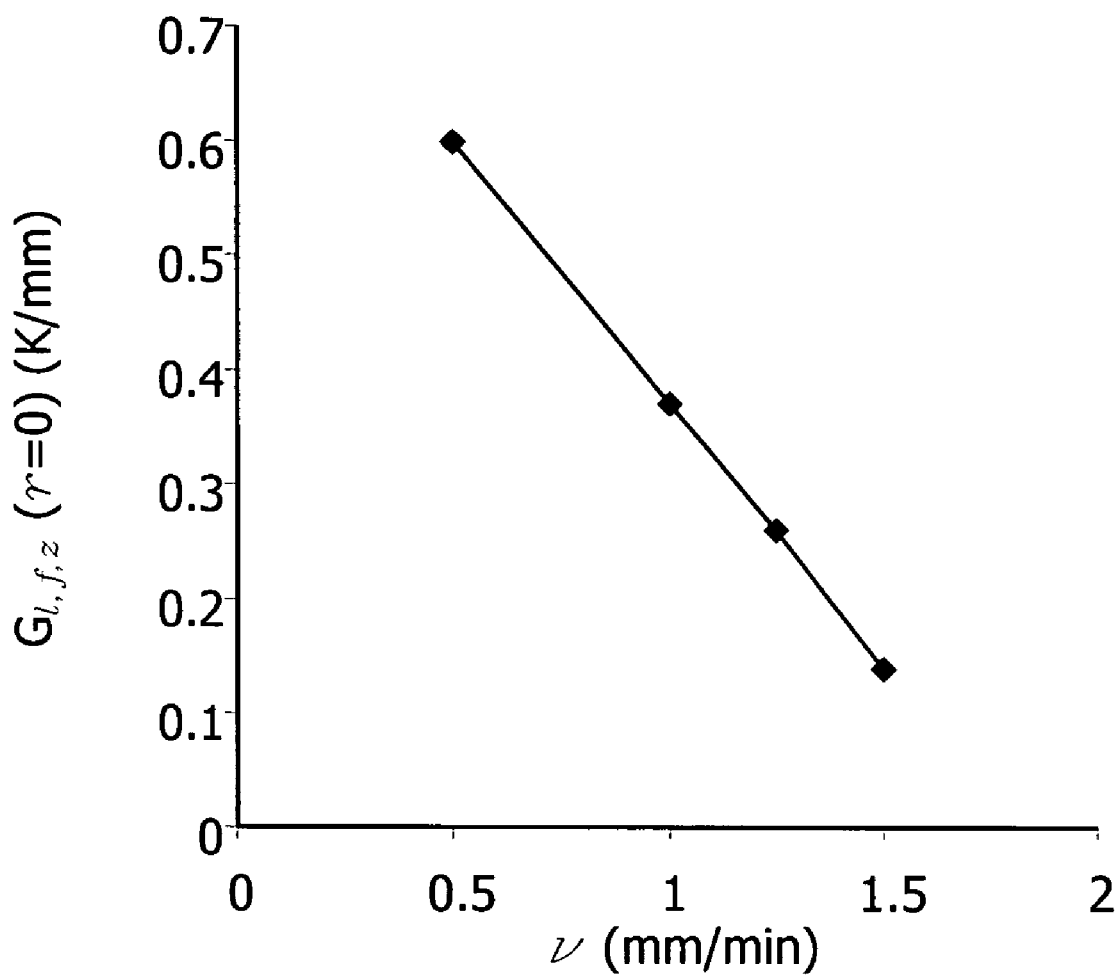
FIG. 46 is a graph of the effect of pull-rate on the melt-side axial temperature gradients in the novel crystal puller (active melt heat exchanger (MHE), crystal heat exchanger (CHE), lower heater (LH), and upper heater (UH)), the MHE temperature fixed at 1900 K.
Figure 47:
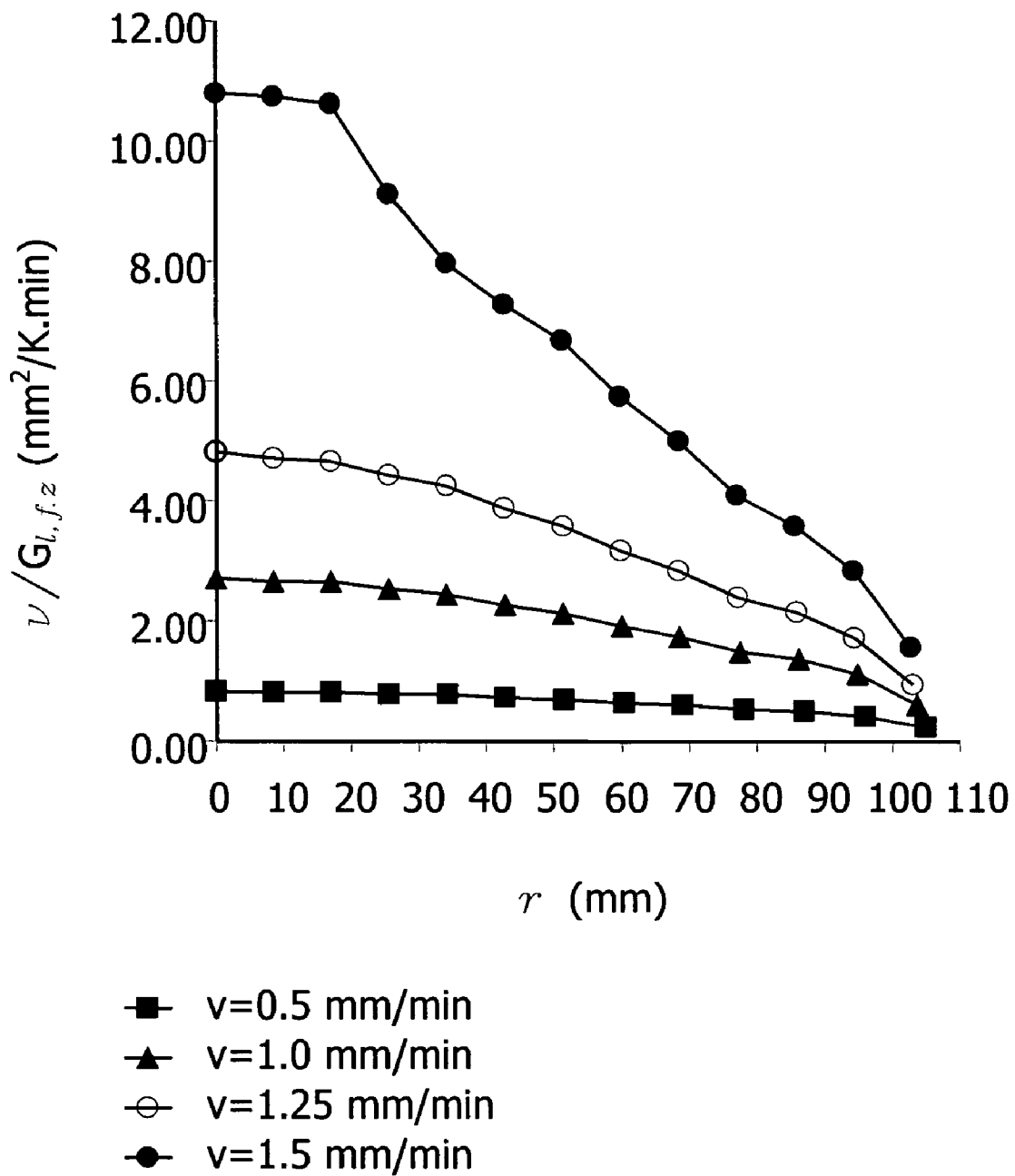
FIG. 47 is a graph of the increasing contribution of heat generated by solidification with increasing pull-rate in the novel crystal puller (active melt heat exchanger (MHE), crystal heat exchanger (CHE), lower heater (LH), and upper heater (UH))
Figure 48:
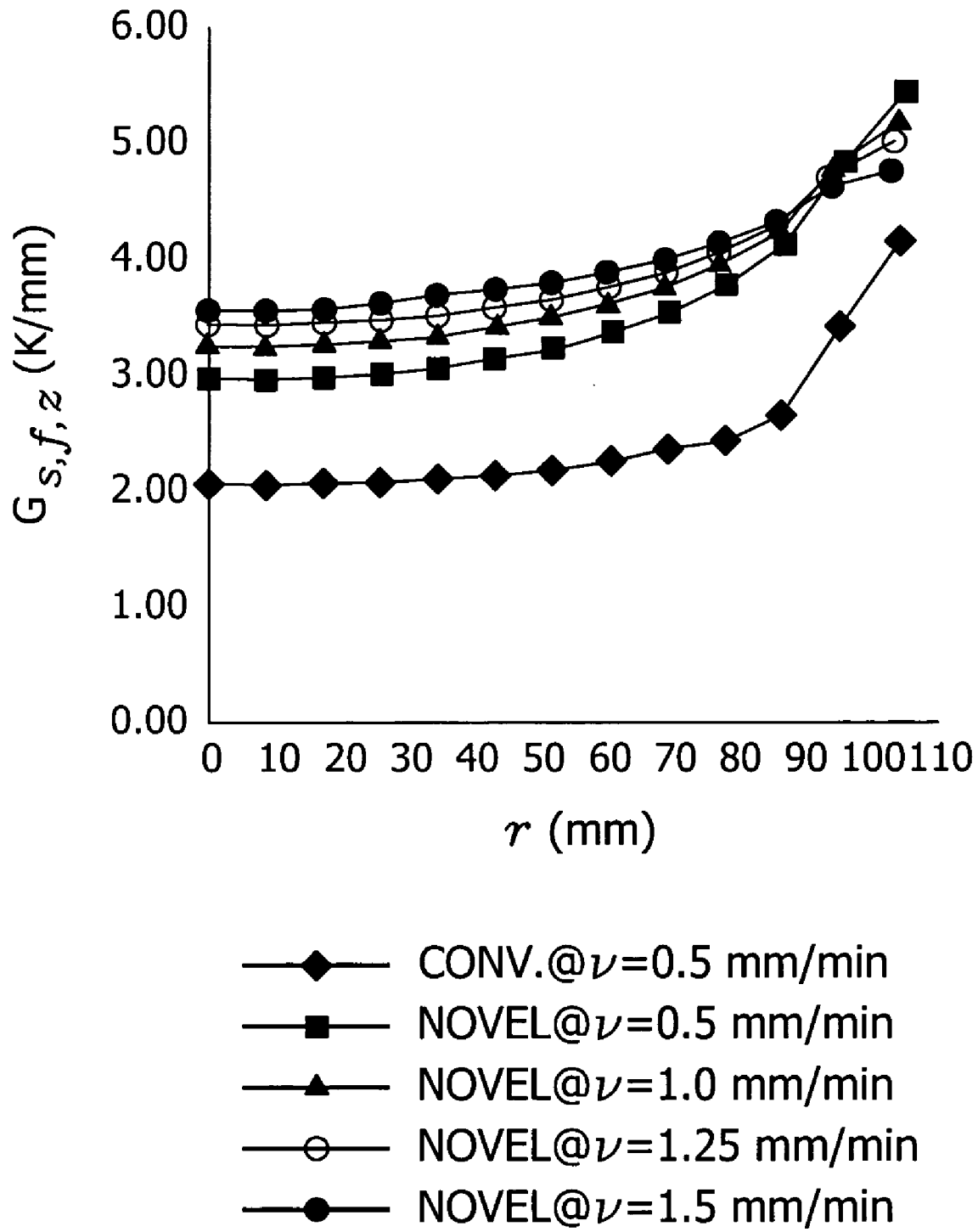
FIG. 48 is a graph of the effect of pull-rate on the uniformity and magnitude of $G_{s,fz}$ (r) in the novel crystal puller (active melt heat exchanger (MHE), crystal heat exchanger (CHE), lower heater (LH), and upper heater (UH))
Figure 49:
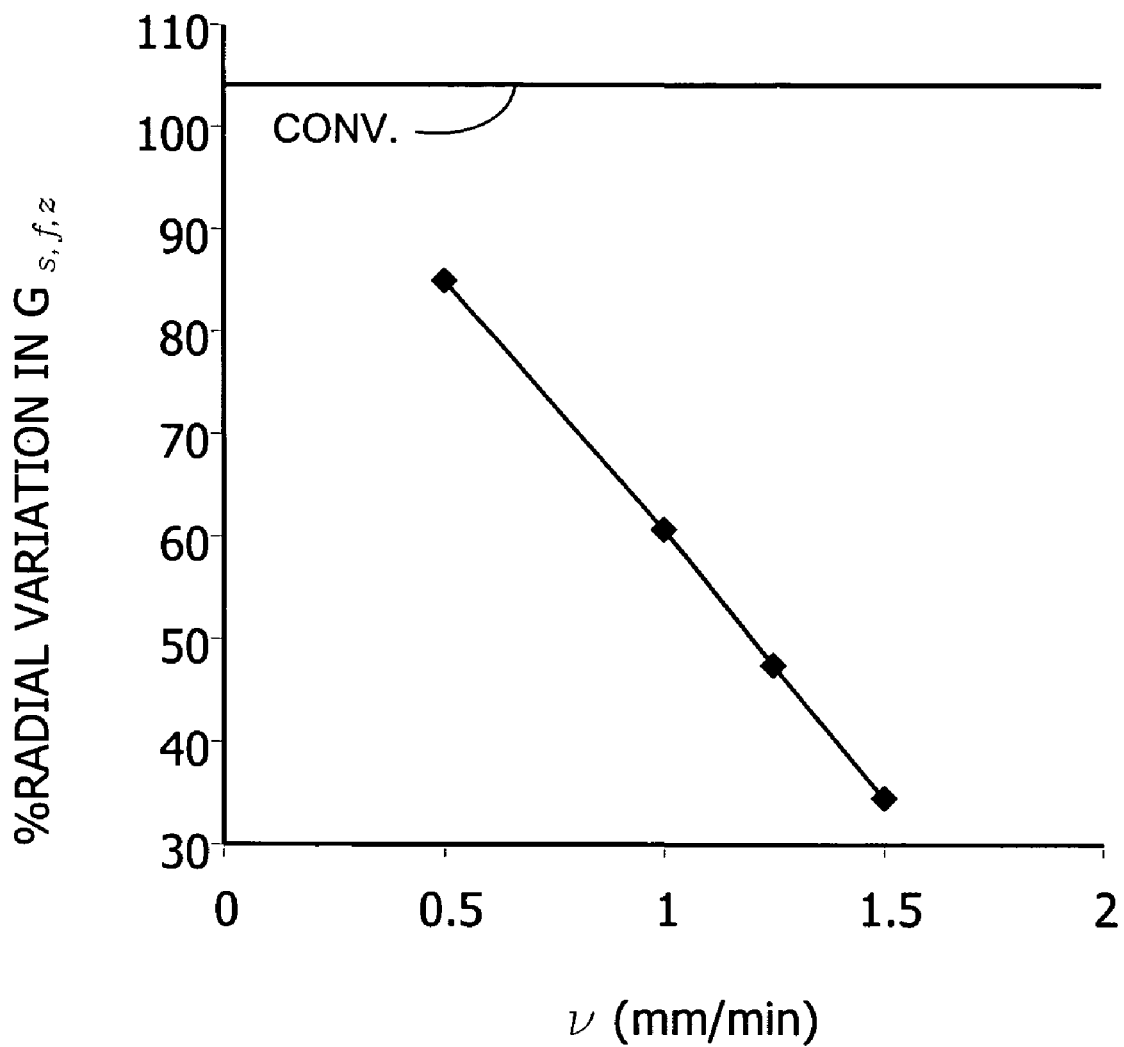
FIG. 49 is a graph of the relative variation in $G_{s,fz}$ as a function of pull-rate in the novel crystal puller (active melt heat exchanger (MHE), crystal heat exchanger (CHE), lower heater (LH), and upper heater (UH))
Figure 50:
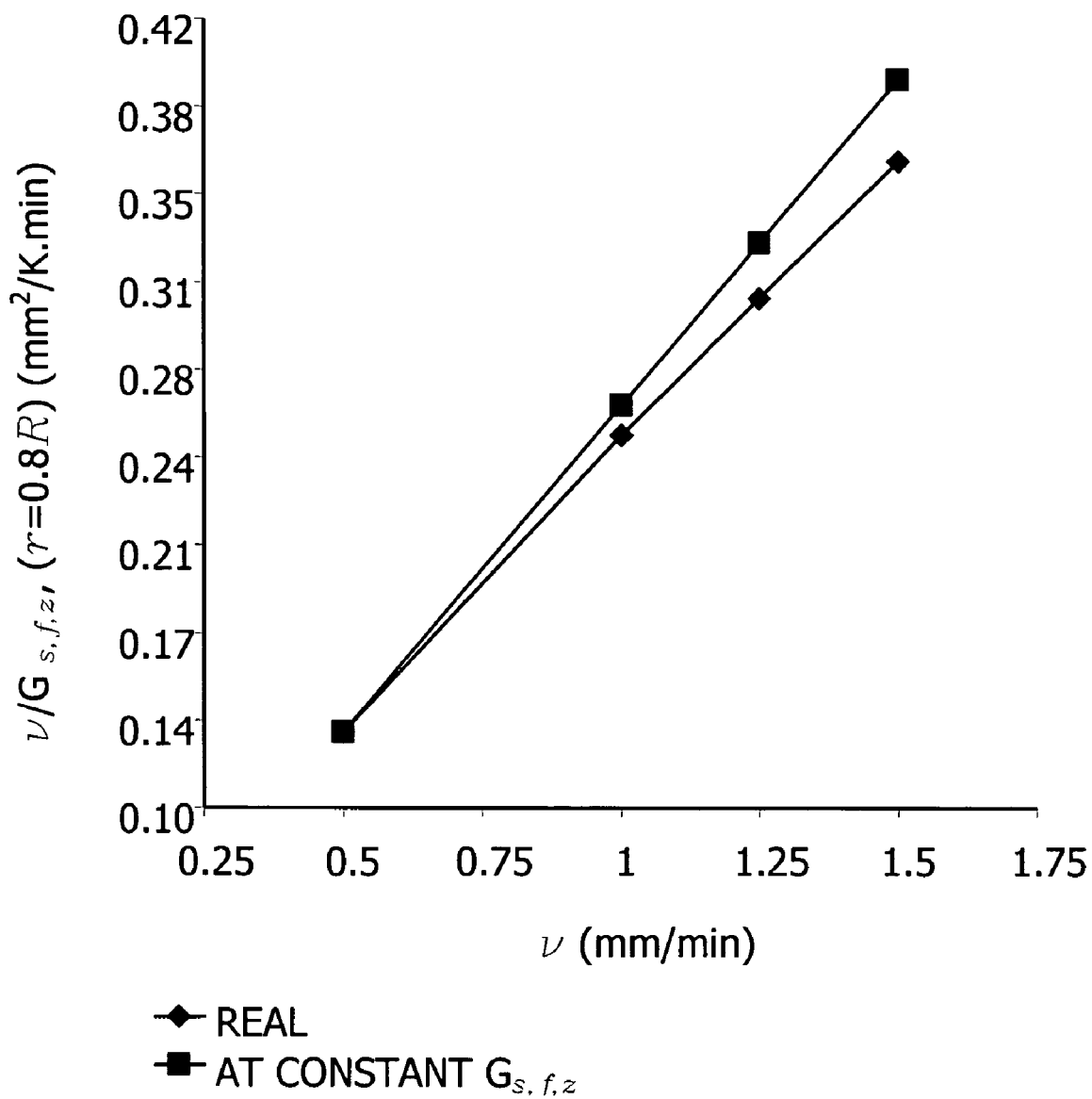
FIG. 50 is a graph of the non-linear relationship between v and $v/G_{s,fz}$ in the novel crystal puller (active melt heat exchanger (MHE), crystal heat exchanger (CHE), lower heater (LH), and upper heater (UH))
Figure 51:
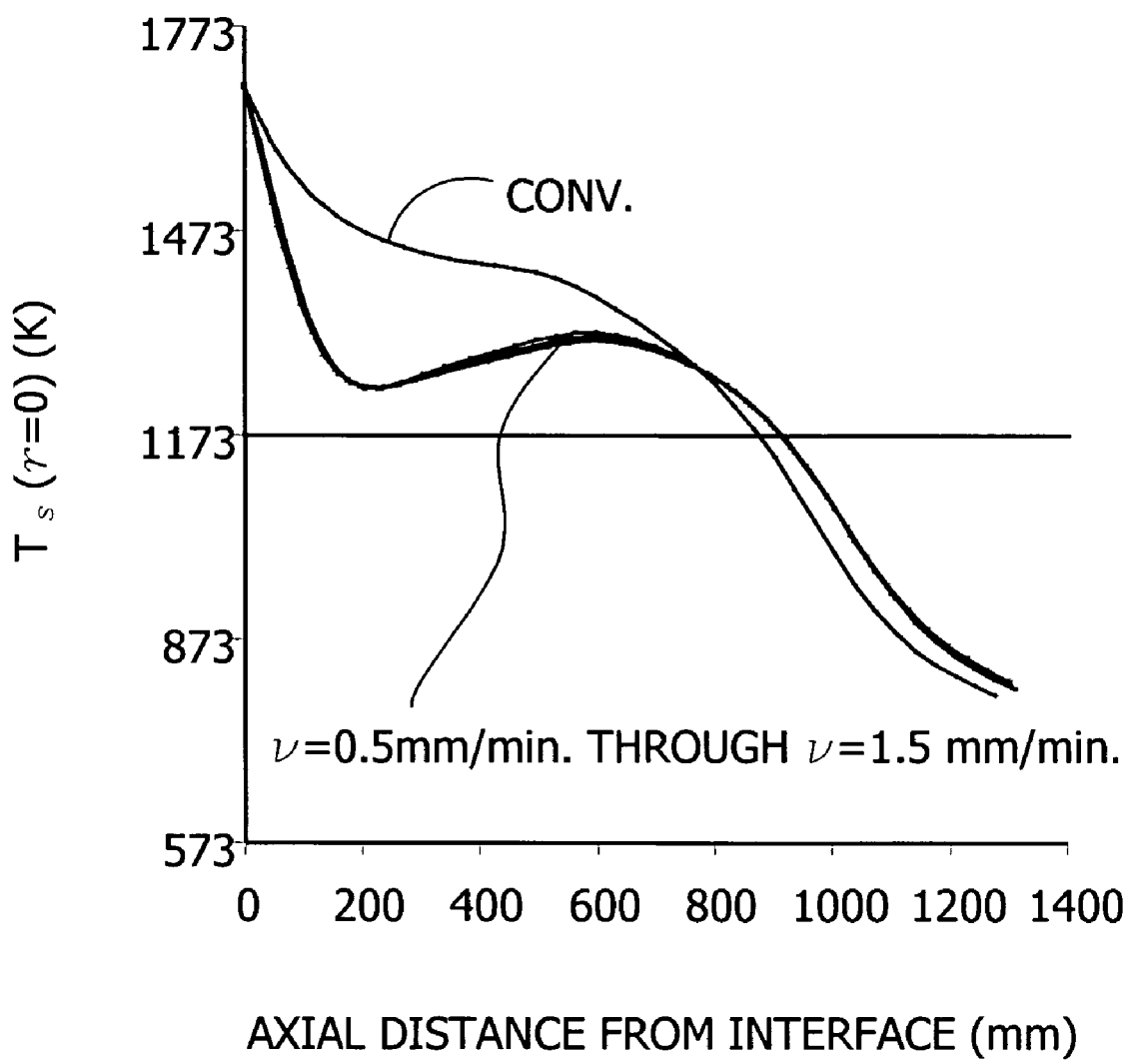
FIG. 51 is a graph of the quasi-steady state temperature profiles in a crystal growing in the novel crystal puller (active melt heat exchanger (MHE), crystal heat exchanger (CHE), lower heater (LH), and upper heater (UH)) as a function of the pull-rate.
Figure 52A:
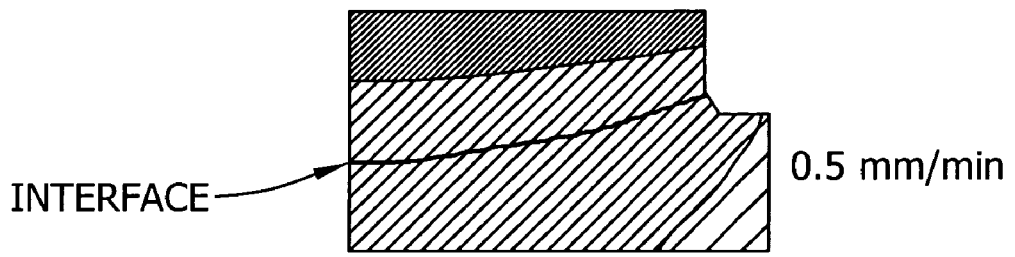
FIGS. 52A-52D are simulated interface shapes as a function of the pull-rate in the novel crystal puller with active melt heat exchanger (MHE), crystal heat exchanger (CHE), lower heater (LH), and upper heater (UH), the MHE temperature fixed at 1900 K.
Figure 52B:
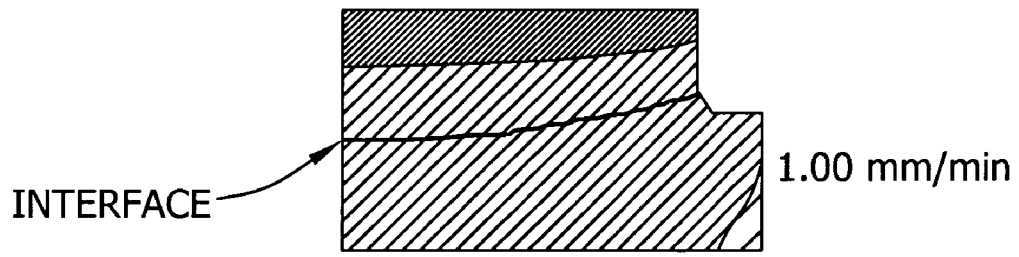
Figure 52C:
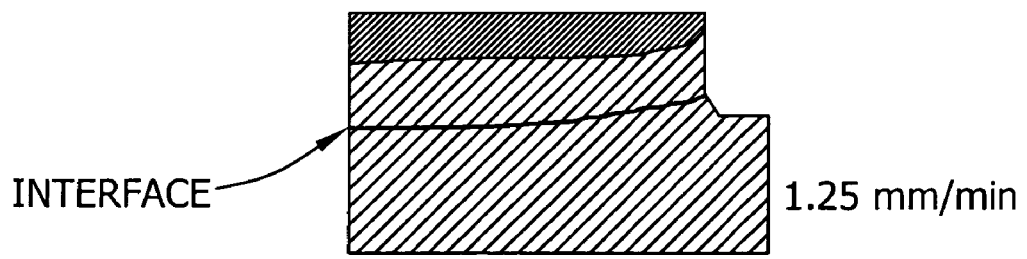
Figure 52D:
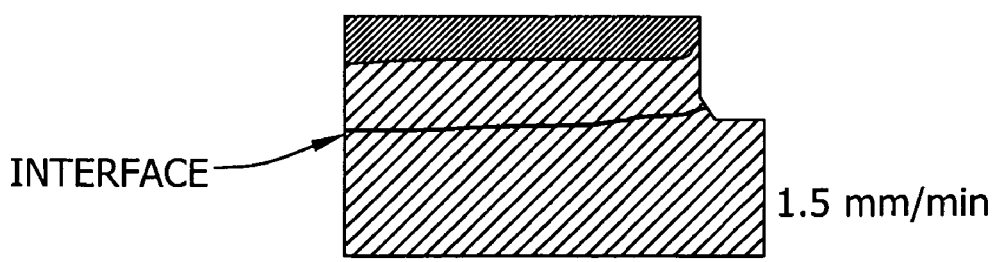

The radial variation of negative melt-side gradients at the melt surface MS, $G_{l,s,z}$ as a function of pull-rate is shown in FIG. 43. Except in the area very close to the crystal surface, the melt heat exchanger MHE transfers heat into the melt M, which decreases the side heater power (FIG. 44) and the crucible CR temperature (FIG. 45). Both heater side and melt-side maximum crucible CR temperatures decrease as the side heater power decreases, while the melt heat exchanger MHE temperature remains the same. As the side heater power decreases, the melt M temperature decreases. Therefore, the gradient below the melt/crystal interface F decreases as shown in FIG. 46. The relative contribution of the heat flux associated with fusion increases with increasing pull-rate (FIG. 47). This change improves the radial uniformity of $G_{s,f,z}(r)$. The decreasing heater power cools the crystal C and increases $G_{s,f,z}$ as shown in FIGS. 48 and 49. The non-linear relationship between $v/G_{s,f,z}$ and v is shown in FIG. 50. The nonlinearity arises as a result of the change in $G_{s,f,z}$ with a change in v. The axial profile followed by a crystal-segment does not change significantly with the pull-rate (FIG. 51). Therefore, it is reasonable to assume that in-situ cooling rates change linearly with the pull-rate. The change in the interface shape with the pull-rate is shown in FIGS. 52A-D.

EXAMPLE

Rapid Cooled Silicon (RCS)

Rapid cooled silicon RCS relies on high in-situ cooling rates of crystal segments through the relevant nucleation temperatures while the crystal C is being grown. Rapid cooling through point defects nucleation temperatures, which typically vary between 1473 K to 1173 K, typically results in high remnant point defects concentration at lower temperatures. The rapid cooling enables interaction of the point defects with other impurities such as oxygen, below 1323 K. Preferably, a crystal-segment is rapidly cooled through a wide range of temperature from 1523 K to 973 K. The local cooling rates given by $vG_{s,z}$ are sufficient to control nucleation and growth of microdefects and other precipitates. After growth of a complete crystal C, some portion of the C remains above the nucleation temperature range. Continued pulling of the crystal C maintains the required cooling rates of the crystal segments. However, higher pull-rates can be applied. The method of making all-types of rapid cooled silicon RCS is essentially the same. A primary feature of making rapid cooled silicon RCS is to maintain required $v/G_{s,f,z}$ conditions at the melt/crystal interface F and achieve required cooling-rates.

An advantageous feature of an rapid cooled silicon RCS process performed in the novel crystal puller CP is very high pull-rates and higher local cooling rates in most of the crystal C, preferably achieved by operation of at least the crystal heat exchanger CHE. The lower heater LH and upper heater UH do not necessarily operate in this rapid cooled silicon RCS process. The melt heat exchanger MHE is operated to maintain the maximum crucible temperature below the maximum allowable temperature. Thus, in this embodiment, the novel crystal puller CP operates only with active melt heat exchanger MHE and crystal heat exchanger CHE. To maximize the cooling rates, crystal heat exchanger CHE is maintained at 300 K. To control the crucible temperatures at such high cooling rates, melt heat exchanger MHE is maintained at a relatively higher power (40.5 kW).

Figure 53A:
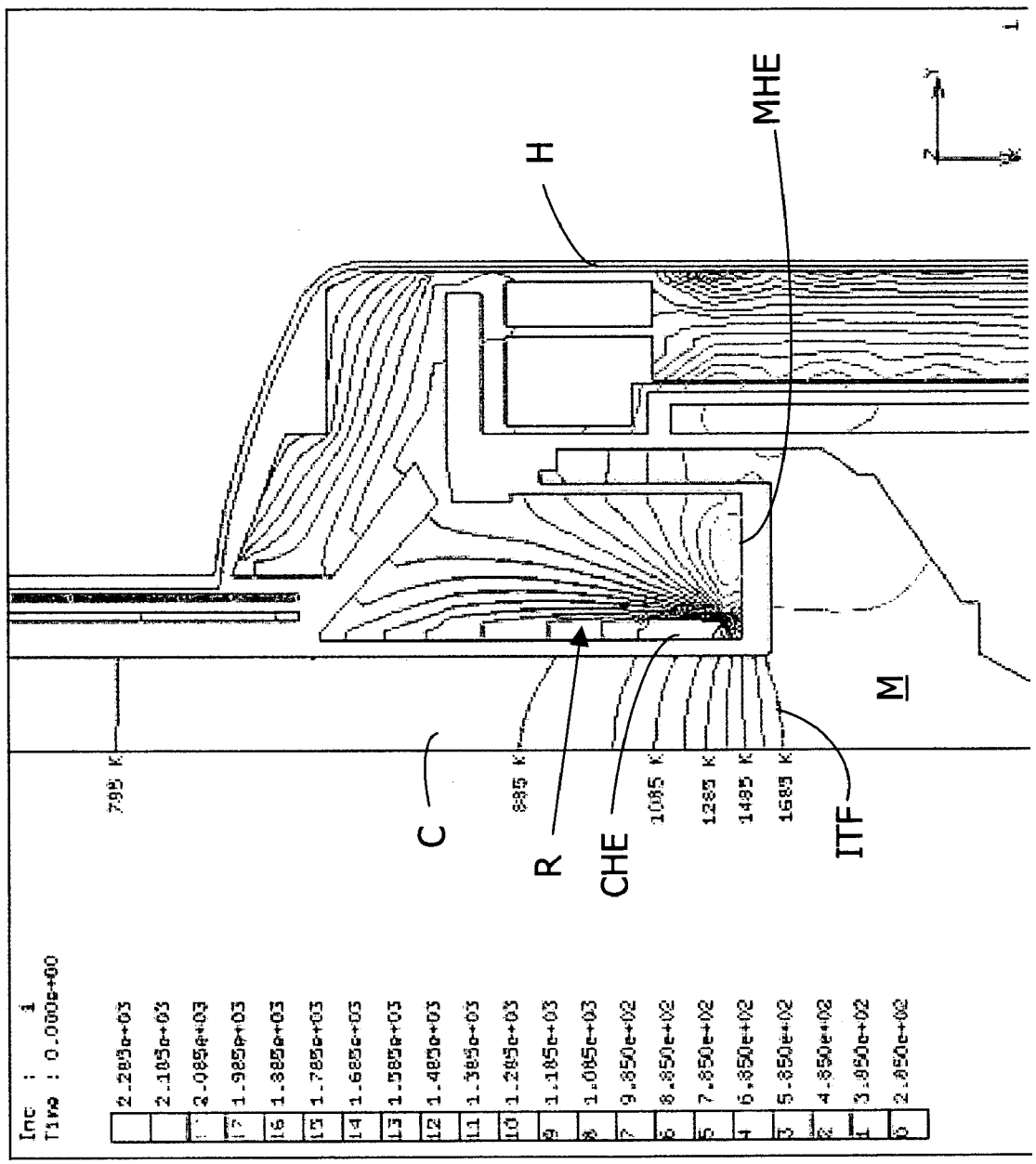
FIG. 53A is a simulated temperature field in the novel crystal puller with active melt heat exchanger (MHE) and crystal heat exchanger (CHE) at the pull-rate equal to 0.5 mm/min., the MHE power fixed at 40.53 kW and the CHE temperature fixed at 300 K.
Figure 53B:
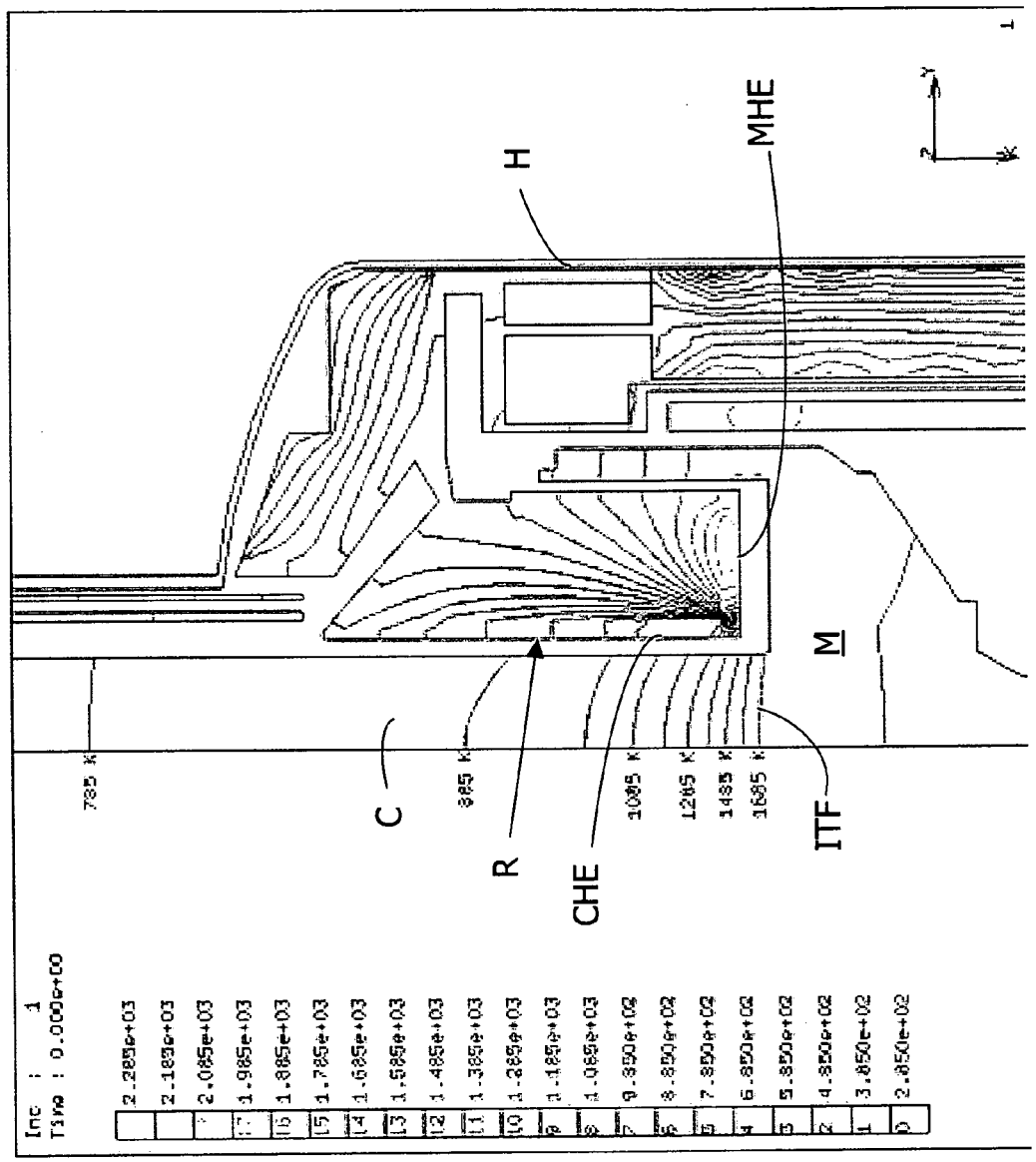
FIG. 53B is a simulated temperature field in the novel crystal puller with active melt heat exchanger (MHE) and crystal heat exchanger (CHE) at the pull-rate equal to 2.5 mm/min.
Figure 54:
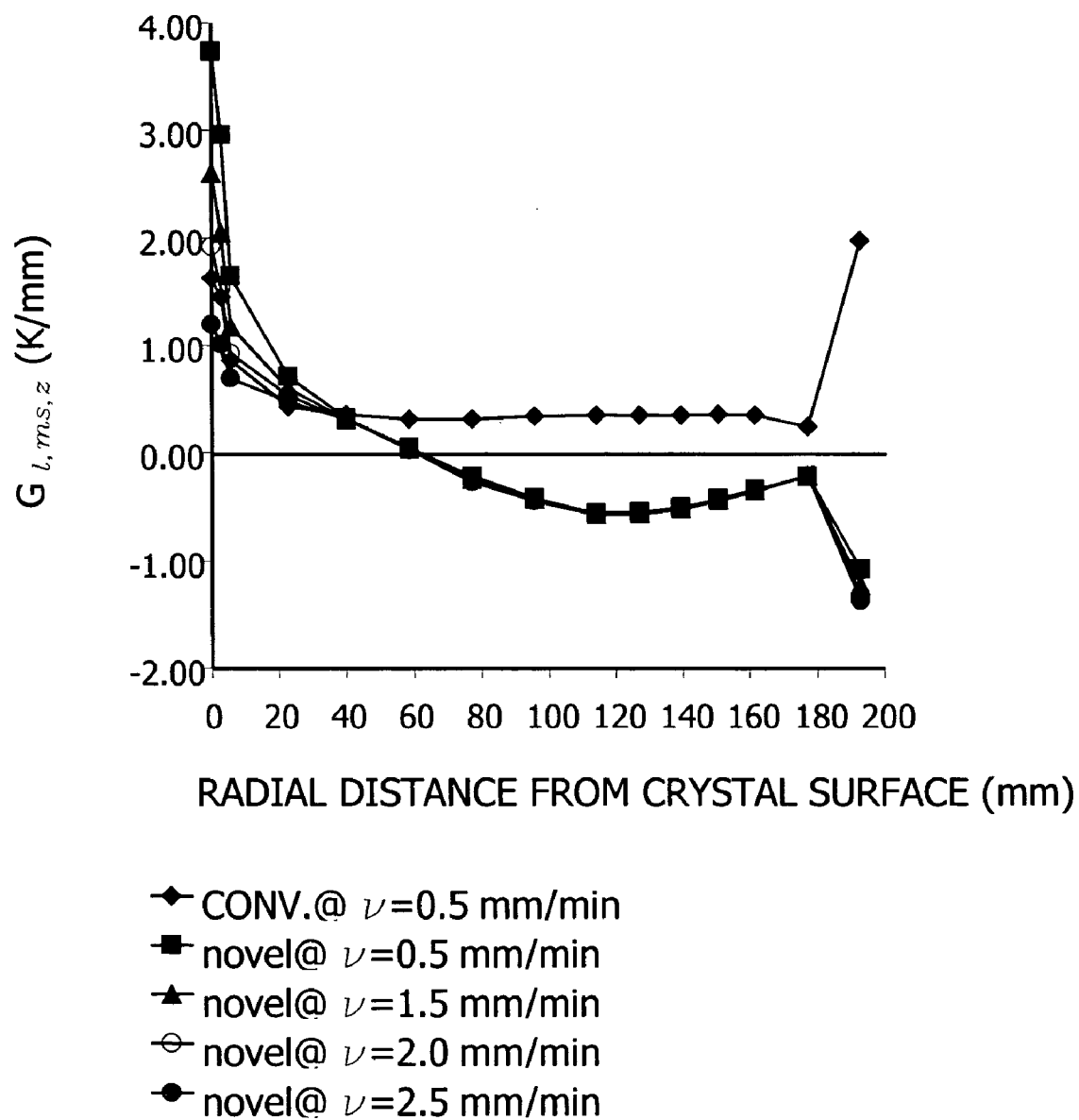
FIG. 54 is a graph of the radial variation in the melt-side negative axial temperature gradient at the open surface with the pull-rate for the novel crystal puller with active melt heat exchanger (MHE) and crystal heat exchanger (CHE)
Figure 55:
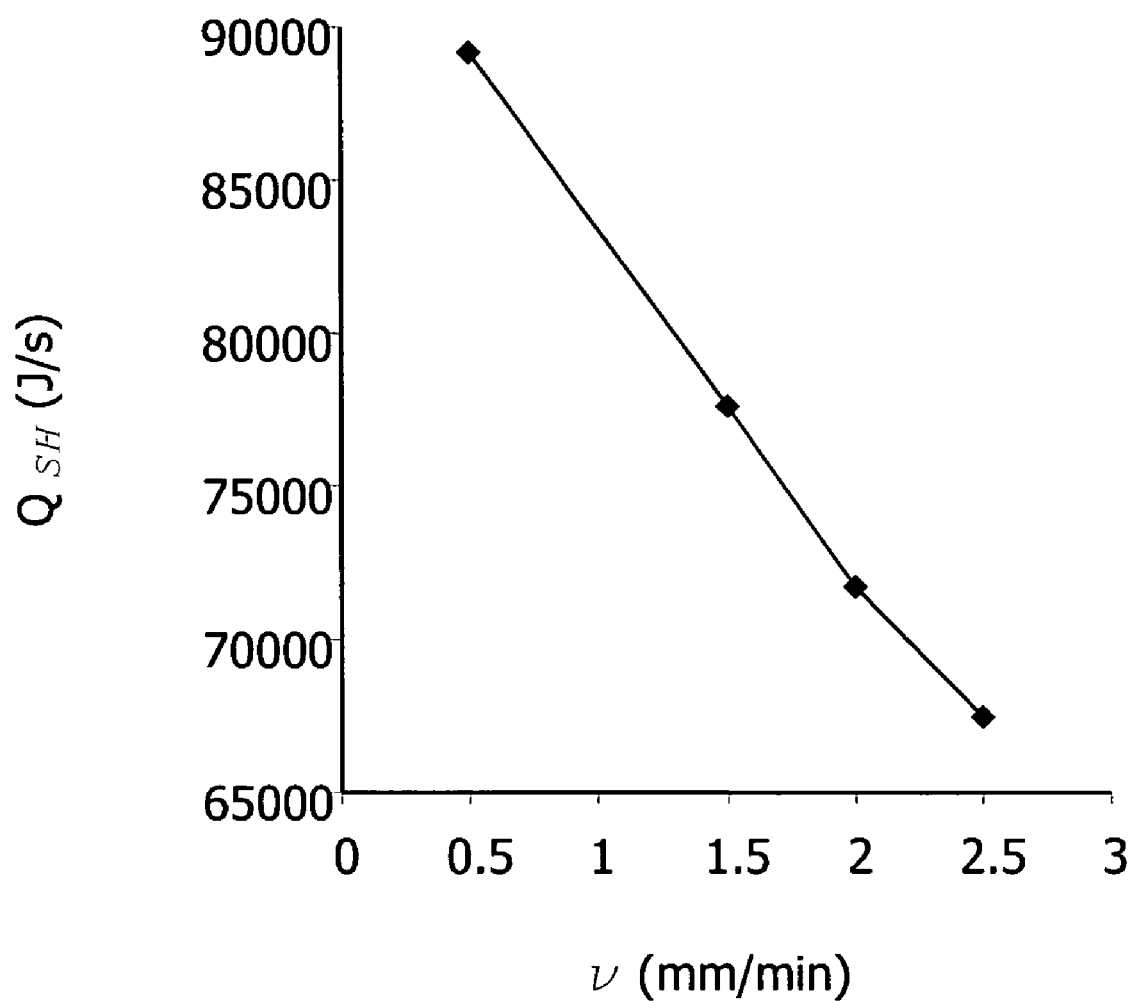
FIG. 55 is a graph of the side heater power as a function of the pull-rate in the novel crystal puller with active melt heat exchanger (MHE) and crystal heat exchanger (CHE)
Figure 56:
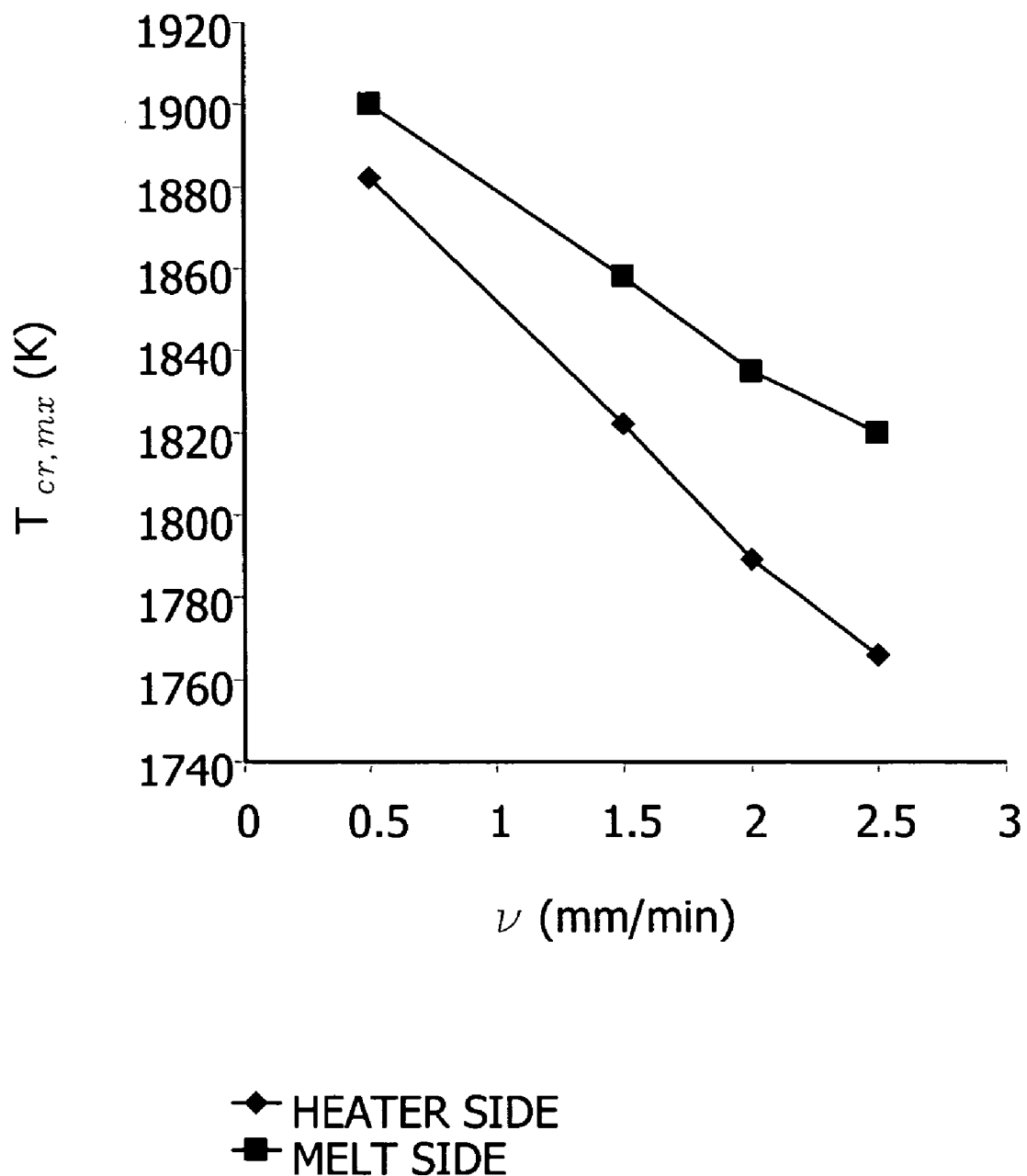
FIG. 56 is a graph of the decreasing maximum crucible temperature with increasing pull-rate in the novel crystal puller with active melt heat exchanger (MHE) and crystal heat exchanger (CHE)
Figure 57:
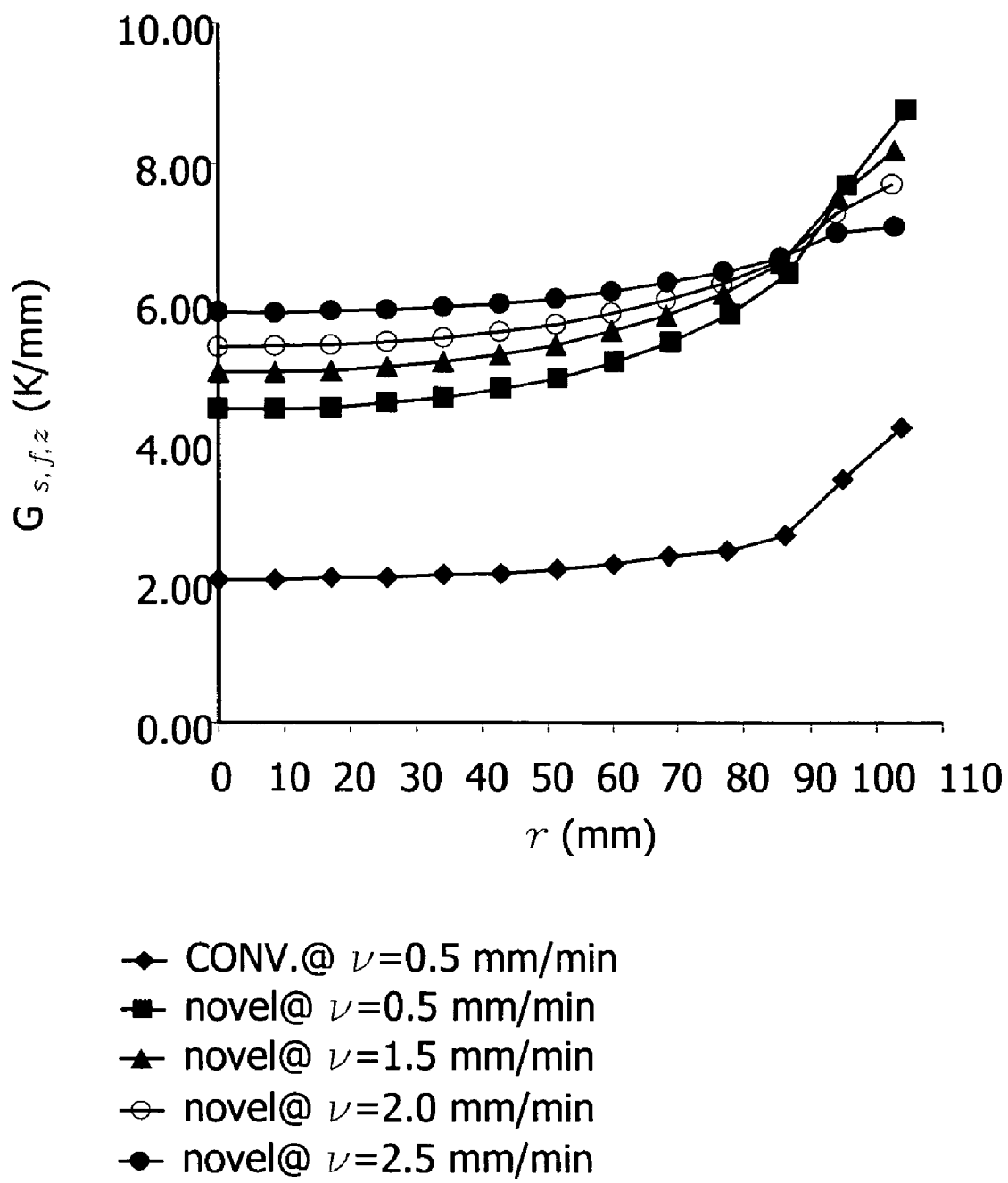
FIG. 57 is a graph of the radial variation of $G_{s,fz}$ as a function of the pull-rate in the novel crystal puller with active melt heat exchanger (MHE) and crystal heat exchanger (CHE)
Figure 58:
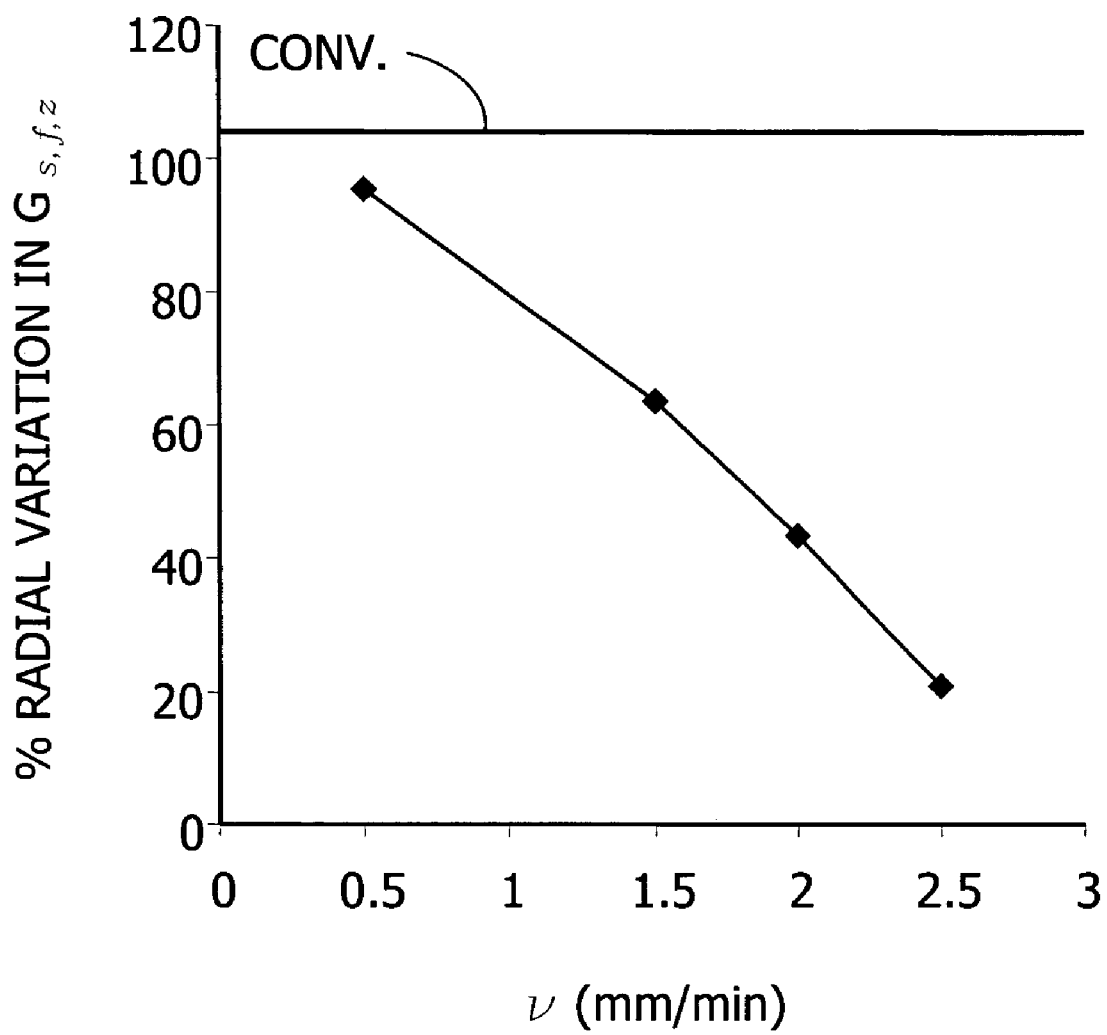
FIG. 58 is a graph of the relative radial variation of $G_{s,fz}$ with increasing pull-rates in the novel crystal puller with active melt heat exchanger (MHE) and crystal heat exchanger (CHE)
Figure 59:
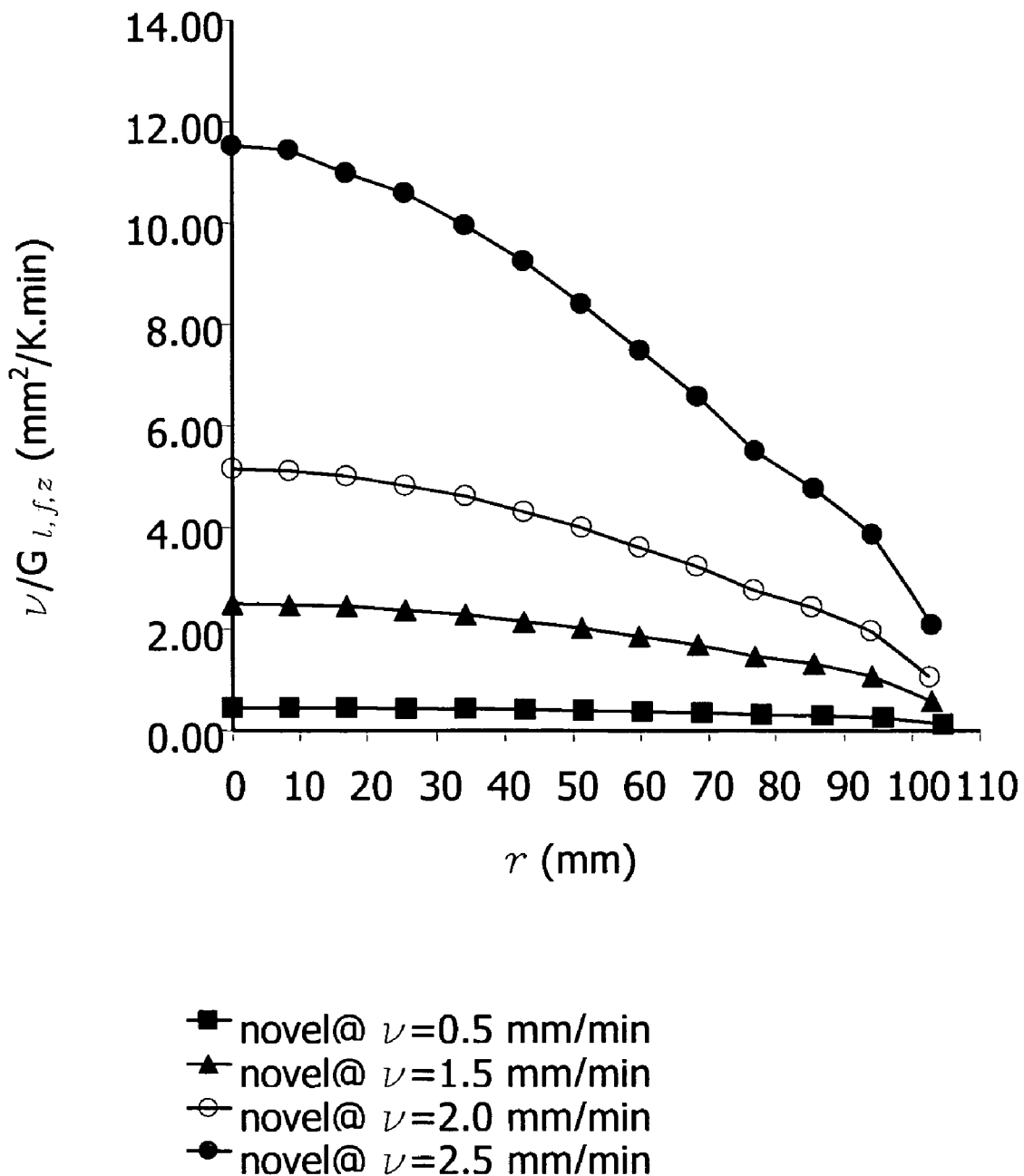
FIG. 59 is a graph of the relative effect of increasing contribution of the heat generated by solidification to the conductive heat transfer in the crystal (measured in terms of $v/G_{l,fz}$) with increasing pull-rate in the novel crystal puller with active melt heat exchanger (MHE) and crystal heat exchanger (CHE)
Figure 60A:
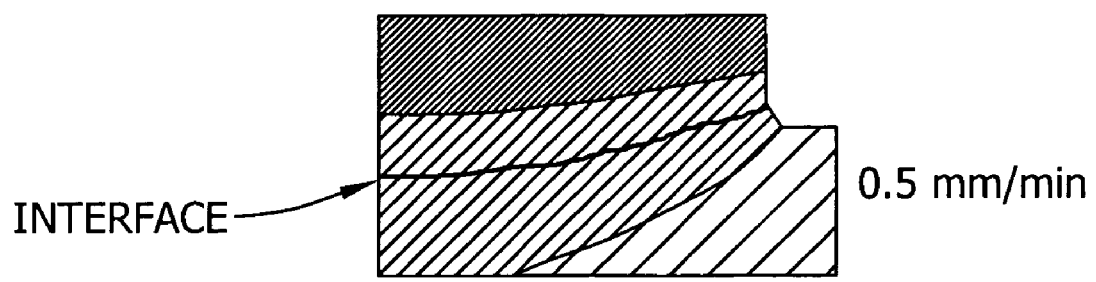
FIGS. 60A-60C are simulated interface shapes as a function of the pull-rate in the novel crystal puller with active melt heat exchanger (MHE) and crystal heat exchanger (CHE)
Figure 60B:
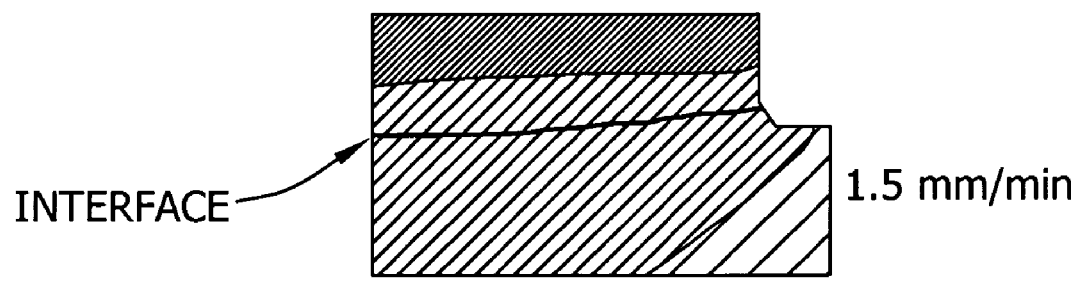
Figure 60C:
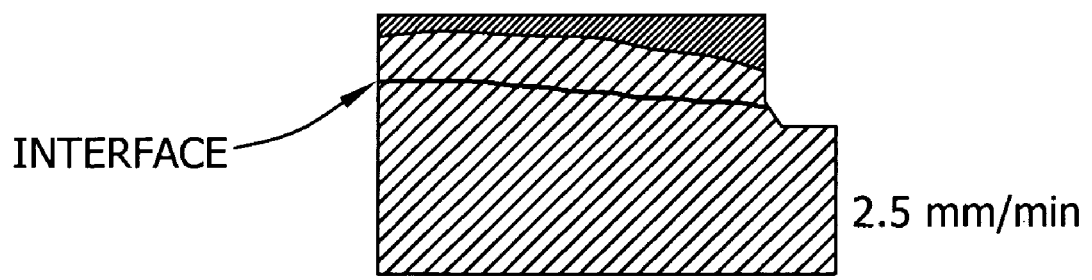
Figure 61:
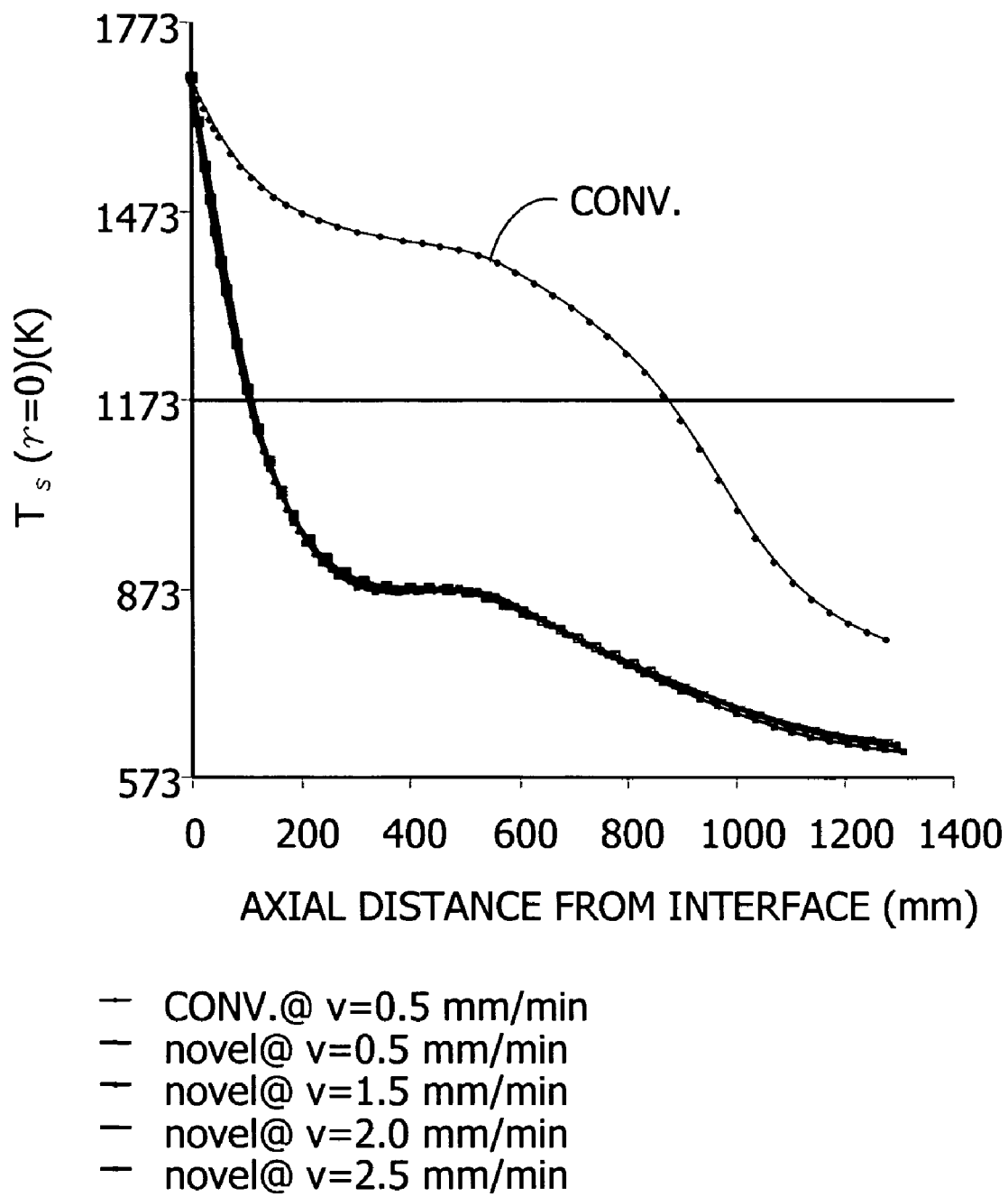
FIG. 61 is a graph of the axial temperature profile in a growing crystal in the novel crystal puller with active melt heat exchanger (MHE) and crystal heat exchanger (CHE)
Figure 62:
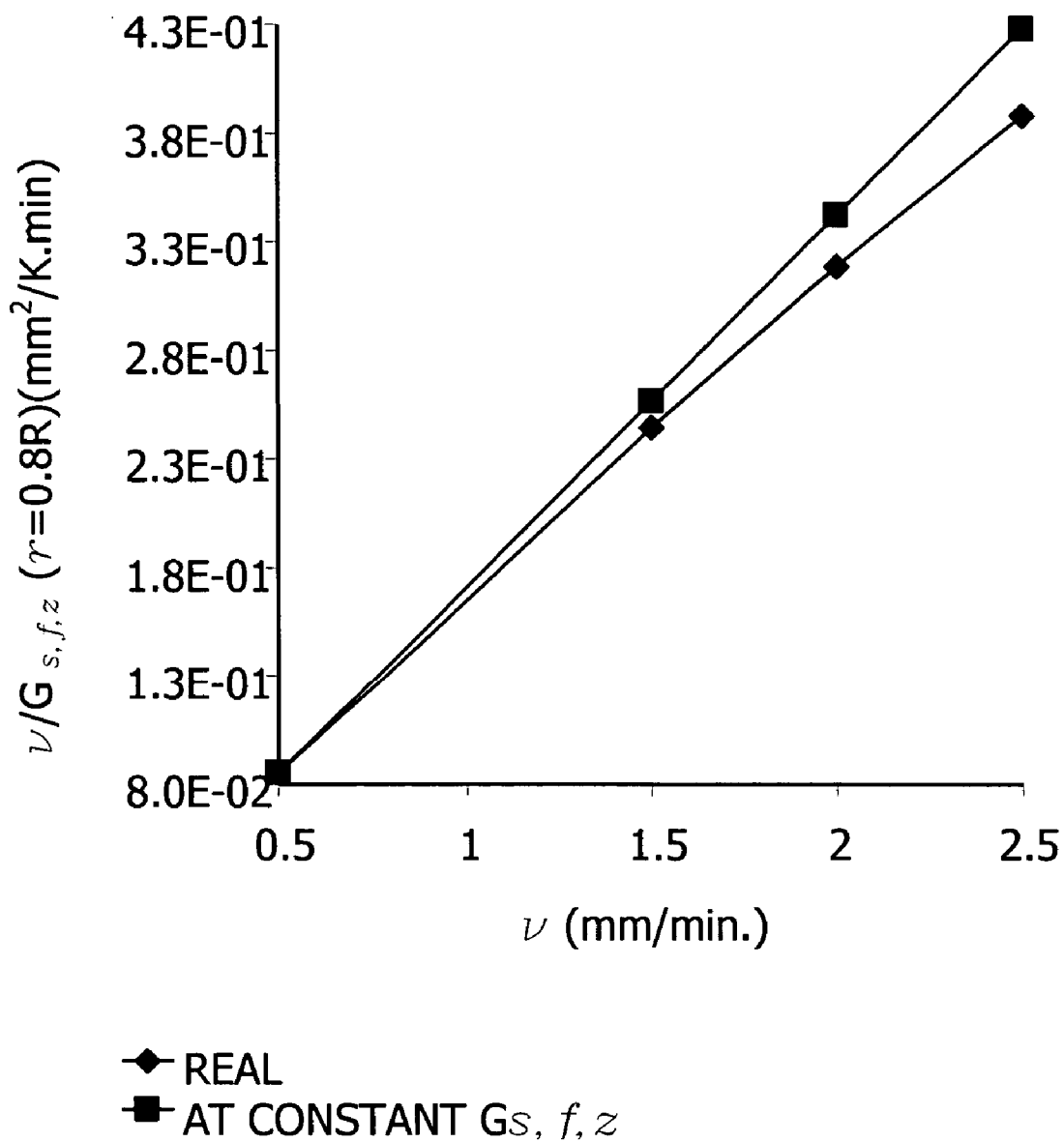
FIG. 62 is a graph of $v/G_{s,fz}$ as a function of the pull-rate in the novel crystal puller with active melt heat exchanger (MHE) and crystal heat exchanger (CHE).

Considering the wide range of rapid cooled silicon RCS products, a wide-range of pull-rates can be applied. Very high pull-rates are applied to make D-type rapid cooled silicon RCS, while moderately high pull-rates are applied to make perfect RCS. Simulated temperature fields in the novel crystal puller CP (with active (operating) melt heat exchanger MHE and crystal heat exchanger CHE) for making an rapid cooled silicon RCS-type product at a moderate pull-rate (0.5 mm/min) and at a higher pull-rate (2.5 mm/min) are shown in FIGS. 53A and 53B, respectively. The melt heat exchanger MHE transfers a significant amount of heat into the melt M for all pull-rates between 0.5 mm/min and 2.5 mm/min (FIG. 54) and thereby decreases the side heater power required. In addition, an increase in the pull-rate increases $G_{s,f,z}$ and decreases $G_{l,f,z}$, and thereby decreases the side heater power even further (FIG. 55). Thus, the crucible temperature tends to decrease with increasing pull-rate (FIG. 56). FIG. 56 also shows that the crucible temperatures are in the operable regime for all pull-rates. The radial uniformity of $G_{s,f,z}$ increases with increasing pull-rate (FIGS. 57 and 58) as a result of increasing effect of fusion (FIG. 59). The change in the interface shape with increasing pull-rate is shown in FIGS. 60A-C. It is noted that the change in the interface shape and position with changing pull-rate is influenced by the decreasing melt temperature and the decreasing crystal temperature around the interface. The cooling rates in the crystal C are very high as can be seen in FIG. 61. Typical cooling rates at 1473 K vary between 22.5 K/min and 4.5 K/min, for pull-rates between 2.5 mm/min and 0.5 mm/min. Similar cooling rates are achieved through interstitial and oxygen precipitation ranges. The ratio $v/G_{s,f,z}$ changes non-linearly with the pull rate as shown in FIG. 62. The results indicate that a perfect silicon crystal may be grown in this manner at relatively high pull-rates while other silicon products can be grown at substantially higher rates. For examples, the high in-situ cooling rates of rapid cooled silicon RCS allow sufficient control over nucleation and particle growth so that varying pull-rates and cooling rates can produce a variety of products, from D-type RCS to Perfect RCS.

Upon initial incorporation of point defects, a crystal segment goes through a cooling period, during which sufficient super saturation of relevant point defect builds up to initiate significant nucleation and growth of precipitates. The nucleation rate is a function of super saturation and the cooling rates. The nucleation temperature is defined by the maximum nucleation rate. If the time-scale of cooling is much smaller than the time-scale of nucleation, significant nucleation is effectively avoided, or, nucleation is quenched. The point defect concentration in a crystal-segment before nucleation depends on initial incorporation and its residence time above its nucleation temperature, defined as the diffusion time. During this diffusion time, vacancies and interstitials inter-diffuse and annihilate, and diffuse out to the surface. Thus, the nucleation temperature itself can be shifted depending on these conditions. Vacancies agglomerate between 1473 K and 1323 K while interstitials agglomerate between 1223 K and 1173 K. Vacancy nucleation temperature can be pushed to very low values where alternate nucleation of impurities such as oxygen can take place facilitated by vacancies. Thus, the precipitate formation can happen over a wide range of temperature. Changing the cooling rates before and through the relevant nucleation temperatures can influence the microdefect and precipitate size and density. Rapid cooling can be used to control or suppress agglomerated defect formation (See International Application No. PCT/US00/25525). Accordingly, in addition to controlling $v/G_{s,f,z}$ conditions at the melt/crystal interface F, controlling the time-temperature history of a crystal segment becomes significant. The temperature field in the crystal C changes as it grows. However, for the sake of simplicity, it is reasonable to assume that at a location in the crystal C, fixed from the stationary melt/crystal interface F, the temperature does not change significantly even as the C grows. In other words, all crystal-segments traverse through the same temperature field of a sufficiently long crystal. Thus, the time-temperature path or thermal history of a crystal-segment is obtained by simply knowing the history of pull-rate as a function of time and the temperature field in a sufficiently long crystal. These desired characteristics present problems that are addressed by this invention.

For efficient control of the incorporated point defect field, the radial profile of the gradient ($G_{s,fz}$) should be tuned (or controlled). Such control is accomplished in this invention by tuning the local temperature field at or adjacent the interface, which may be controlled by operation of the melt heat exchanger MHE, the crystal heat exchanger CHE, the lower heater LH and/or the upper heater UH.

The novel crystal puller CP is adapted to control the crucible temperature, interface shape, local temperature field at the interface, temperature gradients at the interface and the cooling or thermal history of each crystal-segment after its growth. As described above, a high fraction of heat entering the crucible CR and the melt M is transferred from the melt surface MS to its environment. Minimizing this heat transfer from the surface decreases the power requirement of the side heater. Allowing heat to be transferred into the melt M through the melt surface MS by operation of the melt heat exchanger MHE further decreases the side heater power. As the side heater power decreases, the crucible CR temperature also decreases. By varying the rate of heat transferred into the melt M from its open surface MS, the temperature field can be controlled. Typically, melt heat exchanger MHE temperature and power is controlled by controlling the electric current passing through the MHE. In one embodiment, the melt heat exchanger MHE is placed facing the melt surface in a well-insulated heat-shield or reflector R that covers most of the open melt-surface MS. As described above, the reflector R is suitably an annular or tubular ring with an inside surface facing the crystal C, an outside surface facing the outer regions of the crystal puller CP, and the bottom surface facing the melt M. To prevent heat leakage from the melt heat exchanger MHE to the crystal C surface, the reflector R is desirably filled or at least partially filled with insulation INS. The crystal puller CP design of FIGS. 1 and 2 decrease the temperature gradients inside the crystal C by decreasing the radial heat transfer. Although radial uniformity at the interface is thereby achieved, the productivity may suffer as a result of decreasing gradients. The crystal heat exchanger CHE, which is positioned to face the crystal C, allows for higher pull-rates. The arrangement considerably increases the temperature gradients in the crystal C by increasing the radial heat transfer between the C and crystal heat exchanger CHE. However, the radial variation of the temperature gradients increases and as a result of steep axial drop in the temperature, the diffusion time before agglomeration for some crystals decreases.

State of the art microdefect-free crystals may be produced by growing the entire crystal under slightly I-rich conditions in the periphery and slightly V-rich conditions at the center, while keeping all segments of the crystal above a target temperature and then quenching the whole crystal by moving it to a cooling chamber. The segments grown in the beginning of the growth process are allowed more diffusion time for mutual annihilation compared to the segments grown later. A considerable portion of the crystal (and preferably the entire crystal) is maintained above the target temperature. However, the presence of the crystal heat exchanger CHE decreases the crystal C temperature dramatically. Under such conditions, only a small portion of the crystal C stays above this temperature. To enable a process requiring growth of an entire crystal C above the target temperature, the lower heater LH is desirably disposed above the crystal heat exchanger CHE in the reflector R. To extend the length of the crystal C that can be grown using the novel crystal puller CP, the upper heater UH is disposed above the lower heater LH and the reflector R. The described arrangement allows considerable length of crystal C to be grown above the target temperature at a relatively high rate while maintaining the crucible CR temperature below the maximum allowable value.

For a given pull-rate, as the melt heat exchanger MHE temperature or power increases, the side heater power decreases, thereby decreasing the melt M temperature away from the melt/crystal interface F. Thus, the melt/crystal interface F moves down into the melt M. Although such movement decreases the gradient ($G_{s,fz}$) operation of the crystal heat exchanger CHE can maintain the gradient high. Thus, melt heat exchanger MHE power can be used to manipulate, control or tune the local temperature field attached around the interface, and control (tune) the global temperature field (distant from the interface) as well. The capacity to control the temperature fields is desirable in making a defect-controlled silicon crystal.

As the pull-rate increases, the rate of heat generation at the interface due to solidification increases. Since this heat is balanced by the difference between rate of heat conduction on the crystal-side and the rate of heat conduction on the melt-side, the melt-side heat conduction rate decreases and the crystal-side heat conduction rate increases. Thus, the side heater power may be reduced along with the crucible temperature. The heat transfer between the crystal-surface and colder environment creates very high axial and radial temperature gradients at the periphery of the crystal C. Typically, as the contribution of solidification increases, the gradient ($G_{s,fz}$) at the center of the crystal increases more than $G_{s,fz}$ at the periphery. Considering that $G_{s,fz}$ at the center is lower than that at the periphery of the crystal C, the radial uniformity of $G_{s,fz}$ tends to increase with increasing pull-rate.

The novel crystal puller CP with active melt heat exchanger MHE, crystal heat exchanger CHE, lower heater LH and upper heater UH can produce perfect silicon at relatively high pull rates. The semi-perfect silicon defined by a central vacancy core and peripheral perfect region can be produced at even higher rates.

In conventional crystal pullers, the in-situ cooling rates of the crystal segments given by the product of pull rate and the axial temperature gradient are not high. These relatively low cooling rates cause typical defect-controlled crystals to be grown entirely above a target nucleation temperature and then cooled by quickly moving them into a separate cooling chamber. However, in the novel crystal puller CP, the in-situ local cooling rates of crystal segments, are very high when lower heater LH and upper heater UH are inactive. The cooling rates through 1473 K and 1173 K can be as high as 5-20 K/min. In many cases, these cooling rates are sufficient to either partially or completely quench the nucleation reactions. Thus, another class of defect-controlled products known as rapid cooled silicon RCS can be produced in the novel crystal puller CP with active melt heat exchanger MHE and crystal heat exchanger CHE, and typically with inactive lower heater LH and upper heater UH.

The novel crystal puller CP is capable of satisfactorily controlling growth conditions and the thermal history of each crystal segment. Flexible control over growth and post growth conditions allows production of variety of crystals at high production rates.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A crystal puller for growing monocrystalline ingots according to the Czochralski method, the puller comprising:
    a housing;
    a crucible in the housing for containing a semiconductor source material melt, the melt having an upper surface;
    a side heater adjacent the crucible for heating the crucible;
    an elongate puller having an end adapted to connect to the ingot for pulling a growing ingot upward from the upper surface of the melt, a portion of the upper surface of the melt remaining exposed during growing of the ingot, the exposed upper surface portion having an area;
    an annular melt heat exchanger sized and shaped for surrounding the ingot and for being disposed adjacent the exposed upper surface portion of the melt, the heat exchanger including a heat source disposed to face the exposed upper surface portion of the melt, the heat source having an area for radiating heat to the melt sized at least 30% of the area of the exposed upper surface portion of the melt for controlling heat transfer at the upper surface of the melt, the melt heat exchanger being adapted to reduce heat loss at the exposed upper surface portion, the exposed upper surface portion of the melt allowing gases produced in the melt during heating thereof to exit the melt; and
    a reflector supporting the melt heat exchanger;
    wherein the reflector includes insulation interposed between the melt heat exchanger and the melt.

2. A crystal puller as set forth in claim 1 wherein the heat source has an area sized at least 40% of the area of the exposed upper surface portion of the melt.

3. A crystal puller as set forth in claim 1 wherein the heat source has an area sized at least 50% of the area of the exposed upper surface portion of the melt.

4. A crystal puller as set forth in claim 1 wherein the heat source has an area sized at least 60% of the area of the exposed upper surface portion of the melt.

5. A crystal puller as set forth in claim 1 wherein the heat source is adapted to be disposed within 50 mm of the exposed surface of the melt.

6. A crystal puller as set forth in claim 1 herein the heat source is adapted to be disposed within 30 mm of the exposed surface of the melt.

7. A crystal puller as set forth in claim 1 further comprising a crystal heat exchanger sized and shaped to be disposed above the melt and substantially surround the ingot for cooling a first portion of the growing ingot proximate a melt/crystal interface.

8. A crystal puller as set forth in claim 7 further comprising a lower crystal heater disposed above the crystal heat exchanger and adapted for substantially surrounding the ingot for maintaining a second segment of the ingot at a predetermined temperature.

9. A crystal puller as set forth in claim 8 wherein the crystal heat exchanger and the lower crystal heater are mounted in the reflector, the reflector further comprising insulation disposed between the crystal heat exchanger and the ingot and between the lower crystal heater and the housing.

10. A crystal puller as set forth in claim 8 further comprising an upper crystal heater disposed above the lower crystal heater and substantially surrounding the ingot for maintaining a third segment of the ingot at a predetermined temperature.

11. A reflector for use in a crystal puller for growing a monocrystalline ingot from a semiconductor source material melt, the crystal puller having a housing, a crucible contained in the housing for holding the source material melt, a heater in thermal communication with the crucible for heating the crucible to a temperature sufficient to melt the semiconductor source material held by the crucible and a puller positioned above the crucible for pulling the ingot from the melt, the reflector being disposed above the melt and having a central opening sized and shaped for surrounding the ingot as the ingot is pulled from the melt, the reflector comprising:
    a crystal heat exchanger sized and shaped for placement above the melt and substantially surrounding the ingot for cooling a first segment of the growing ingot proximate a melt/crystal interface, and
    a lower crystal heater disposed above the crystal heat exchanger and substantially surrounding the ingot for maintaining a second segment of the ingot at a predetermined temperature.

12. A reflector as set forth in claim 11 further comprising an upper crystal heater disposed above the lower crystal heater and substantially surrounding the ingot for maintaining a third segment of the ingot at a predetermined temperature.

13. A method of growing a monocrystalline ingot comprising:
    forming a melt of semiconductor source material in a crucible, the melt having a surface;
    positioning a heat source to face the exposed upper surface portion of the melt, the heat source having an area for radiating heat to the melt sized at least 30% of the area of the exposed upper surface portion of the melt;
    pulling semiconductor source material from the surface of the melt such that the source material solidifies into a monocrystalline ingot;
    selectively controlling heat transfer at the surface of the melt using the heat source; and
    allowing gases produced in the melt during heating thereof to exit the melt via the exposed upper surface of the melt.

14. A method as set forth in claim 13 wherein said step of selectively controlling heat transfer includes cooperatively controlling heat transfer at the melt surface and the application of heat to the melt surface by positioning the heat source within 100 mm of the melt surface to selectively control defects within the ingot.

15. A method as set forth in claim 14 wherein the melt/ingot interface has a shape, the selective controlling step including varying the heat radiated from the melt heat exchanger to control the interface shape.

16. A method as set forth in claim 15 further comprising removing heat from the ingot at a location above a melt/ingot interface using a crystal heat exchanger.

17. A method as set forth in claim 16 wherein the heat removal step includes controlling the temperature of cooling fluid in the crystal heat exchanger to remove heat from the ingot at a predetermined rate and to maintain the ingot above a predetermined temperature.

18. A method as set forth in claim 17 further comprising allowing a portion of the ingot above the crystal heat exchanger to cool at a rate greater than the predetermined rate to control formation and/or growth of defects within the ingot.

19. A method as set forth in claim 16 wherein the selective control step includes controlling the temperature of the melt heat exchanger such that a segment of the ingot near the interface is cooled at a predetermined rate, the method further comprising removing heat from another segment of the ingot spaced from the interface at a rate greater than the predetermined rate.

20. A method as set forth in claim 19 wherein the selective control step includes controlling the temperature of the melt heat exchanger such that a segment of the ingot near the interface is cooled at a predetermined, the method further comprising removing heat from another segment of the ingot spaced from the interface at a rate greater than the predetermined.

21. A method as set forth in claim 16 further comprising heating a segment of the ingot spaced from the melt/crystal interface using a lower crystal heater disposed above the crystal heat exchanger.

22. A method as set forth in claim 21 further comprising heating a segment of the ingot spaced from the melt/crystal interface using an upper crystal heater disposed above the lower crystal heater.

23. A method as set forth in claim 13 wherein the method is free of a step of removing or adding a structural component of the crystal puller.

24. A method of growing a monocrystalline ingot using a crystal puller including a housing, a crucible in the housing for containing a semiconductor source material melt having a surface, a side heater adjacent the crucible for heating the crucible, and a melt heat exchanger facing at least 30% of an exposed portion of the melt surface for heating the exposed portion, the method comprising:
pulling the growing ingot upward from the melt, a melt/ingot interface being formed generally at a juncture of the ingot and the melt surface,
simultaneously operating the side heater and the melt heat exchanger, and
controlling the temperatures of the melt heat exchanger and the side heater to control formation of defects within the ingot.

25. A method as set forth in claim 24 wherein the controlling step includes controlling the side heater power in a predetermined range such that the temperature of the crucible is maintained below a predetermined temperature.

26. A method as set forth in claim 25 wherein the controlling step includes reducing heat loss from the melt surface and simultaneously reducing the side heater temperature so as to reduce the temperature of the crucible.

27. A method as set forth in claim 24 wherein the melt/ingot interface has a shape, the controlling step including selecting a temperature of the melt heat exchanger to control the interface shape.

28. A method as set forth in claim 24 wherein the controlling step includes manipulating a temperature field at the melt/ingot interface.

29. A method as set forth in claim 24 further comprising selecting a desired axial temperature gradient, the controlling step including selecting a temperature of the melt heat exchanger to maintain the desired axial temperature gradient.

30. A method as set forth in claim 24 further comprising removing heat from the ingot at a location above the melt/ingot interface using a crystal heat exchanger.

31. A method of growing a monocrystalline ingot using a crystal puller including a housing, a crucible in the housing for containing a semiconductor source material melt having an upper surface, a side heater adjacent the crucible for heating the crucible, a pulling mechanism for pulling a growing ingot upward from the melt, a melt/crystal interface being formed generally at the upper surface of the melt and having a shape, an annular melt heat exchanger including a heat source having an area for radiating heat to the melt sized at least 30% of the area of an exposed upper surface portion of the melt, a crystal heat exchanger surrounding the ingot and facing the ingot for removing heat from the ingot adjacent the melt/crystal interface, the method comprising:
pulling the growing ingot upward from the melt; and
controlling an axial temperature gradient at the interface by manipulating a temperature field at the melt/ingot interface; and
allowing gases produced in the melt during heating thereof to exit the melt via the exposed upper surface of the melt.

32. A method as set forth in claim 31 wherein the controlling step includes varying heat radiated from the melt heat exchanger and removing heat from the crystal using the crystal heat exchanger.

33. A method as set forth in claim 31 wherein the controlling step includes manipulating the temperature field to affect the shape of the interface.

34. A method as set forth in claim 31 wherein the controlling step includes manipulating heat radiated from a lower heater disposed above the crystal heat exchanger to control formation of defects in the growing ingot.

35. A method as set forth in claim 34 further comprising controlling heat radiated from an upper heater disposed above the lower heater to control formation and/or growth of defects in the growing ingot.

36. A method of growing a monocrystalline ingot using a crystal puller including a housing, a crucible in the housing for containing a semiconductor source material melt having a surface, a side heater adjacent the crucible for heating the crucible, a melt heat exchanger surrounding the ingot and facing an exposed portion of the melt surface, the melt heat exchanger including a heat source having an area for radiating heat to the melt sized at least 30% of the area of an exposed upper surface portion of the melt for heating the exposed portion, a lower heater for surrounding the growing ingot the method comprising:
pulling the growing ingot upward from the melt, a melt/ingot interface being formed generally at a juncture of the ingot and the melt surface,
simultaneously operating the side heater, melt heat exchanger, and lower heater;
controlling heat radiated from the melt heat exchanger and the side heater to control the interface shape; and
controlling heat radiated from the lower heater to control the thermal history of segments of the growing ingot.

37. A method as set forth in claim 36 further comprising controlling heat removed from the crystal by a crystal heat exchanger disposed to surround a segment of the ingot above the interface.

38. A method as set forth in claim 37 further comprising controlling heat radiated from an upper heater disposed above the lower heater for further controlling the thermal history of segments of the growing ingot.

39. A crystal puller for growing monocrystalline ingots according to the Czochralski method, the puller comprising:
a housing;
a crucible in the housing for containing a semiconductor source material melt, the melt having an upper surface;

a side heater adjacent the crucible for heating the crucible;

an elongate puller having an end adapted to connect to the ingot for pulling a growing ingot upward from the upper surface of the melt, a portion of the upper surface of the melt remaining exposed during growing of the ingot;

a reflector disposed above the melt and having a central opening sized and shaped for surrounding the ingot as the ingot is pulled from the melt, the reflector including a melt heat exchanger at least partially inside the reflector adapted to surround the ingot proximate the surface of the melt for controlling heat transfer at the surface of the melt, the melt heat exchanger being adapted to reduce heat loss at the exposed surface, and a crystal heat exchanger at least partially inside the reflector and disposed above the melt heat exchanger, the crystal heat exchanger being adapted to substantially surround the ingot for cooling a first segment of the growing ingot that is adjacent a melt/crystal interface;

an upper heater disposed above and outside the reflector; and a lower heater disposed at least partially inside the reflector and above the crystal heat exchanger.

* * * * *